(12) United States Patent
Arai et al.

(10) Patent No.: US 7,030,456 B2
(45) Date of Patent: Apr. 18, 2006

(54) RESISTANCE-CHANGING FUNCTION BODY, MEMORY ELEMENT, MANUFACTURING METHOD THEREFOR, MEMORY DEVICE, SEMICONDUCTOR DEVICE AND ELECTRONIC EQUIPMENT

(75) Inventors: Nobutoshi Arai, Nara-ken (JP); Hiroshi Iwata, Nara-ken (JP); Seizo Kakimoto, Nara-ken (JP)

(73) Assignee: Sharp Kabushiki Kaisha, Osaka (JP)

( * ) Notice: Subject to any disclaimer, the term of this patent is extended or adjusted under 35 U.S.C. 154(b) by 182 days.

(21) Appl. No.: 10/797,137

(22) Filed: Mar. 11, 2004

(65) Prior Publication Data
US 2004/0183647 A1 Sep. 23, 2004

(30) Foreign Application Priority Data
Mar. 13, 2003 (JP) .......................... P2003-067656

(51) Int. Cl.
*H01L 29/00* (2006.01)
(52) U.S. Cl. ....................... 257/508; 257/529; 257/537
(58) Field of Classification Search ................ None
See application file for complete search history.

(56) References Cited

U.S. PATENT DOCUMENTS 4,386,021 A * 5/1983 Kazuo et al. .......... 252/519.52
4,551,268 A * 11/1985 Eda et al. .............. 252/519.52

FOREIGN PATENT DOCUMENTS

JP 2000-220055 A 1/2000

* cited by examiner

*Primary Examiner*—David E. Graybill
(74) *Attorney, Agent, or Firm*—Birch Stewart Kolasch & Birch, LLP

(57) ABSTRACT

A memory function body 113, which includes a plurality of silver particles 103 covered with silver oxide 104, is interposed between a first electrode 300 and a second electrode 411. A magnitude of a current through the memory function body 113 changes on applying a prescribed voltage between the first electrode 300 and the second electrode 411, and a storage state is discriminated according to the magnitude of the current. The silver particles 103, which capture electric charges, are covered with the silver oxide 104 that serves as a barrier against the passage of electric charges, and therefore, the memory function body 113 can stably retain electric charges at the normal temperature.

16 Claims, 40 Drawing Sheets

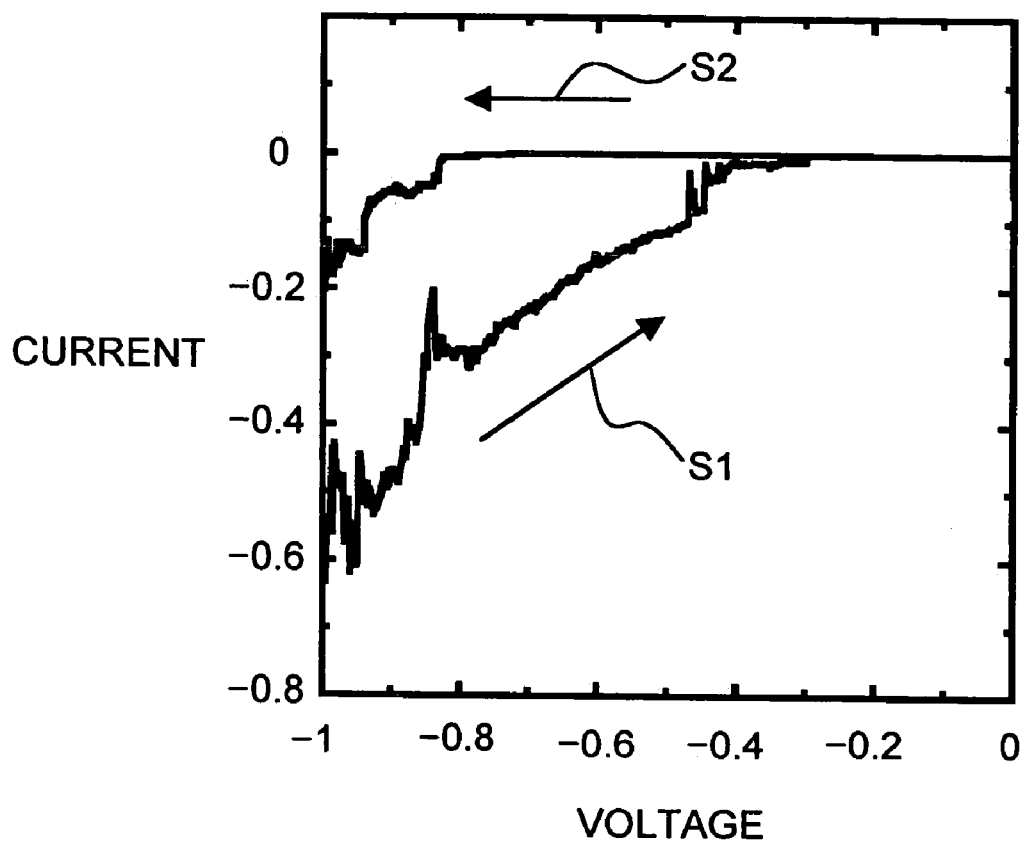

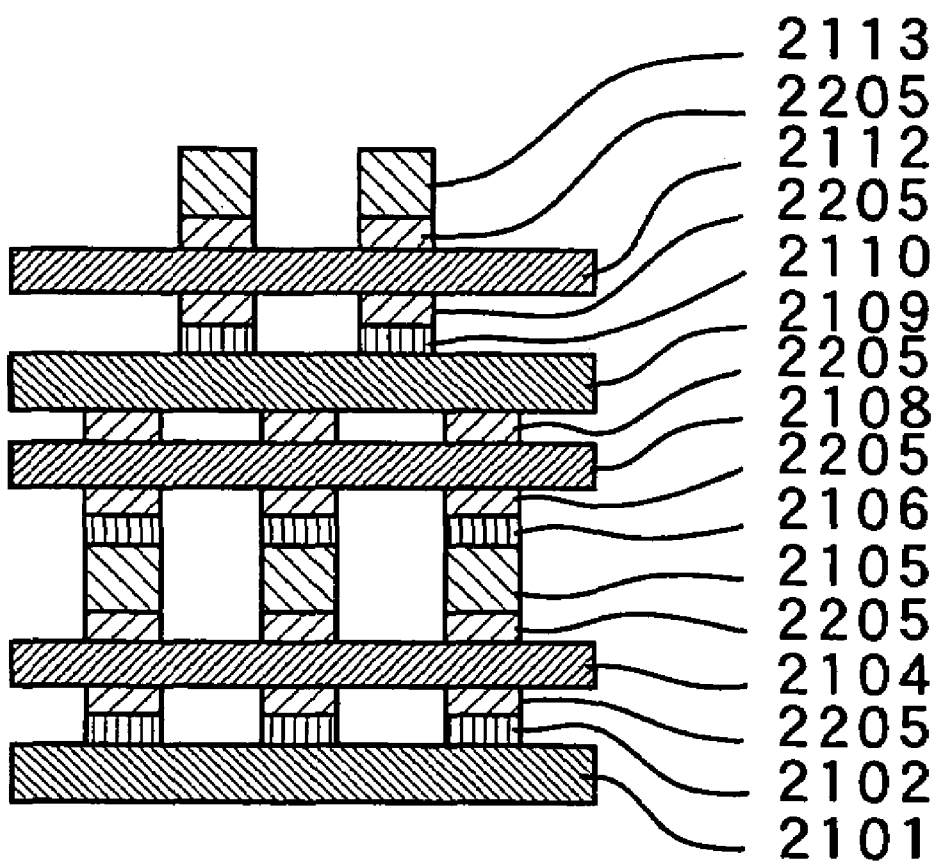

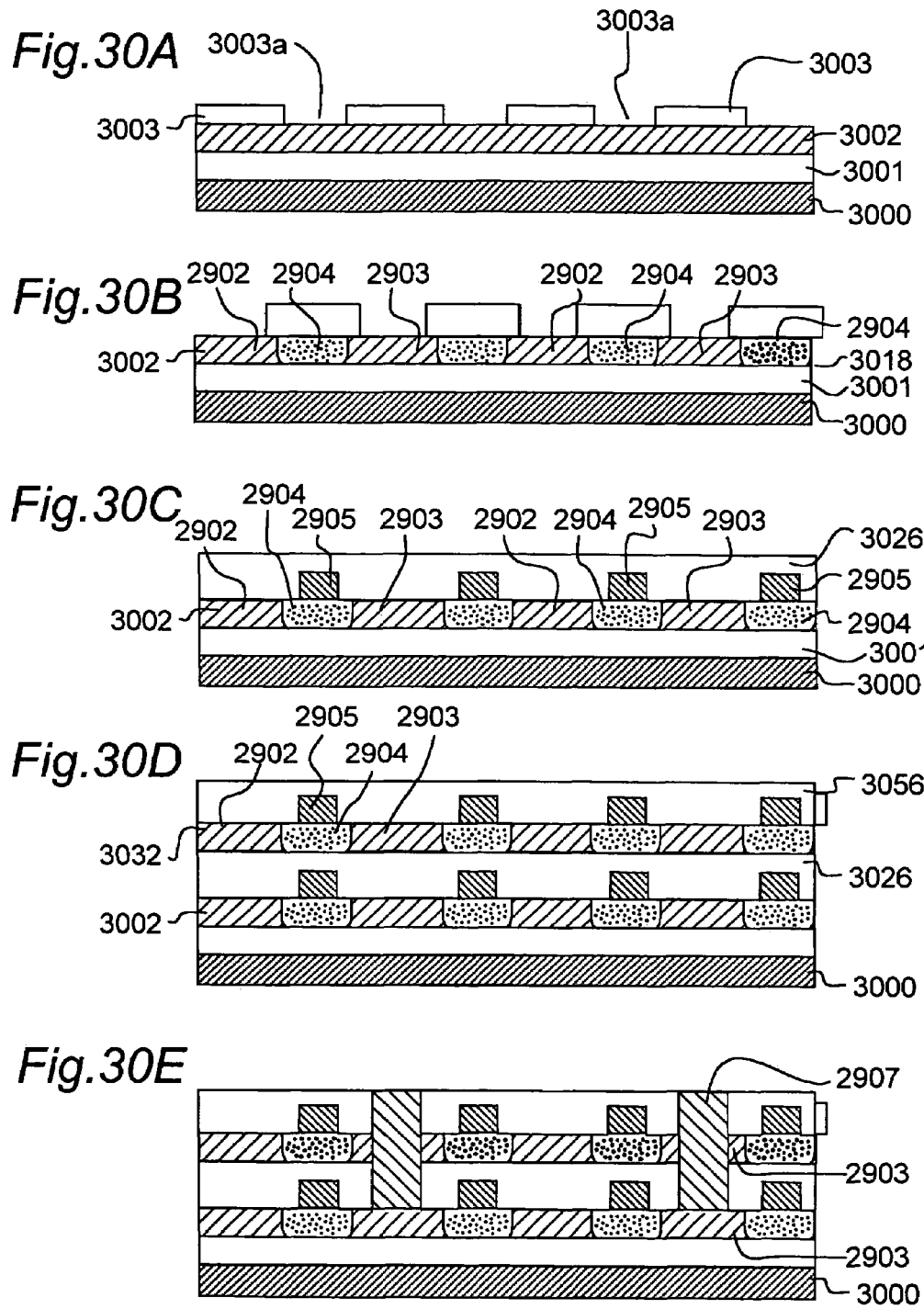

RESISTANCE-CHANGING FUNCTION BODY, MEMORY ELEMENT, MANUFACTURING METHOD THEREFOR, MEMORY DEVICE, SEMICONDUCTOR DEVICE AND ELECTRONIC EQUIPMENT

This Nonprovisional application claims priority under 35 U.S.C. §119(a) on patent application Ser. No. P2003-067656 filed in Japan on Mar. 13, 2003, the entire contents of which are hereby incorporated by reference.

BACKGROUND OF THE INVENTION

The present invention relates to a resistance-changing function body, a memory element, a manufacturing method therefor, a memory device, a semiconductor device and an electronic equipment.

In recent years, it has been proposed to constitute ultramicro electronic equipment of, for example, a single-electron transistor, a single-electron memory and the like by employing a memory that includes a nanometer-size particle called the nanodot and nanocrystal in a gate insulation film. The memory and electronic equipment of this kind are expected to operate with low power consumption taking advantage of a quantum size effect of Coulomb blockade phenomenon or the like.

FIG. 35 is a view showing a conventional memory that employs particles in its floating gate. This memory is provided with an oxide film 4802 that has a thickness of 2 nm and is formed by thermal oxidation, silicon particles 4803 that have a particle diameter of 5 nm and are formed on the oxide film 4802, an oxide film 4804 formed so as to cover the silicon particles and a polysilicon layer 4805 that serves as a gate electrode on a channel region located between source and drain regions 4806 formed in a p-type silicon substrate 4801.

As a manufacturing method of a memory as shown in FIG. 35, there is proposed a method for depositing amorphous silicon on the silicon thermal oxidation film 4802 by an LPCVD (Low-Pressure Chemical Vapor Deposition) apparatus, thereafter forming the silicon particles 4803 through an annealing process and further depositing the silicon oxide film 4804 on the silicon particles 4803 by a CVD (Chemical Vapor Deposition) method (refer to, for example, Japanese Unexamined Patent Application No. 2000-22005).

As another method for forming particles of the silicon particles 4803 or the like, there are proposed a method for forming crystals on a substrate by using CVD, vapor deposition, MBE (Molecular Beam Epitaxy) or the like and a method for forming a thin film and thereafter using a fine processing technique of photolithography, etching and the like besides the use of LPCVD and annealing. According to the methods described above, the aforementioned particles are formed, and thereafter, an insulator layer like the silicon oxide film 4804 of FIG. 35 is laminated on the particles.

However, it is difficult to integrate the conventional memory, single-electron transistor, single-electron memory and so on since they require very fine processing in order to produce a nanosize dot capable of storing one or several electrons and to detect the flow of several electrons. Moreover, it is required to make the memory or the like have an extremely low temperature in many cases in order to restrain the occurrence of malfunction due to thermal fluctuation. Therefore, the memory and the like, which utilize the Coulomb blockade phenomenon or the like, lack practicability and stay at the experiment level.

Moreover, it is often the case where the aforementioned conventional memory manufacturing method has insufficient surface density of particles and insufficient miniaturization of particle size. As a result, there are the disadvantages that the memory window (hysteresis) becomes narrow, a variation in the density is increased and the data retention characteristic is poor.

In particular, to increase the surface density of the particles by the method of forming the particles by using the CVD, deposition, MBE and so on, the particles can be formed only on one surface through one-time process in order to raise the surface density of the particles, and therefore, a similar process is required to be repeated many times.

Moreover, it is extremely difficult to reduce a the particle size and the distance between particles to the nanometer order at the same time by the method of using the fine processing technique of photolithography, etching and the like after the formation of the thin film.

SUMMARY OF THE INVENTION

Accordingly, the object of the present invention is to provide a memory capable of obtaining a sufficient particle surface density, a sufficiently reduced particle size, high practicability with satisfactory data retention characteristic and comparatively easy integration and a manufacturing method capable of manufacturing the memory with satisfactory productivity.

In order to achieve the above object, the present invention provides a resistance-changing function body comprising:
 a first electrode;
 a second electrode;
 a medium made of a first material interposed between the first electrode and the second electrode; and
 at least one conductive particle made of a third material, having a surface covered with a second material and included in the medium, wherein
 the second material has a barrier against passage of electric charges,
 the third material has a capability to retain electric charges, and
 an electrical resistance between the first electrode and the second electrode is changed depending on an amount of electric charges accumulated in the particle.

According to the resistance-changing function body of the above-mentioned construction, the conductive particle is included in the medium made of the first material. The conductive particle is made of the third material and of which the surface is covered with the second material. The second material has the barrier against the passage of electric charges, and the third material has a capability of retaining electric charges. In this case, the above-mentioned particle is covered with the second material, and therefore, the retainment of electric charges is effectively achieved at the normal temperature. As a result, the magnitude of the current that flows through the medium including the conductive particles covered with the second material changes by application of a prescribed voltage between the first electrode and the second electrode at the normal temperature. Therefore, the magnitude of the current that flows between the electrodes can be changed by electrical control with a comparatively low voltage at the normal temperature. Therefore, this resistance-changing function body has practicability.

Moreover, according to the resistance-changing function body of the above-mentioned structure, it is also possible to effectively use the Coulomb blockade effect for retaining electric charges at the normal temperature.

Any material can be employed for the second material so long as the material serves as a barrier against electric charges. It is possible to employ, for example, an insulator. It is possible to employ even a metal or a semiconductor in which a depletion layer is formed like a pn junction or a Schottky barrier or the like is formed. From a different viewpoint, the first, second and third materials are only required to satisfy the condition that electric charges locally exist at or in the vicinity of the particle.

In one embodiment, the first material and the second material are mutually different insulative substances,
the third material is a conductive material, and
the second material is an insulative substance formed by using the third material.

According to the resistance-changing function body of the above-mentioned embodiment, the third material is a conductive substance, which is therefore able to easily retain electric charges. Moreover, the second material is an insulative substance, which is therefore able to effectively restrain the leak of electric charges from the particle. Moreover, the second material is formed of the third material, which therefore has a satisfactory congeniality to the particle constructed of the third material and is able to obtain a satisfactory insulative effect. Therefore, a resistance-changing function body of stable characteristics can be obtained.

A memory element of the present invention comprising:
a first electrode;
a second electrode; and
a memory function body interposed between the first electrode and the second electrode, wherein
the memory function body includes:
a first insulator; and
a conductive particle included in the first insulator and having a surface covered with a material having a barrier against passage of electric charges, and wherein
a magnitude of a current through the memory function body changes by application of a prescribed voltage between the first electrode and the second electrode, and a storage state is discriminated according to the magnitude of the current.

As the material having a barrier against the passage of electric charges, it is possible to use, for example, an insulator. It is possible to employ as the material even a metal or a semiconductor in which a depletion layer is formed like a pn junction or a Schottky barrier or the like is formed. From a different viewpoint, the first insulator, the particle and the material are only required to satisfy the condition that electric charges locally exist at or in the vicinity of the particle.

In the present specification provided herein, the "conductive particle" indicates that the particle itself has conductivity. Therefore, the "conductive particle" also includes those which are constructed of a metal or a semiconductor and further includes those constructed of an organic substance so long as they have conductivity. Moreover, the "conductive particle" indicates that the particle has a particle diameter smaller than 1 µm.

As an "storage state" of the memory, there can be enumerated, for example, a written state corresponding to a logic 1 and an erased state corresponding to a logic 0.

According to the memory element of the present invention, the magnitude of the current that flows through the memory function body changes by application of the prescribed voltage between the first electrode and the second electrode by virtue of the conductive particle contained in the first insulator. That is, by applying the prescribed voltage (for write or erase) between the first electrode and the second electrode for the flow of the current through the memory function body, the magnitude of the current that flows through the memory function body is changed. When the prescribed voltage (for read) is applied between the first electrode and the second electrode, the storage state is discriminated according to the magnitude of the current that flows through the memory function body. In the memory function body, the surface of the conductive particle is covered with the material that has a barrier against the passage of electric charges. With this arrangement, the magnitude of the current that flows through the memory function body can be changed by electrical control with a comparatively low voltage at the normal temperature. Therefore, this memory element has practicability.

Moreover, it is preferred that the first insulator is constructed of silicon oxide and the conductive particle is constructed of a semiconductor or a metal. In this case, the memory element can be fabricated by the existing apparatus used in the semiconductor industry.

A memory device of the present invention comprising a memory cell including:
the aforementioned memory element; and
a rectifying function body having a rectification effect so as to determine a direction of the current through the memory function body of the memory element, wherein
the memory element and the rectifying function body are electrically connected in series to each other.

According to the memory device of the above-mentioned construction, the direction of the current that flows through the memory function body is limited to one direction by the rectifying function body. This arrangement is able to prevent a useless current from flowing through the nonselected memory cell by means of the rectifying function body when a plurality of memory cells each of which includes the aforementioned memory function body are arranged in a matrix form and it is attempted to select and operate a specified memory cell from among the cells. Therefore, the memory cell selection is facilitated.

Moreover, the rectifying function body should preferably have a Schottky junction. This Schottky junction can be fabricated by a junction of a metal and a semiconductor. Therefore, the junction can easily be manufactured by the existing semiconductor apparatus and is excellent in productivity.

Moreover, the rectifying function body should preferably have a pn junction. This pn junction can be constructed of a semiconductor. Therefore, the junction can easily be manufactured by the existing semiconductor apparatus, thus the rectifying function body is excellent in productivity. Moreover, since the characteristics of the junction can easily be changed by adjusting the impurity concentrations of the p-type semiconductor and the n-type semiconductor, the rectifying function body is excellent in versatility.

Moreover, the rectifying function body should preferably be provided with a junction that has a rectification effect, and at least one of the substances that constitute this junction should preferably be made of continuous grain boundary silicon. In this case, there is no need for such a high temperature as in epitaxial growth in order to form the above-mentioned junction. Moreover, since the crystallinity is better than that of normal polysilicon, it becomes possible to increase the mobility and achieve high-speed operation.

A memory device of the present invention comprising a memory cell including:

the aforementioned memory element; and a select transistor for selecting the memory element, wherein the memory element and the select transistor are electrically connected in series to each other.

According to the memory device of the above-mentioned construction, a memory element which includes the aforementioned memory function body can be selected or non-selected by turning on or off the select transistor. Moreover, since the current can be prevented from flowing through the memory function body by turning off the select transistor, it is possible to prevent changing the facility in flowing the current through the memory function body. Therefore, a stable memory function can be maintained for a long time.

Moreover, it is preferable to provide a element for applying a voltage for destroying the first insulator of the memory function body. This memory device is used as a so-called fuse memory by destroying the first insulator of the memory function body. In this memory device, it becomes possible to execute write at a low voltage dissimilarly to the conventional fuse memory that employs an insulator containing no particle as a fuse.

Moreover, it is acceptable to constitute a random-access memory by arranging the aforementioned memory devices in a matrix form. In this case, since the structure becomes simple dissimilarly to the floating gate type memory, the structure is suitable for high integration and excellent in productivity.

A memory device of the present invention comprising at least two memory cells each including the aforementioned memory element, wherein the first insulators of the memory function bodies of the two memory cells are integrally continuously formed, and the first electrode of one memory cell of the two memory cells and the first electrode of the other memory cell are electrically connected to each other, and the second electrode of the one memory cell and the second electrode of the other memory cell are electrically isolated from each other.

According to the memory device of the above-mentioned construction, the first insulators of the memory function bodies of the two memory cells are integrally continuously formed. Moreover, the first electrode of one memory cell and the first electrode of the other memory cell of the two memory cells are electrically connected to each other. Therefore, no isolation region is required to be formed in comparison with the case where two memory cells are independently formed, and therefore, the occupation area of the memory cells can be reduced. Since the second electrode of the one memory cell and the second electrode of the other memory cell are electrically isolated from each other, the two memory cells can operate independently of each other.

A memory device of the present invention comprising:

at least five memory cells each including the aforementioned memory element;

bit lines extended in a direction of column;

source lines extended in a direction of column; and word lines extended in a direction of row, wherein each of the memory cells includes:

a select transistor for selecting the memory element; and a rectifying function body for determining a direction of the current through the memory function body of the memory element, and wherein each of the memory cells is connected between the bit line and the source line, and the select transistor of each of the memory cells is controlled by the word line, with respect to a first memory cell of the five memory cells, a second and a fourth memory cells are arranged mutually adjacently in the direction of row, and a third and a fifth memory cells are arranged mutually adjacently in the direction of column, the first memory cell and the second memory cell have a shared bit line, a shared word line and an unshared source line, the first memory cell and the third memory cell have a shared bit line, a shared source line and an unshared word line, the first memory cell and the fourth memory cell have a shared source line, a shared word line and an unshared bit line, the first memory cell and the fifth memory cell have a shared word line, a source line of the first memory cell and a bit line of the fifth memory cell are shared, and a bit line of the first memory cell and a source line of the fifth memory cell are shared.

According to the memory device of the above-mentioned construction, the word line, the bit line and the source line can be largely shared, and the interconnections can be reduced. Therefore, a reduction in the occupation area of the lines becomes possible.

Moreover, it is preferred that two memory function bodies are laminated in the direction perpendicular to a substrate. In this case, since the memory cells are three-dimensionally integrated, it is possible to effectively reduce a total area of the memory cells and increase the memory capacity.

In one embodiment, at least two memory cells are arranged in a direction parallel to a substrate, and the first insulators of the memory function bodies of the memory cells mutually adjacent in the direction parallel to the substrate are integrally continuously formed.

According to the memory device of the above-mentioned embodiment, the first insulators of the memory function bodies are integrally continuously formed. Accordingly, the process of separating the memory function body of every cell can be eliminated, and therefore, the productivity is improved.

In one embodiment, at least two memory cells are arranged in a direction parallel to a substrate, and the first insulators and/or the rectifying function bodies of the memory cells mutually adjacent in the direction parallel to the substrate are integrally continuously formed.

According to the memory device of the above-mentioned embodiment, the process of separating the first insulator and/or the rectifying function body of the memory cell can be eliminated, and therefore, the productivity is improved.

In one embodiment of the memory element, further comprising a third electrode adjacent to the memory function body, wherein the third electrode is able to apply a voltage to the memory function body in a position between the first electrode and the second electrode in a direction opposing the first electrode and the second electrode to each other.

Herein, the arrangement that the third electrode is "adjacent" to the memory function body includes the case where the third electrode is in direct contact with the memory function body and the case where the contact is made via an insulation film.

The present inventor conducted experiments and discovered the fact that, when a voltage was applied to the memory function body in a position located between the first electrode and the second electrode in the direction in which the first electrode and the second electrode were opposed to each other by the third electrode, the magnitude of the current through the memory function body grew larger. That is, the width of the memory window (hysteresis) is increased, and the memory function is improved. Therefore, according to the memory element of this embodiment, read errors in reading the storage state are reduced, and the reliability of the memory element is improved. So long as a voltage can be applied to the memory function body in the position between the first electrode and the second electrode in the direction in which the first electrode and the second electrode are opposed to each other, it is acceptable to adopt any arrangement such as an arrangement that the third electrode is directed in, for example, the direction in which the first electrode and the second electrode are opposed to each other.

In one embodiment of the memory element, the first electrode and the second electrode are each formed on a surface of a semiconductor substrate, the memory function body is formed in a region located between the electrodes on the surface of the semiconductor substrate, and the third electrode is provided on the memory function body.

According to the memory element of the above-mentioned embodiment, the structure is roughly equivalent to a structure in which the memory function body is integrated in the channel portion of a MOS type transistor. In this case, since the structure bears a close resemblance to that of a logic transistor, the manufacturing is facilitated. Moreover, it becomes easy to consolidate the memory with a logic circuit.

In one embodiment of the memory element, the first electrode and the second electrode are each made of a conductor formed on a substrate, the memory function body is formed in a region interposed between the conductors, and the third electrode is provided on the memory function body.

According to the memory element of the above-mentioned embodiment, the structure is approximately equivalent to a structure in which the memory function body is integrated into the insulation film portion of a MOS type transistor with a stacked diffusion layer lacking the source, drain and channel. In this case, since the structure bears a close resemblance to a logic transistor, the manufacturing is facilitated. Moreover, it becomes easy to consolidate the memory element with a logic circuit. Moreover, it is also possible to form the memory function body on a glass substrate.

It is acceptable to constitute a random-access memory by arranging the aforementioned memory elements in a matrix form. In this case, the structure, which is simple dissimilarly to the floating gate type memory, is therefore suitable for high integration and excellent in productivity. Moreover, there can be provided a compact random-access memory that allows low-voltage operation.

A memory device of the present invention comprising:

at least two memory cells each including the aforementioned memory element, wherein the memory cells are formed on a substrate, and the memory function bodies of the memory cells are laminated in a direction perpendicular to the substrate.

According to the memory device of the above-mentioned construction, at least two memory function bodies are laminated in the direction perpendicular to the substrate and three-dimensionally integrated. Therefore, it is possible to considerably reduce the occupation area of the memory cells and increase the memory capacity.

A method for manufacturing the aforementioned memory element comprising the step of:

implanting a substance for forming the conductive particle in the first insulator by a negative ion implantation method.

According to the method for manufacturing the memory element of the above-mentioned construction, the conductive particle can be formed in the first insulator by one-time negative ion implantation. Therefore, the memory element can be fabricated with good productivity.

As a method for forming the conductive particle in the first insulator, there can be considered a method for depositing a conductive substance by the CVD (Chemical Vapor Deposition) method, the deposition method, the MBE (Molecular Beam Epitaxy) method and so on and carrying out heat treatment to form the conductive particle. Another method for forming the conductive particle in the first insulator, there can be considered a method for depositing a conductive thin film and using fine processing techniques of photolithography, etching and so on. However, productivity is not satisfactory according to these methods. In contrast to this, according to the ion implantation, the conductive particle can be formed in the first insulator through one-time processing. Furthermore, according to the ion implantation, the fine processing techniques of photolithography, etching and so on are not required for the formation of the conductive particle. Therefore, the ion implantation is excellent in productivity.

Moreover, the substance for forming the conductive particle is implanted into the first insulator by the negative ion implantation method. Therefore, the first insulator and the substrate that supports the insulator can be prevented from being electrically charged during the implantation. Therefore, the implantation energy can be accurately controlled, thus a variation of a implantation profile can be restrained. Moreover, since the electrical charge is restrained, it is possible to restrain the occurrence of a defect caused by the breakdown of a part of the first insulator due to the electrical charge. As a result of these factors, the reliability of the fabricated memory element is improved.

A semiconductor device of the present invention comprises the aforementioned memory element.

According to the semiconductor device of the above-mentioned construction, the area of the memory element can be reduced. Therefore, the occupation area of the memory element in the semiconductor device can be reduced, thus, the semiconductor device can be constructed compact in comparison with the conventional case. Since the aforementioned memory element can operate with a comparatively low voltage. Therefore, a power source can be shared by a memory circuit that includes such a memory element and a logic circuit or the like, and this facilitates the consolidation of the memory circuit with the logic circuit. As a result, reduced power consumption becomes possible.

Electronic equipment of the present invention comprises the aforementioned semiconductor device.

According to the electronic equipment of the above-mentioned construction, the semiconductor device is constructed compact, and this equipment can be consequently made compact. Moreover, since the semiconductor device has low power consumption, the operating life of the battery mounted in this equipment is protracted. Therefore, this electronic equipment is suitable for portable use.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 3 is a graph showing results of measuring a current-to-voltage (I–V) characteristic of the resistance-changing function body of FIG. 1;

FIGS. 22A and 22B are views showing modification examples of the structure shown in FIGS. 21E and 21J;

FIGS. 30A through 30E are views showing the cross sections in the fabrication processes of the memory device of FIG. 29;

DETAILED DESCRIPTION OF THE PREFERRED EMBODIMENTS

Figure 1:
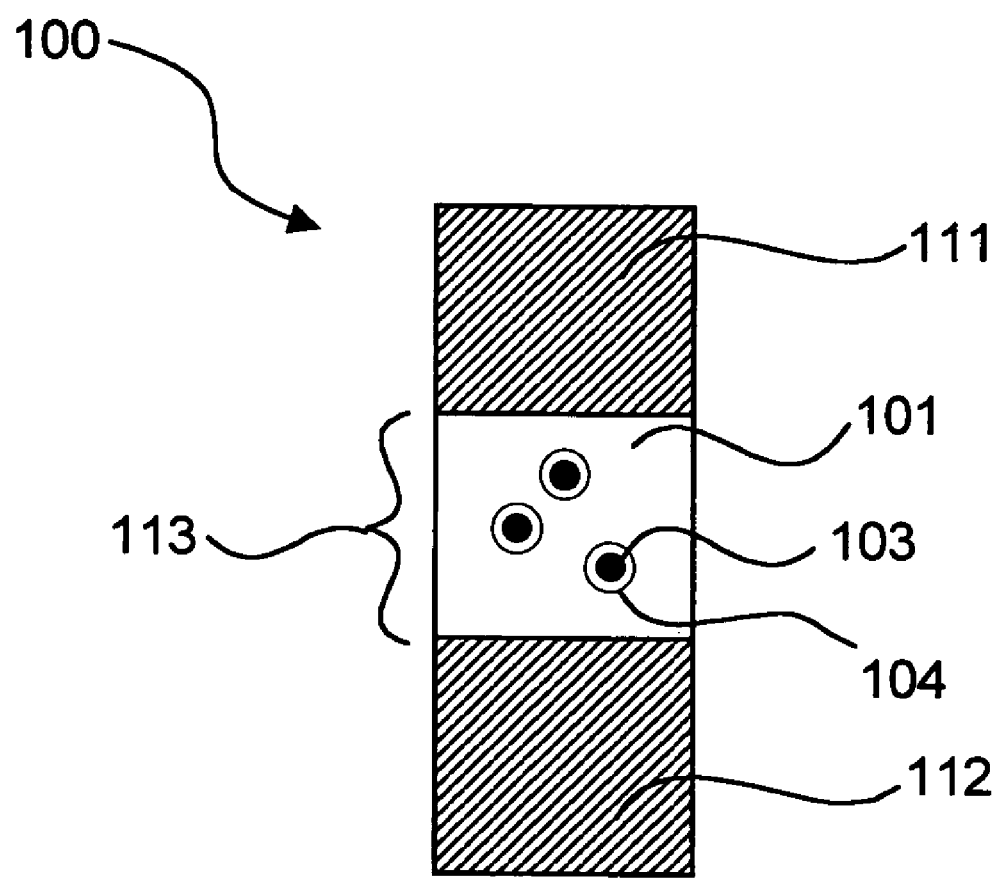
FIG. 1 is a view schematically showing the cross section of a resistance-changing function body of one embodiment of the present invention.

The present invention will be described in detail below on the basis of the embodiments shown in the drawings.

FIG. 1 is a schematic sectional view showing the resistance-changing function body of one embodiment of the present invention. This resistance-changing function body 100 is provided with a first electrode 111, a second electrode 112 and an insulator 101 that serves as a medium interposed between this first electrode 111 and the second electrode 112. One or more conductive particles 103, each of which has a nanometer size and a surface covered with an insulator 104, are contained in the insulator 101.

The resistance-changing function body 100 is fabricated in a manner as shown in the process charts of FIGS. 2A through 2D.

This embodiment employs silicon oxide as a first material for the material of the insulator 101, uses silver as a third material for the material of the particles 103 and uses silver oxide as a second material for the material of the insulator 104 so as to be manufacturable by using the existing apparatuses used in the semiconductor industry.

Figure 2A:
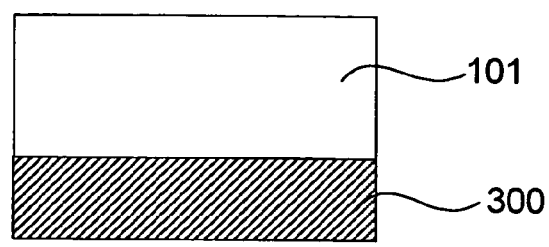
FIGS. 2A through 2D are views for explaining the fabrication processes of the resistance-changing function body of FIG. 1.

First of all, as shown in FIG. 2A, a silicon oxide film 101 is formed in the surface portion of a silicon substrate 300 by a thermal oxidation process. In this example, the silicon oxide film 101 is formed to a film thickness of about 35 nm. It is to be noted that the silicon portion other than the silicon oxide film 101 of the substrate 300 is used as a second electrode.

Figure 2B:
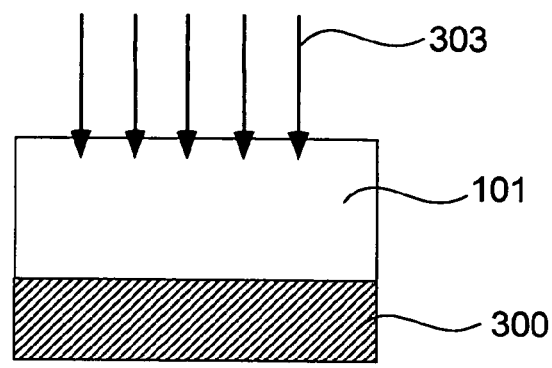

Next, as shown in FIG. 2B, silver 303 is introduced into the silicon oxide film 101 by the negative ion implantation method.

In this case, if implantation energy is excessive, then a range of distribution of the implanted silver 303 in the silicon oxide film 101 becomes to broad, and this is improper to the resistance change function and exerts excessive damage to the silicon oxide film 101, disadvantageously causing a defect. Therefore, the implantation energy should preferably be smaller than 100 keV and more preferably be especially set smaller than 50 keV.

Moreover, if the dosage of silver (dosage per unit area) is extremely large, then the particle diameter of the conductive particle becomes extremely large, and the damage to the silicon oxide film 101 is increased. If the dosage is extremely small, the distribution density of the conductive particles becomes extremely small. Therefore, the dosage of silver should preferably be greater than $1\times10^{12}/cm^2$ and smaller than $1\times10^{20}/cm^2$ and set, for example, greater than $1\times10^{14}/cm^2$ and smaller than $1\times10^{17}/cm^2$.

In the present embodiment, the implantation energy was set to about 15 keV, and the dosage was set to about $1\times10^{15}/cm^2$. It is a matter of course that the implantation energy and the dosage to be selected differ depending on the kind of ions to be implanted.

Moreover, the present embodiment adopts the negative ion implantation method as an ion implantation method. According to this implantation using negative ions, there is no possibility of the rise of the surface potential of the material (silicon oxide film 101 in the present embodiment) that undergoes the implantation to a potential close to the acceleration voltage of positive ions dissimilarly to the case where positive ions are used, so that the surface potential of the silicon oxide film 101 can be suppressed to a very low value of about several volts. More in detail, when the positive ion implantation is used, secondary electrons of negative charges are discharged when the ions of the positive charges are injected into the surface of the silicon oxide film 101. Therefore, the surface of the silicon oxide film 101 keeps being positively charged in accordance with continuing the implantation of the positive ions, and the surface potential eventually rises to the acceleration voltage of the positive ions. In contrast to this, according to the negative ion implantation method, secondary electrons of negative charges are discharged when the ions of negative charges are injected into the surface of the silicon oxide film 101. Therefore, the surface potential of the silicon oxide film 101 settles within about positive and negative several volts. As a result, the fluctuation of the effective acceleration voltage is reduced in comparison with the positive ion implantation, and therefore, it becomes possible to restrain the variation in the implantation depth of silver. Moreover, since the silicon oxide film 101 that undergoes the implantation and the silicon portion located below the film are scarcely electrically charged, it becomes possible to restrain the occurrence of defects due to dielectric breakdown and the like. In the present embodiment, a negative ion implantation apparatus produced by Nissin Electric CO., Ltd. was used.

Figure 2C:
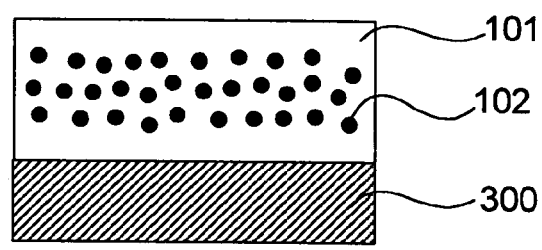

Next, the silicon oxide film 101 is subjected to heat treatment, so that the silver implanted in this silicon oxide film 101 is cohered or diffused. Through this process, silver particles 102 are formed as conductive particles in the silicon oxide film 101 as shown in FIG. 2C. Moreover, the defects, which have occurred in the silicon oxide film 101 during the ion implantation, are restored by the heat treatment.

The temperature of heat treatment is not effective when it is extremely low, but the implanted element (silver) is diffused and melted when it is extremely high. Therefore, particles cannot be formed. Accordingly, the temperature of heat treatment should preferably be set higher than 200° C. and lower than the melting point of the implanted element (silver). Moreover, the effect of the heat treatment at the above-mentioned temperature is increased by being effected for a long time even at a comparatively low temperature. However, if the time is extremely long, it sometimes occurs the case where the particle diameter of the particles becomes extremely large or the case where the implanted element diffuses to a region outside the region in which the particles should be formed. Therefore, the time to effect the heat treatment should preferably be set shorter than 24 hours.

In general, heat treatment is carried out in an inert atmosphere of argon or the like, whereas the heat treatment of the present embodiment is carried out in an atmosphere for forming an insulator that covers the surfaces of the silver particles 102. That is, the heat treatment is carried out in a vapor phase including oxygen, forming the silver particles 102 in the silicon oxide film 101 and diffusing oxygen in the silicon oxide film 101. Through this process, silver oxide 104, which serves as an insulative substance and the second material, is formed in the surface portions of the silver particles 102. That is, the silver oxide as the second material is an insulative substance formed by using silver as the third material.

It is to be noted that the conditions of the temperature, time and the flow rate of vapor phase of the heat treatment differ depending on the material to be employed, the particle diameter of the particles to be formed and the thickness of the insulator to be formed on the surface.

Figure 2D:
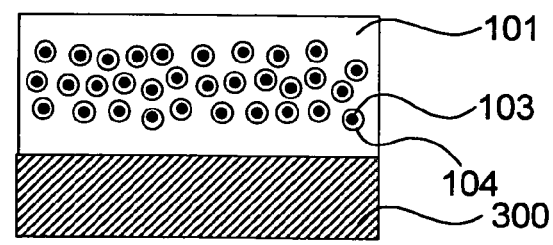

In the present embodiment, by carrying out the heat treatment in an oxidizing atmosphere for about several hours at a temperature slightly lower than that of the silicon thermal oxidation condition, there are formed silver particles 103 covered with the silver oxide 104 as shown in FIG. 2D.

It is acceptable to form an insulator constructed of a nitride as the second material around the silver particles 103 besides the insulator constructed of an oxide. For example, when the conductive particles are formed of silicon, there is a practice to inject silicon as a conductor and thereafter carry out heat treatment in, for example, an ammonia atmosphere. Through this process, the silicon particles are formed, and a silicon nitride as an insulator is formed in the surface portion of the silicon particles.

Moreover, it is acceptable to first carry out the heat treatment in an inert atmospheres of argon, nitrogen or the like in which the conductive particles are formed to a certain extent, and thereafter change the atmosphere to an atmosphere in which the conductive particles are partly made insulative. According to this method, the conductive particles can be made insulative after the size of the conductive particles is adjusted to the desired size, and therefore, the diameter of the conductive particles can be formed accurately to the desired size. For example, when the normal thermal processing furnace is used, a treatment temperature of about 300° C. to 900° C. is preferable in the inert atmosphere of argon, nitrogen or the like. For example, the heat treatment is effected for about one hour at a temperature of about 700° C. in the argon atmosphere by means of a ceramics electric tube furnace made by Asahi Rika, CO., Ltd. This condition of heat treatment is in the case of the silver particles, and the optimum heat treatment condition differs depending on the material to be formed into the conductive particles.

Further, when the heat treatment for forming the conductive particles is carried out at a comparatively low temperature, it is preferable to subject the insulation film as the medium to heat treatment at a temperature of about 500 to 1000° C. in order to repair the defects caused by the implantation. At this time, since an inconvenience of the fusion or diffusion of the conductive particles occurs when the heat treatment is effected for a long time, it is preferable to carry out RTA (Rapid Thermal Annealing), i.e., heat treatment for a short time.

As a method for forming an insulator on the surface of the conductive particles, there is a method for carrying out ion implantation of oxygen, nitrogen or the like and thereafter carrying out oxidation, nitridation or the like by an annealing process besides the aforementioned thermal oxidation in the oxidizing atmosphere and thermal nitridation in the nitriding atmosphere. According to the ion implantation method, oxygen or nitrogen can be supplied to the desired depth in comparison with the method by thermal diffusion from the surface in the thermal processing furnace. Therefore, this method is especially effective when, for example, it is desired to avoid oxidation, nitridation and so on in the vicinity of the surface of the medium constructed of the first material including conductive particles.

Figure 2E:
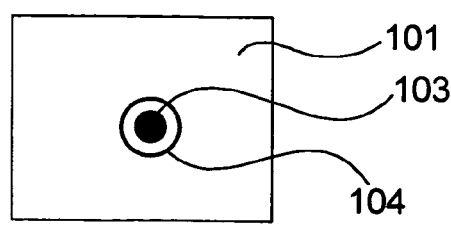
FIG. 2E is an enlarged view of part of FIG. 2D.

The states of the conductive particles and the insulator produced by the manufacturing method of the present embodiment were examined by cross-sectional TEM (Transmission Electron Microscope) observation. As a result, as shown in FIG. 2D, it was confirmed that the silver particles 103 of a nanometer size of about 2 to 3 nm and the silver oxide 104 that covers the periphery of the particles were formed at the prescribed depth corresponding to the acceleration energy of silver ions. FIG. 2E is an enlarged view of part of FIG. 2D.

As described above, according to the present embodiment, the negative ion implantation method is used in forming the silver particles 102 in the silicon oxide film 101. Therefore, silver can easily be implanted to the desired depth in the silicon oxide film 101 while controlling the electrification of the silicon oxide film 101. Moreover, the ion implantation method is used for the formation of the silver particles 102. Accordingly, there are fewer processes than when the conductive film is etched, and no nanoscale fine processing technique is used, dissimilarly to the conventional case. Therefore, the nanometer-size particles can be formed with satisfactory productivity.

After the silver particles 103 covered with the silver oxide 104 are formed in the silicon oxide film 101, a first electrode 111 is formed on the silicon oxide film 101. The material of this first electrode 111 may be either a metal or a semiconductor or an organic substance so long as it has conductivity. As a method for forming the first electrode 111, there can be adopted the CVD (Chemical Vapor Deposition) method, the deposition method, the MBE (Molecular Beam Epitaxy) method and so on. In the present embodiment, the first electrode 111 is formed through Al film formation by the normal vacuum deposition method, completing a resistance-changing function body.

According to the resistance-changing function body of the present embodiment, the silver particles 102 can be formed with a high concentration through fewer processes within a short time by ion implantation and heat treatment. According to the ion implantation method, no fine processing technique is required for the formation of the silver particles 102, and therefore, the resistance-changing function body can be manufactured with satisfactory productivity.

Although the silver particles 102 are employed as the conductive particles in the present embodiment, it is acceptable to form conductive particles by using a conductor of a metal such as gold or copper other than silver or a semiconductor such as silicon or germanium. It is to be noted that gold is not easily oxidized, and it is difficult to form an insulator around the particles after the formation of the particles. In contrast to this, it is preferable to employ a material of, for example, aluminum, which forms a strong oxide film on its surface through oxidation. It is also acceptable to form the conductive particles by using tungsten, niobium, zirconium, titanium, chromium, tin, cobalt, nickel, iron, antimony, lead and so on.

Moreover, the silver particles 102 were formed as the conductive particles in the silicon oxide film 101 formed by subjecting the silicon substrate to thermal oxidation. However, the silver particles may be formed in another insulator of a glass substrate or the like, a semiconductor substrate and so on.

Moreover, the silicon oxide film is not limited to the thermal oxidation film but allowed to be a silicon oxide film formed by the CVD method or the like or one obtained by oxidizing polysilicon or amorphous silicon. It is to be noted that a silicon oxide film obtained by oxidizing single-crystal silicon is more preferable since it has a better film quality.

Furthermore, it is possible to employ another insulator besides the silicon series insulators of silicon nitride and so on.

Moreover, in the present embodiment, the material of conductive particles is implanted in the medium constructed of the insulative substance by the negative ion implantation method. Therefore, it is possible to effectively restrain the electrification of the insulative medium and the substrate which supports the insulative medium during the implantation. Therefore, the implantation depth of the material of the conductive particles can be accurately controlled, and the variation in distribution profile of the material can be restrained. That is, the formation depth and region of the conductive particles can be accurately controlled. Moreover, since the electrification during the implantation is restrained, it is possible to restrain the occurrence of defects as a consequence of the destruction of the insulative medium due to the electrification. Consequently, the reliability of the resistance-changing function body can be effectively improved.

FIG. 3 is a graph showing a current-to-voltage (I–V) characteristic at the normal temperature (25° C.) of the resistance-changing function body 100 fabricated by the aforementioned method.

This current-to-voltage characteristic exhibits a change in the current that flows through this first electrode 111 when the second electrode 112 is grounded and the voltage applied to the first electrode 111 is changed. First of all, if the application voltage of the first electrode 111 is continuously raised from about –1 V, then the absolute value of the current reduces as indicated by the arrow S1. Subsequently, if the voltage is continuously lowered from about 0 V, then the absolute value of the current value increases as indicated by the arrow S2 through a route different from the arrow S1. When the application voltage reaches –1 V, the absolute value of the current value lowered as indicated by the arrow S2 becomes smaller than that of the initial current value when the application voltage has started rising from –1 V. The fact that the absolute value of the current has reduced with respect to the same application voltage means that the resistance has increased. As described above, hysteresis appears in the current-to-voltage (I–V) characteristic shown in FIG. 3. It can be said that this is because a satisfactory Coulomb blockade is achieved by the mutual isolation of the conductive particles 103 due to a satisfactory barrier effect given from the insulator 104 that covers the particles.

Moreover, it can also be considered that the cause of the occurrence of hysteresis is ascribed to the change of coulombic energy as a consequence of the diffusion, disappearance or the enlargement through cohesion of extremely minute particles of the plurality of conductor particles due to the influence of the current. It can otherwise be considered that the coulombic energy has changed as a consequence of the discharge of electrons from the conductor particles due to thermal energy caused by Joule heat.

Moreover, the following can be considered as another cause of the occurrence of hysteresis. That is, one or several electric charges are accumulated in a specified silver particle 103 out of the plurality of silver particles 103 in the silicon oxide film 101, and a Coulomb interaction is exerted on the electrons of the other silver particles 103 that form a current path in the vicinity of the specified silver particle 103 due to the accumulated electric charges. As a result, it can be considered that the easiness of the flow of the current in the current path, i.e., the electrical resistance changes. It can be considered that the aforementioned hysteresis appears due to any one or a combination of a plurality of these effects.

However, there is also a possibility that the hysteresis appears due to a factor other than these. Anyway, it is clear that a sufficiently large hysteresis can be obtained in practice according to the resistance function body of the present invention irrespective of the factor.

In the case where an excessive voltage is applied across the first and second electrodes 111 and 112 of the resistance-changing function body 100, the current value has remarkably increased. It can be considered that this is ascribed to the change of the silver particle 103 contained in the silicon oxide film 101. Otherwise, it can be considered that the above is ascribed to the dielectric breakdown of either one or both of the portion of the silicon oxide film 101 and the silver oxide 104 located between the silver particles 103 and 103. It is to be noted that the portion of the silicon oxide film 101 and the silver oxide 104 located between the silver particles 103 and 103, which are tunnel barriers, therefore scarcely cause dielectric breakdown. Accordingly, it can be considered that the above is ascribed to the diffusion or cohesion of the silver particles 103 or the change of the silver oxide 104 due to Joule heat or the change in the state of the silver particles 103 due to migration caused by the current.

If this property is utilized, there occurs a large difference in the change of the current value between when it is operated with a proper voltage and when an excessive voltage is applied to it. Therefore, one resistance-changing function body 100 can be operated in more than two modes.

The resistance-changing function body 100 of the present embodiment is able to be used to discriminate binary data by way of the magnitude of the current value which varies due to the aforementioned hysteresis effect, and is able to be used as a memory function body. That is, the silicon oxide film 101 including the silver particles 103 and the silver oxide 104 functions as a memory function body 113. The resistance-changing function body of the present invention, which can be considered to have a capability of capturing electrons, can also be called a charge retention function body.

Conventionally, a fuse memory that has utilized the dielectric breakdown of the insulation film or the like has needed a high voltage for causing the dielectric breakdown of the insulation film or the like. In contrast to this, the resistance-changing function body 100 of the present embodiment, when used as a fuse memory, has a comparatively small thickness of the portion of the silicon oxide film 101 and the silver oxide 104 between the silver particles 103 and 103 corresponding to the substantial insulation film thickness, and these insulation films are capable of producing the tunnel effect. Therefore, it becomes possible to execute write operation at a voltage lower than in the conventional fuse memory. Therefore, the present resistance-changing function body 100 can also be used as a fuse memory of low-voltage operation.

In the present embodiment, the particle diameter of the silver particle 103 was approximately not greater than 3 nm within the range of TEM observation. Resistance-changing function bodies that had conductive particles of a particle diameter of not greater than approximately 6 nm and conductive particles of a particle diameter of not greater than approximately 10 nm were fabricated by a manufacturing method similar to that of the present embodiment, and these resistance-changing function bodies were subjected to an experiment for measuring the I–V characteristic. As a result, it was discovered that the hysteresis of the I–V characteristic became smaller as the particle diameter of the conductive particles increased and the hysteresis had the tendency of becoming indistinct even at a temperature lower than the room temperature. As a result of experiments of the conductive particles of other particle diameters, it was clarified that the particle diameter of the conductive particle was required to be not greater than 11 nm or preferably not greater than 7 nm and more preferably not greater than 4 nm in order to obtain hysteresis.

In the present specification, the term of "particle diameter" means the size of the particle, which corresponds to the "diameter" thereof when the shape of the particle is approximately spherical or is able to be approximated to a sphere. In the present invention, the particle shape should preferably be close to a spherical shape. However, if a conductor of a particle of a deformed or imperfect shape is employed, it is possible to regard any one of the diameter of a spherical conductor that has the same volume as that of the above-mentioned conductor, the diameter of a sphere that has a surface area equivalent to the surface area of the above-mentioned conductor, the diameter of a sphere that has a volume equivalent to the volume of the above-mentioned conductor, and a distance between two points of the particle, the points being mutually most apart from each other, as the particle diameter. For example, it is possible to regard the "semimajor axis" in the case where the shape of the particle can be approximated to an elliptical sphere, the cubic root of the value derived by multiplying semimajor axis by squared semiminor axis or the like as the particle diameter.

When the Coulomb blockade effect is utilized to retain electric charges, the energy necessary for making the electric charges break away from the conductive particle should be sufficiently greater than the thermal energy due to the ambient temperature in consideration of the capacity of the conductive particle so that the Coulomb blockade effect becomes remarkable. For the above purpose, the radius of the conductive particle should be about 0.5 nm to 1 nm when the conductive particle is assumed to be a perfect conductive sphere. The Coulomb blockade effect itself becomes more remarkable as the particle diameter of the conductive particle becomes smaller. However, a high voltage is needed across the first and second electrodes when the particle diameter of the conductive particle is extremely small, and therefore, the extremely small particle diameter is not preferable from the viewpoint of device applications.

Moreover, the resistance-changing function body 100 of the present embodiment undergoes negative ion implantation in order to form the silver particles 102 in the silicon oxide film 101. Therefore, the silicon oxide film 101 has kept a quality equivalent to that of the silicon oxide film before implantation and has become of very high reliability. Moreover, the processing time of the formation of the particle is reduced in comparison with the case where the conductive particle is formed by CVD or the like, and therefore, satisfactory productivity is possessed.

Moreover, according to the negative ion implantation, the variation in the distribution profile of conductive particles due to electrification can be restrained as described above. Therefore, the variation in the distribution profile of the particles 102 in the thickness direction of the silicon oxide film 101 can be restrained. Therefore, the silicon oxide film 101 that includes the silver particles 103 and the silver oxide 104, i.e., the memory function body 113 can be formed into a thin film and is allowed to be miniaturized. When the memory function body 113 is formed into a thin film, the effective electric field applied to the memory function body 113 becomes stronger than when the memory function body 113 is thick even with the same voltage applied across the first and second electrodes 111 and 112. Therefore, if a memory element is formed of the resistance-changing function body 100, it becomes possible to reduce the operating voltage of this memory element and improve both productivity and low power consumption.

Figure 4:
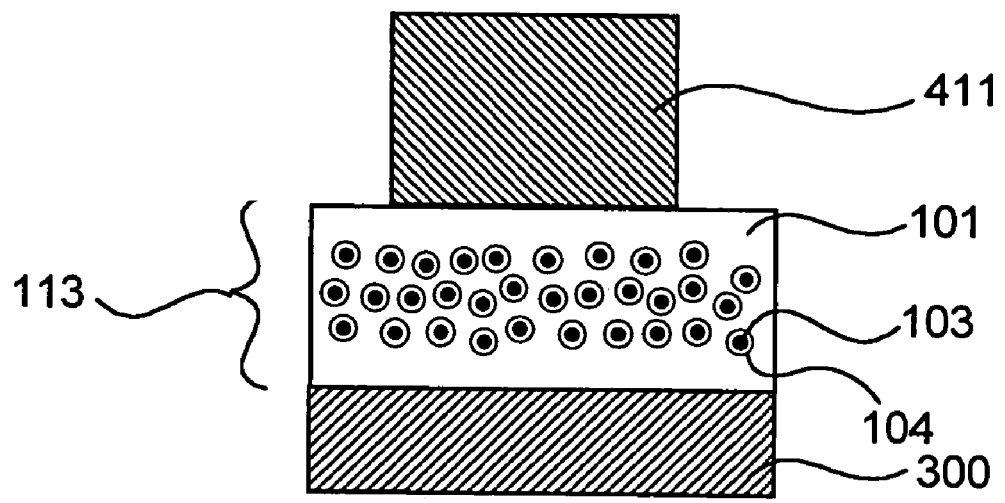
FIG. 4 is a view showing a memory element formed by employing the resistance-changing function body of FIG. 1.
Figure 5:
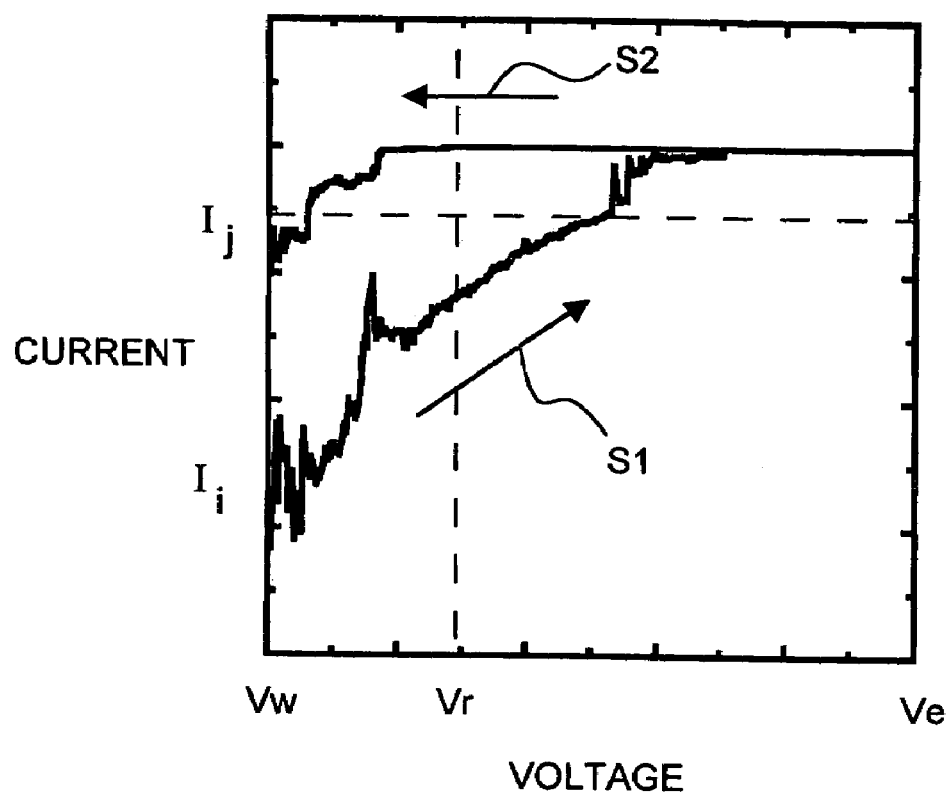
FIG. 5 is a graph for explaining the memory operation of the memory element of FIG. 4.

FIG. 4 is a view showing a memory element 150 that has a structure similar to that of the resistance-changing function body and is provided with an electrode 411 as a first electrode obtained by depositing and patterning an Al film. That is, the silicon oxide film 101 is the first insulator, the silver particles 103 are the conductor particles, and the silver oxide 104 is the second insulator. A power source and a current sensor (not shown) are connected to the electrode 411. FIG. 5 is a graph showing the current-to-voltage (I–V) characteristic at the normal temperature (25° C.) of a memory element 150 provided with this electrode 411. Operation for discriminating the storage state of the memory element 150 will be described by using this graph.

The characteristic of the memory element 150 shown in FIG. 5 is obtained by grounding the silicon portion of the substrate 300, applying a voltage to the first electrode 411 and observing the current that flows through the first electrode 411 similarly to the case of FIG. 3 of the resistance-changing function body. First of all, if the application voltage of the first electrode 411 is continuously raised from Vw, then the current value of the first electrode 411 increases from its initial value $I_i$ as indicated by the arrow S1. Subsequently, if the application voltage of this first electrode 411 is continuously lowered after the application voltage reaches Ve, then the current value reduces as indicated by arrow S2 through a route different from the arrow S1. When the application voltage is lowered to Vw, there is a resulting current value Ij of which the absolute value is smaller than the initial current value $I_i$ when this application voltage is raised. As described above, the fact that the magnitude of the current has reduced with respect to the same voltage Vw means that the resistance has increased. As described above, hysteresis appears in the current-to-voltage (I–V) characteristic shown in FIG. 5.

In this case, as shown in, for example, FIG. 5, a write voltage Vw and an erase voltage Ve are set. Then, a read voltage Vr for discriminating the written state from the erased state is set that the voltage becomes the central voltage value of the memory window (range of the voltage value that causes hysteresis), and a reference current value Ij that serves as a criterion for discrimination is set. The storage state of this memory element 150 can be discriminated by reading the magnitude of the current when the read voltage Vr is applied according to the relation of the magnitude between the read value of the current and the reference current value Ij. For example, the state is the erased state (logic 0) when the read value of the current is greater than the reference current value Ij, and the state is the written state (logic 1) when the read value of the current is smaller than the reference current value Ij.

As described above, the memory element 150 that employs the memory function body can be used as a binary memory.

In another embodiment, a conductive particle can be formed of silicon in place of silver. That is, silicon was implanted by a dosage of $1 \times 10^{15}$ to $1 \times 10^{16}$/cm$^2$ with implantation energy of 10 to 15 KeV into a silicon thermal oxidation film. Then, heat treatment was carried out in a nitriding atmosphere, and a memory function body, in which SiN/Si particles obtained by covering the surfaces of the silicon particles with SiN discretely existed in SiO$_2$, was fabricated. The heat treatment was carried out for several hours at a temperature of about 900° C. in an ammonia atmosphere.

The memory function body fabricated in the present embodiment has a great hysteresis (i.e., the memory window is large) and a satisfactory charge retention characteristic in comparison with the conventional memory function body that has the particles formed by CVD and etching. This is because the insulation film, which includes the SiN/Si particles, is the silicon thermal oxidation film and therefore has a quality better than that of the conventional CVD film and polysilicon oxide film. Furthermore, there is an influence that the silicon particle surface is covered with SiN and this SiN has a good quality with an approximately uniformly formed thickness obtained through an annealing process.

Moreover, in another embodiment, a conductive particle is formed of aluminum in place of silver. The above-mentioned aluminum is implanted into a silicon thermal oxidation film by a dosage of $1 \times 10^{14}$ to $1 \times 10^{16}/cm^2$ with implantation energy of 5 to 15 KeV. Then, heat treatment is carried out at a temperature of not higher than 600° C. Through this process, there was fabricated a memory function body, in which $Al_2O_3/Al$ particles obtained by covering the surfaces of aluminum particles with alumina discretely existed in $SiO_2$.

The memory function body of the present embodiment has a greater hysteresis (i.e., the memory window is large) and a better charge retention characteristic than those of the conventional memory function body. This is because an excellent charge storage capability can be obtained by the use of aluminum that is a metal used as conductive particles and further because an excellent charge retention capability can be obtained by surrounding the conductive particles with alumina that is a satisfactory insulator. The above-mentioned alumina is in a so-called passive state, and the oxidation thereof scarcely progresses after being formed by the oxidation of the aluminum particle surface. Therefore, the above-mentioned alumina is formed approximately uniformly in thickness. With this arrangement, there can be provided a memory function body that has stable memory operation and high reliability.

In another embodiment, the particle contained in the memory function body is formed by another method. That is, a diffusion method is used as a method for adding a material for forming conductive particles into the first insulator instead of the ion implantation method. For example, when an aluminum particle is formed in a silicon thermal oxidation film similarly to the aforementioned embodiment, firstly, a silicon thermal oxidation film is formed similarly to the aforementioned embodiment. Thereafter, an aluminum film is formed on the silicon thermal oxidation film by means of a vacuum evaporation system. It is acceptable to use a sputtering method instead of the deposition method and use any method so long as the aluminum film can be formed.

Subsequently, heat treatment is carried out at a temperature of about 400° C. to 600° C., diffusing aluminum in the silicon thermal oxidation film. Subsequently, heat treatment is carried out at a temperature lower than the temperature of diffusion, and thereafter oxidation is carried out to form alumina as a second insulator.

Subsequently, an electrode is formed similarly to the aforementioned embodiment, forming a memory function body. It was confirmed that this memory function body had a satisfactory memory characteristic similarly to the embodiment in which the aluminum particles were formed by implantation.

Since the memory function body of the present embodiment uses the diffusion method, the memory function body of the present invention can be fabricated more simply.

It is preferable to employ a silicon film that contains Al in place of the aluminum film formed on the silicon thermal oxidation film because the aluminum concentration in the vicinity of the surface of the silicon thermal oxidation film can be prevented from increasing. Furthermore, it is more preferable to employ a material such that the oxide forms a passive state, as represented by aluminum because an insulator of good quality can be formed by oxidation around the conductive particles.

In the present embodiment, the memory element can be fabricated by the existing semiconductor apparatuses without using any special fine processing technique. Moreover, it is, of course, possible to fabricate only one particle by using a fine processing technique of electron beam or the like as in the single-electron transistor proposed in recent years.

Moreover, it is preferable to carry out a hydrogen sintering process in forming the conductive particles because the unnecessary interface state and so on can be restrained to allow a resistance-changing function body and a memory function body of stable operation to be obtained.

Figure 6A:
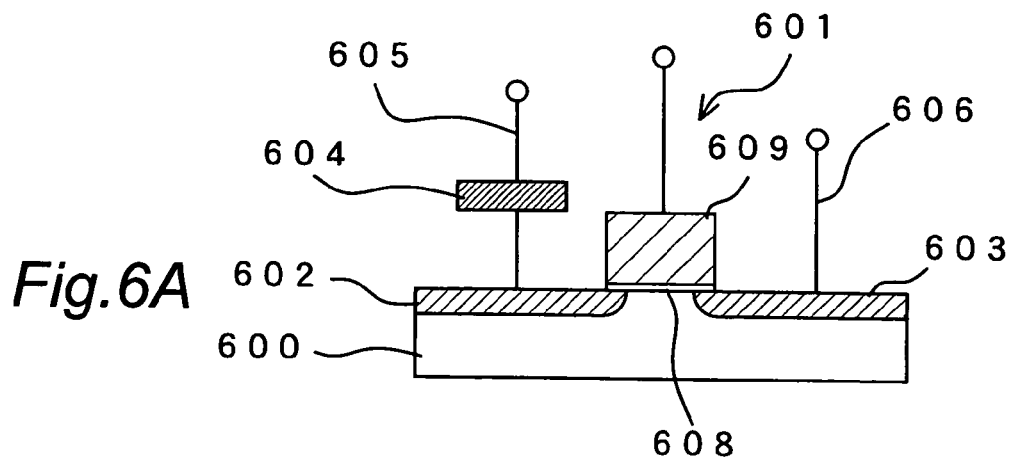
FIG. 6A is a view schematically showing a memory device including a memory element and a select transistor.

FIG. 6A is a schematic sectional view showing a memory device according to an embodiment of the present invention. In this memory device, a memory element including a memory function body 604 (which has the same structure as that of the memory function body 113 of the embodiment of FIG. 1) and a select transistor 601 for selecting the memory element including the memory function body 604 are electrically connected in series to each other and integrated on a silicon substrate 600. The select transistor 601 is a normal MOS transistor and includes a drain region 602 and a source region 603, which are formed mutually apart on the surface of the silicon substrate 600, a gate oxide film 608 that covers the substrate surface between the regions and a gate electrode 609. It is to be noted that contacts 605 and 606 are connected to the drain region 602 and the source region 603, respectively.

Figure 6B:
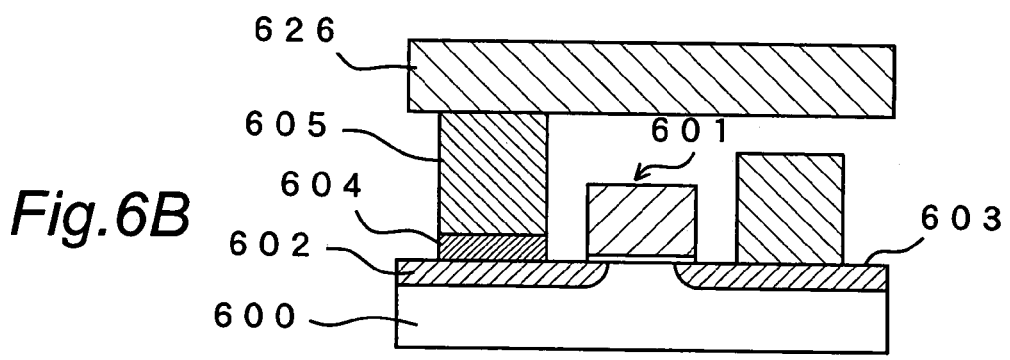
FIGS. 6B through 6D are views showing its concrete constructions.
Figure 6C:
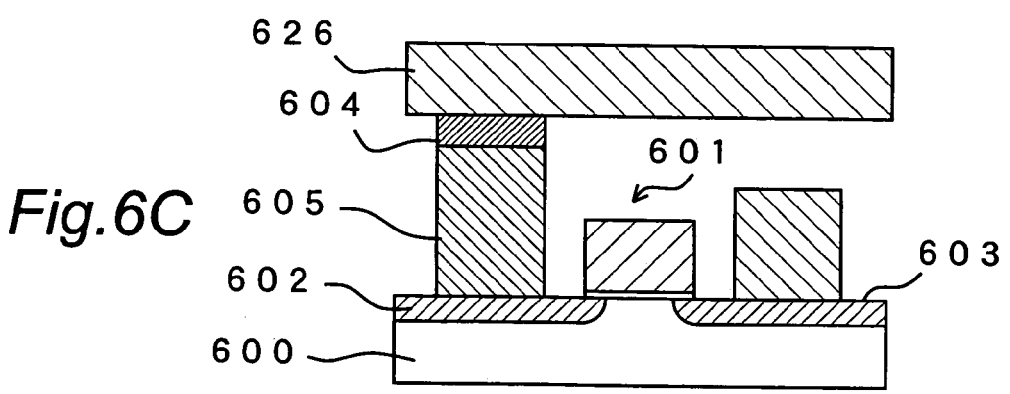
Figure 6D:
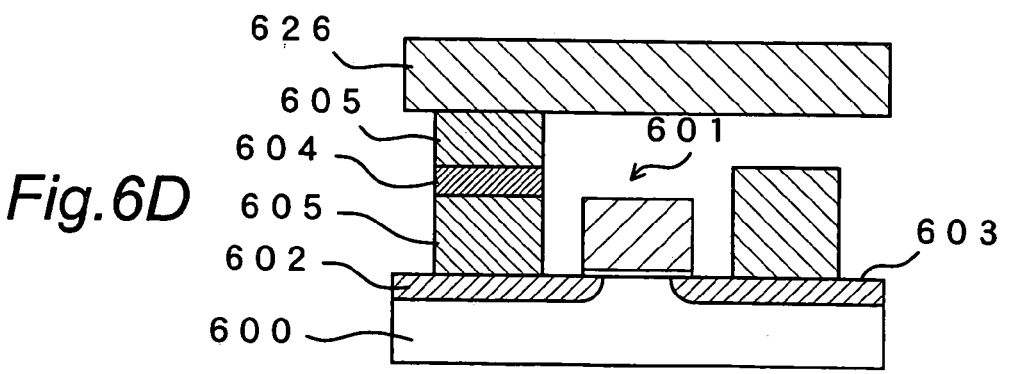

In this example, the memory function body 604 is provided as part of the contact 605 connected to the drain 602 of the select transistor 601. In concrete, FIG. 6B shows an example in which the memory function body 604 is provided so as to be in contact with the drain region 602. FIG. 6C shows an example in which the memory function body 604 is provided in contact with a metal interconnection of a bit line 626. FIG. 6D shows an example in which the memory function body 604 is provided partway in the contact 605.

Figure 7:
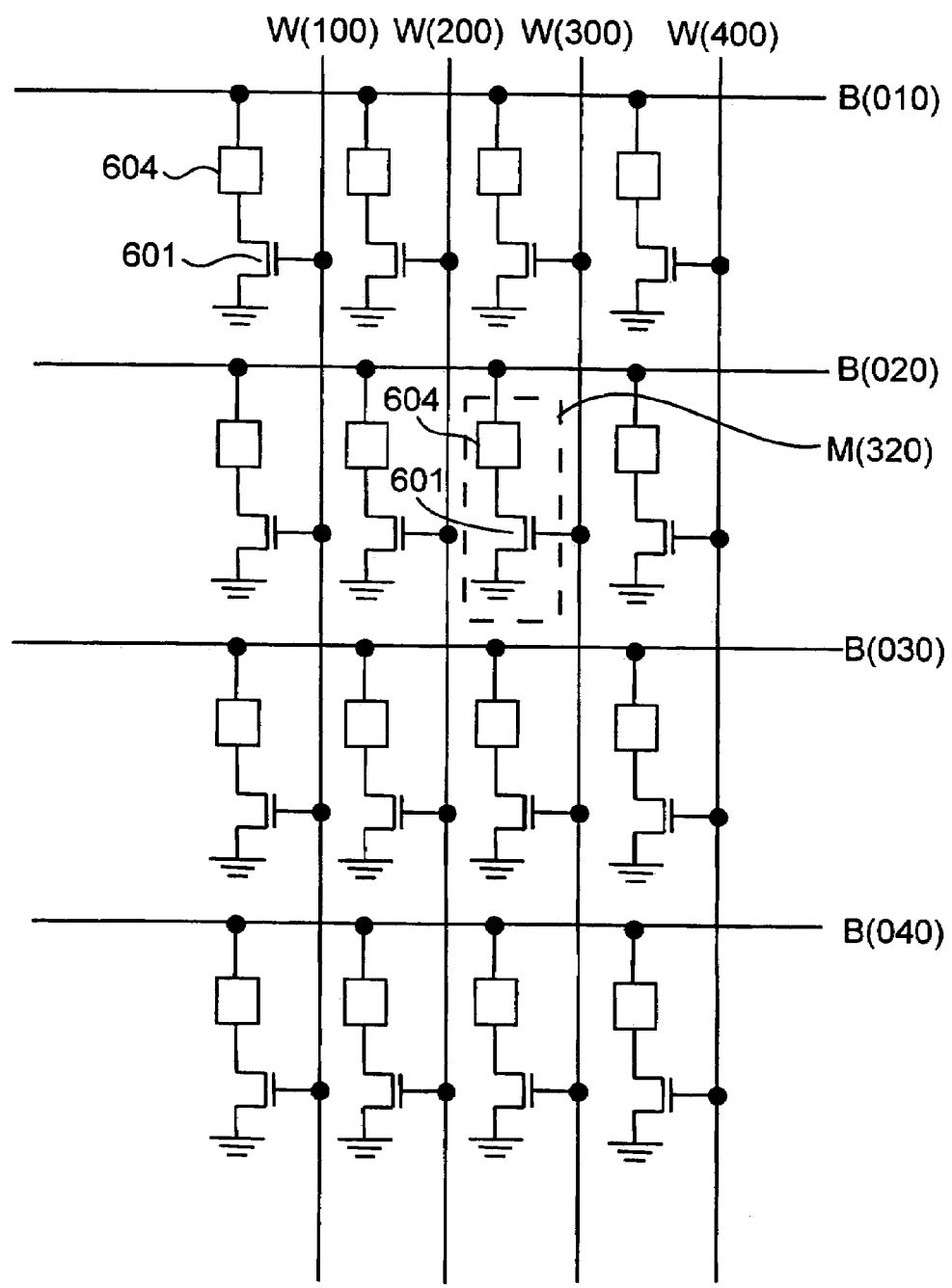
FIG. 7 is a diagram illustrating a memory device provided with memory cells that include the aforementioned memory element and a select transistor, which are arranged in a matrix form.

FIG. 7 shows a memory device provided with memory cells M each of which includes the aforementioned memory element and the select transistor, the memory cells being arranged in a matrix form. Word lines W and bit lines B are extended in the direction of row and in the direction of column, respectively. The memory function body 604 of the memory element and the select transistor 601 of each of the memory cells M are connected in series between the corresponding bit line B and the ground.

For example, in selecting the memory cell M(320), a voltage VH higher than the threshold voltage of the select transistor is applied to the word line W(300) connected to the memory cell, and a voltage of 0 V (ground potential) is applied to the other word lines W(100), W(200) and W(400). In addition, a voltage Vb necessary for write, read and erase is applied to the bit line B(020) connected to the memory cell M(320). Meanwhile, a voltage of, for example, 0 V, which causes neither write nor erase operation even if the select transistor is in the on-state, is given to the other bit lines B(010), B(030) and B(040).

By the above operation, a voltage of a potential difference of about Vb is applied to the memory function body 604 of the memory cell M(320), performing the memory operation. In the other memory cells, since the select transistor 601 is in the off-state or the potential of the bit line B is 0 V even if the select transistor 601 is in the on-state, no voltage is applied to the memory function body, performing no memory operation.

Figure 8:
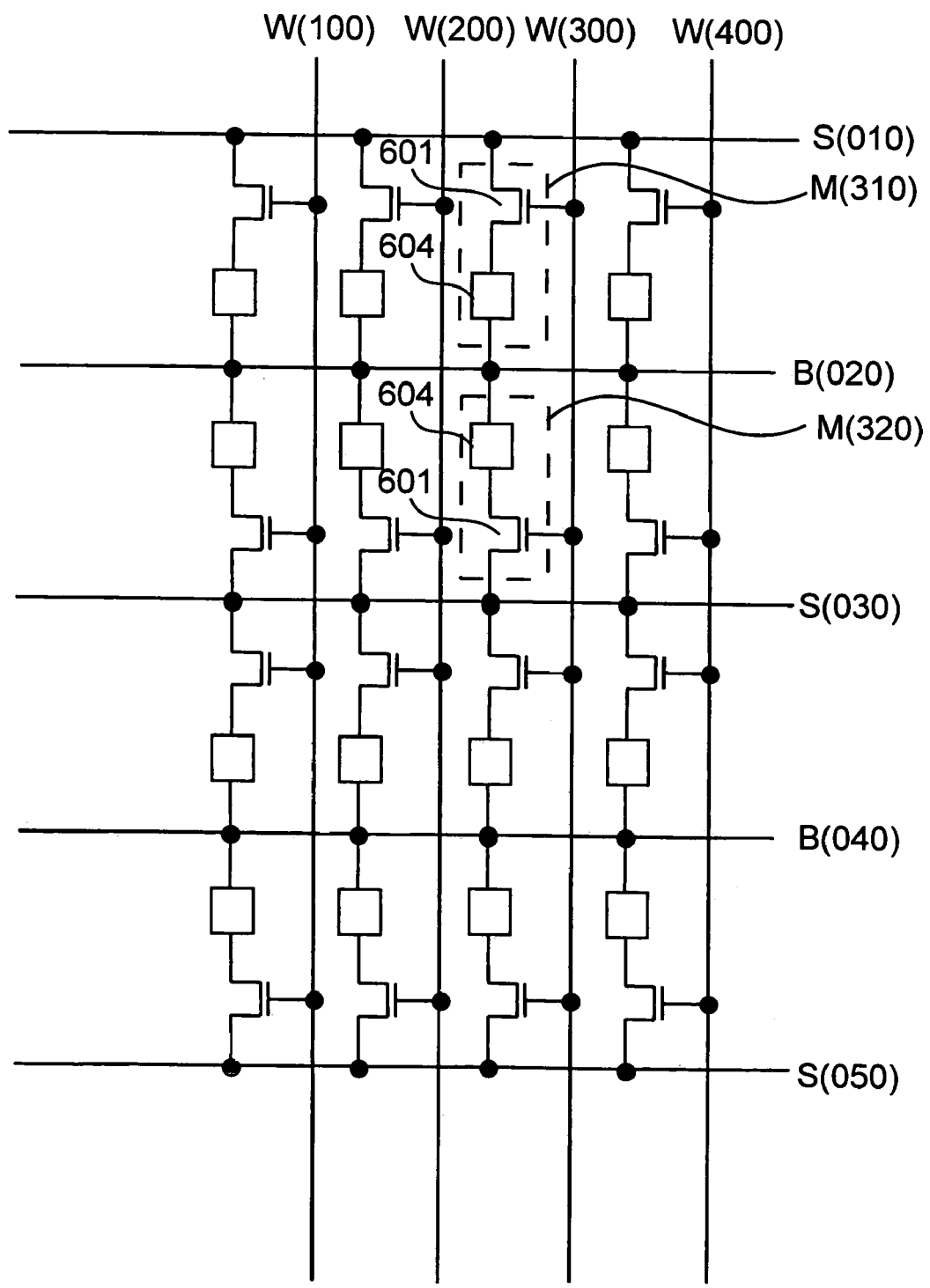
FIG. 8 is a diagram illustrating a memory device provided with memory cells that include the aforementioned memory element and a select transistor, which are arranged in a matrix form.

FIG. 8 shows a memory device provided with memory cells each of which includes the aforementioned memory function body 604 of the memory element and the select transistor 601, the memory cells being arranged in a matrix form. In this example, the arrangement of the memory function body 604 and the select transistor 601 are symmetrical (inverted) between memory cells that are mutually adjacent in the direction of row, and the memory function body 604 and the select transistor 601 of each of the memory cells are connected in series between the corresponding bit line and source line.

For example, in selecting the memory cell M(320), a voltage VH higher than the threshold voltage of the select transistor is applied to the word line W(300) connected to the memory cell, and a voltage of 0V (ground potential) is applied to the other word lines W(100), W(200) and W(400). In addition, a voltage Vb necessary for write, read and erase is applied to the bit line B(020) connected to the memory cell M(320). Meanwhile, a voltage of, for example, Vb, which causes neither write nor erase operation of the memory cell M(310), is applied to the source line S(010). A voltage of, for example, 0 V, which causes neither write nor erase operation even if the select transistor is in the on-state, is applied to the other bit line B(040) and source lines S(030) and S(050).

With the above arrangement, a voltage of a potential difference of about Vb is applied to the memory function body 604 of the memory element of the memory cell M(320), performing the memory operation. In the other memory cells, since the select transistor 601 is in the off-state or the potential difference between the bit line B and the source line S is 0 V even if the select transistor 601 is in the on-state, no voltage is applied to the memory function body, performing no memory operation.

Figure 9A:
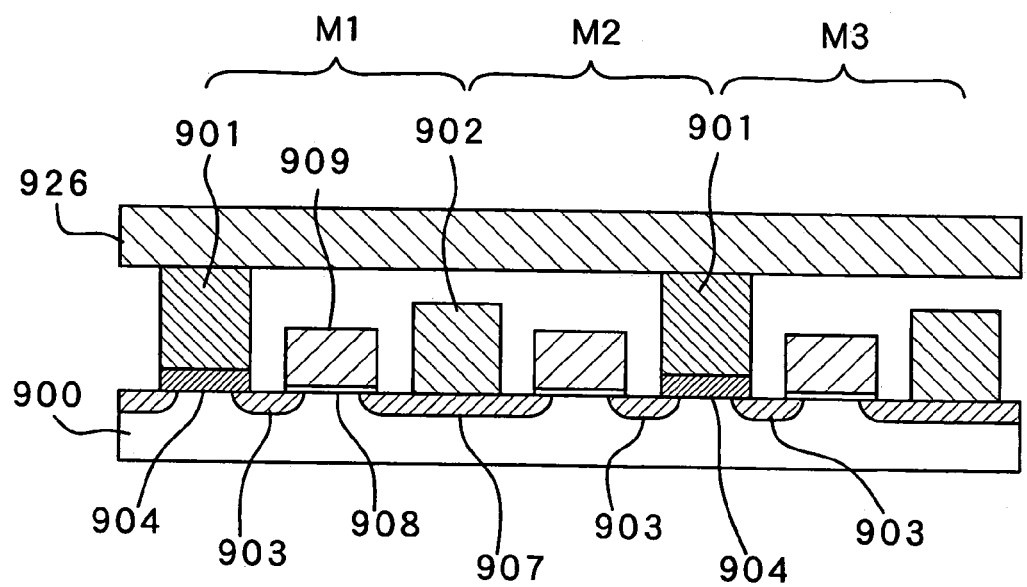
FIG. 9A is a view showing the cross-sectional structure of a memory device provided with memory cells that include the aforementioned memory element and a select transistor.
Figure 9B:
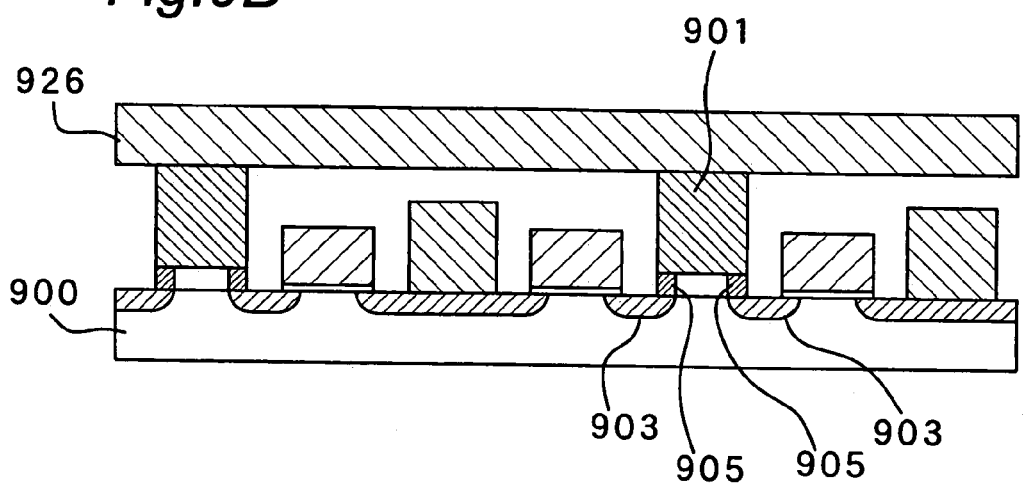
FIG. 9B is a view showing the portion that substantially performs memory operation in the memory function body of FIG. 9A.

FIGS. 9A and 9B show the cross-sectional structure of the memory device of one embodiment in which a plurality of memory cells M1, M2, M3, . . . of the type such that the aforementioned memory function body of the memory element and the select transistor are connected in series are integrated on a silicon substrate 900. The select transistor of each of the memory cells M includes a drain region 903 and a source region 907, which are formed mutually apart on the surface of the silicon substrate 900, a gate oxide film 908 and a gate electrode 909 that cover the substrate surface between the drain and source regions. The mutually adjacent memory cells are constructed symmetrically with respect to a direction (transverse direction in FIG. 9) parallel to the substrate 900. Source regions 907 of the memory cells M1 and M2 are integrally continuously formed, and one source contact 902 is formed on this source region 907. That is, the source contact 902 is shared by the memory cells M1 and M2. Drain regions 903 and 903 of the memory cells M2 and M3 are isolated apart in the transverse direction, and one memory function body 904 (which has the same structure as that of the aforementioned memory function body 113) and one bit contact 901 are formed over those drain regions 903 and 903. That is, the memory function body 904 is formed integrally continuously in the transverse direction so as to be in contact with the two drain regions 903 and 903. Moreover, the bit contact 901 is shared by the memory cells M2 and M3. A corresponding bit line 926 is connected to the bit contact 901.

In this construction, the regions that perform the memory operation out of the memory function body 904 are limited to regions 905 and 905 which are interposed between the bit contact 901 and the drain regions 903 and 903 and to which a voltage is applied as shown in FIG. 9B. The memory function bodies 904 are basically an insulator although it contains conductive particles. Therefore, the remaining region (corresponding to the portion located between the regions 905 and 905) to which no effective voltage is applied in the memory function body 904 performs no memory operation.

Therefore, in this memory, the memory function body 904 of the memory element operates as a 2-bit memory function body. Therefore, the occupation area of the memory element including the memory function body 904 becomes about a half in comparison with the case where one memory function body is formed on each of the drain regions 903. Moreover, the number of bit contacts 901 and source contacts 902 can be reduced to about a half. Therefore, the occupation area per cell is reduced, and the integration degree is increased.

Figure 10A:
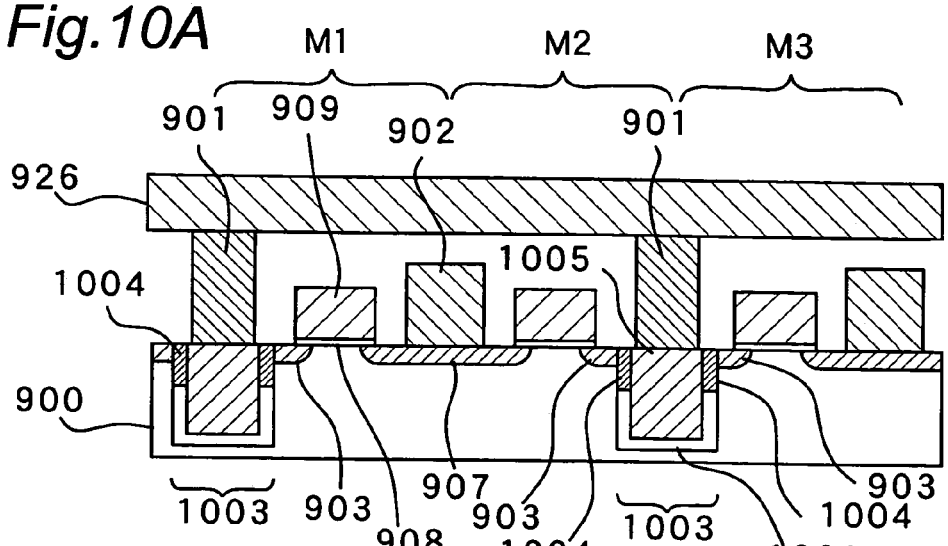
FIGS. 10A and 10B are views showing the cross-sectional structure of a memory device that includes the aforementioned memory element and a select transistor.
Figure 10B:
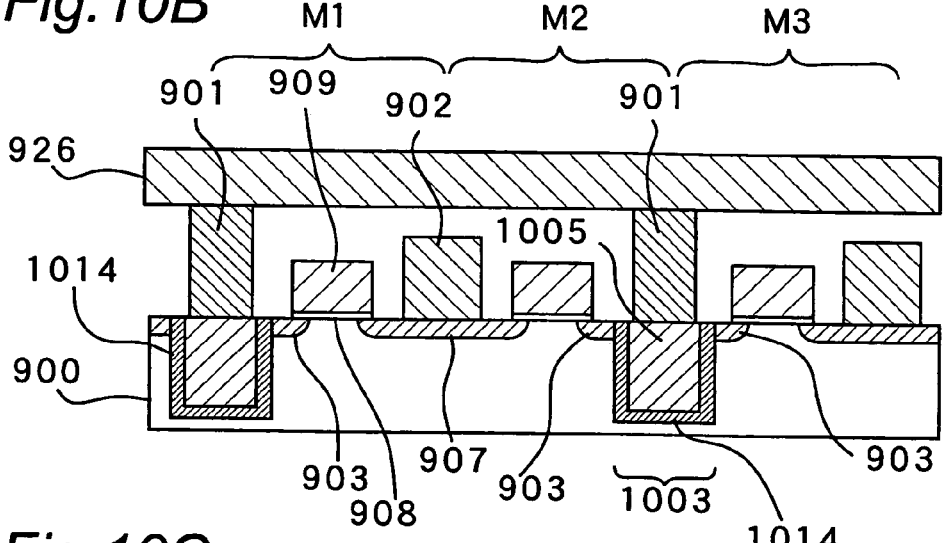

FIGS. 10A and 10B show modification examples of the memory device shown in FIG. 9A. It is to be noted that the same components as those already shown in the figures are denoted by same reference numerals, and no description is provided for them (applicable also hereinafter).

In these modification examples, the drain regions 903 and 903 of the mutually adjacent memory cells M2 and M3 are transversely isolated apart by a trench (groove) 1003 of a sectionally rectangular shape formed on the substrate 900. An insulation film 1001 is formed in a sectionally bracket-like shape along the substrate wall surfaces (inner walls of the trench) that define the trench 1003, and the inside of the insulation film 1001 is stuffed with a conductive substance (trench electrode) 1005 of, for example, polysilicon or metal. The trench electrode 1005 is electrically connected to a bit contact 901.

In the memory device of FIG. 10A, the conductive particle, of which the surface is covered with a second insulation film, is contained only in the region near the substrate top surface of the insulation film 1001, constituting a memory function body 1004. In this example, the memory function body 1004 reaches a depth deeper than that of the drain region 903 from the substrate top surface. On the other hand, in the memory device of FIG. 10B, conductive particles are contained in the whole region of the insulation film 1001, constituting a memory function body 1014.

Figure 10C:
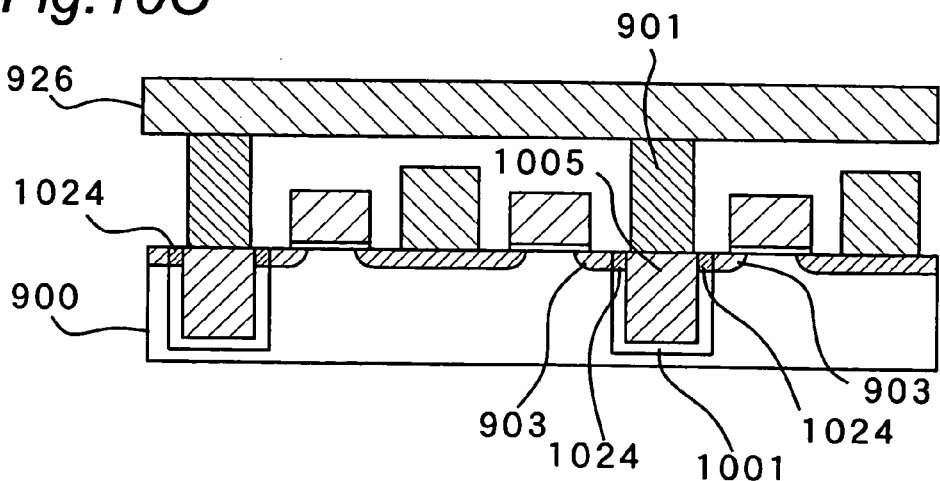
FIG. 10C is a view showing the portion that substantially performs memory operation in the memory function body of FIG. 10A.

Anyway, as shown in FIG. 10C, the regions that perform the memory operation in the memory function body are limited to regions 1024 and 1024, which are interposed between the trench electrode 1005 and the drain region 903 and to which a voltage is applied. The memory function body is basically an insulator although it contains the conductive particles. Therefore, the remaining region to which no effective voltage is applied in the memory function body performs no memory operation.

In these memory devices of FIGS. 10A and 10B , the occupation area of the memory function bodies 1004 and 1014 becomes about a half similarly to the memory of FIG. 9 in comparison with the case where one memory function body is formed on each of the drain regions 903. Moreover, the number of bit contacts 901 and source contacts 902 can be reduced to about a half. Therefore, the occupation area per cell is reduced, and the integration degree is increased.

Figure 11:
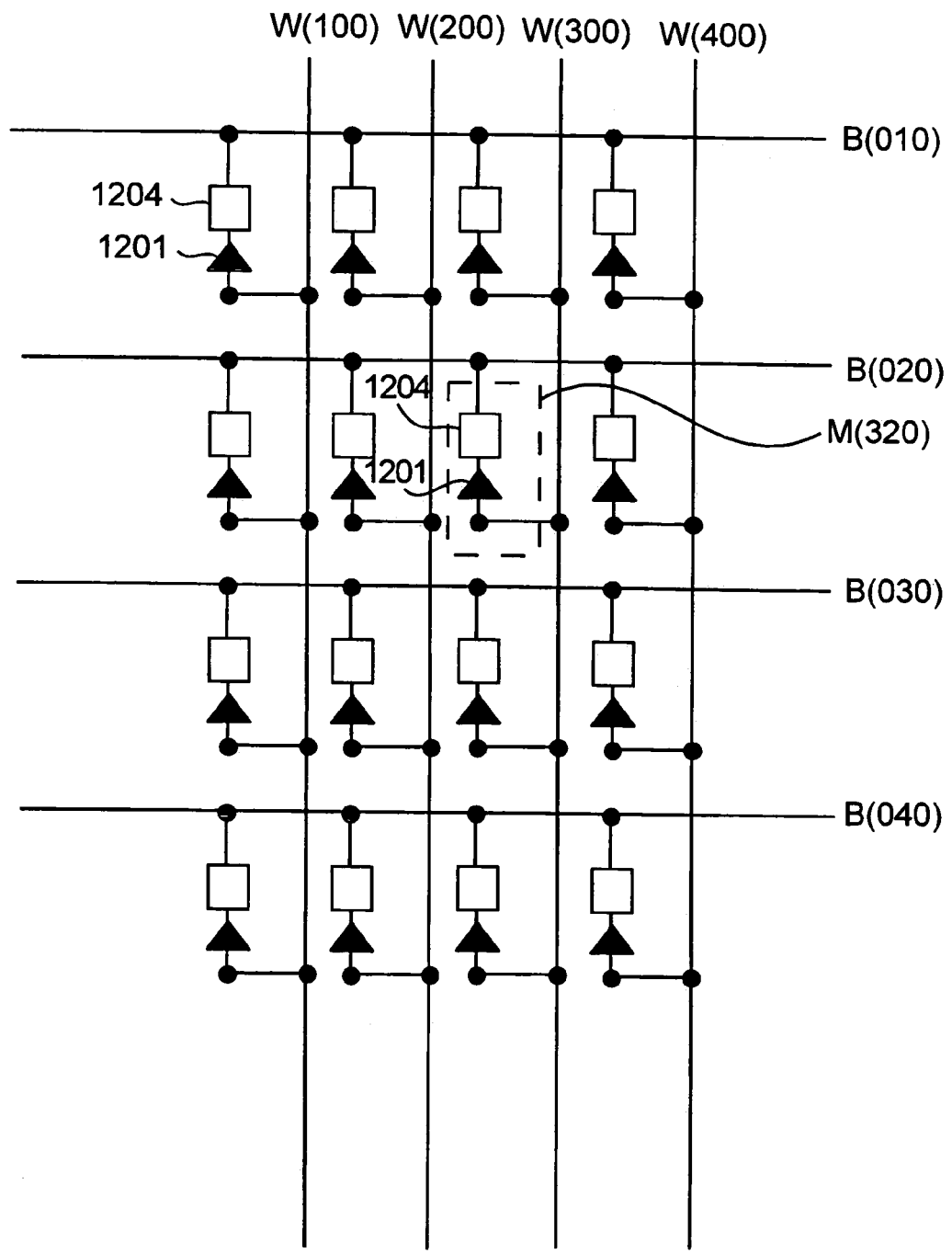
FIG. 11 is diagram illustrating a memory device provided with memory cells that include the aforementioned memory element and a rectifying function body, which are arranged in a matrix form.

FIG. 11 shows a memory device provided with memory cells M each of which includes the aforementioned memory function body and a rectifying function body, the memory cells arranged in a matrix form. Word lines W and bit lines B are extended in the direction of row and in the direction of column, respectively. A memory element including a memory function body 1204 (comprising the same configuration as the aforementioned memory function body 113) and a rectifying function body 1201 of each of the memory cells M are connected in series between the corresponding bit line B and word line W. Each rectifying function body 1201 permits the flow of a current from the word line W to the bit line B through the memory function body 1204 and obstructs the flow of a current from the bit line B to the word line W through the memory function body 1204.

For example, in selecting the memory cell M(320), a positive voltage VH is applied to the word line W(300) connected to the memory cell, and a negative voltage VL, which provides a potential difference necessary for the desired operation of the write, read and erase in the memory function body 1204, is applied to the bit line B(020). Further, a voltage, which provides a potential difference that causes neither write nor erase in the memory function body 1204 even if the positive voltage VH is applied to the word line W, is applied to the other bit lines B(010), B(030) and B(010). For example, in order to render the potential difference zero, the voltage VH is applied. Likewise, the potential difference applied to the nonselected memory function body 1204 is rendered zero by applying the voltage VL to the other word lines W(100), W(200) and W(400).

By the above operation, a potential difference of about (VH–VL) is applied to the memory function body 1204 of the memory cell M(320), performing the memory operation. In the other memory cells M, The potential difference is zero or a voltage inverted with respect to the rectifying function body 1201 even if there is a potential difference. Therefore, the current is limited, and the memory function body 1204 performs no memory operation.

Otherwise, it is acceptable to employ a rectifying function body 1201 having a threshold value in the forward direction and permitting no current or only a current that is too small to cause the memory operation with a potential difference smaller than Vt to flow. It is to be noted that, if the potential difference necessary for the memory operation of the memory function body 1204 is assumed to be Vm, then there holds the expression: Vt>(Vm/2). (Vm/2). For example, in order to select the memory cell M(320), a positive voltage (Vm/2) is applied to the word line W(300) and a negative voltage –(Vm/2) is applied to the bit line B(020), giving a potential difference Vm necessary for the memory operation to the memory function body 1204. A voltage of 0 V is applied to the other word lines W and bit lines B. In this case, a maximum potential difference of (Vm/2) is applied to the nonselected memory cells M. However, since the current is limited by the rectifying function body 1201, no memory operation is performed.

FIGS. 12A through 12E show various possible structures of the memory cells that include the aforementioned memory function body and the rectifying function body constructed of a pn junction.

Figure 12A:
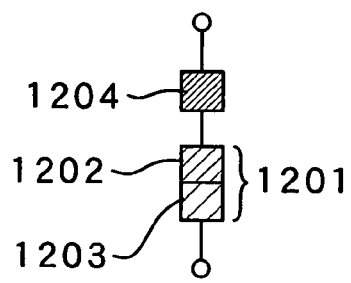
FIG. 12A is a view schematically showing a memory cell that includes the aforementioned memory element and a rectifying function body constructed of a pn junction.

FIG. 12A schematically shows a mode in which the memory element including the memory function body 1204 (comprising the same configuration as the aforementioned memory function body 113) and the rectifying function body 1201 are electrically connected in series to each other. The rectifying function body 1201 includes a pn junction constructed of an n-type semiconductor 1202 and a p-type semiconductor 1203.

Figure 12B:
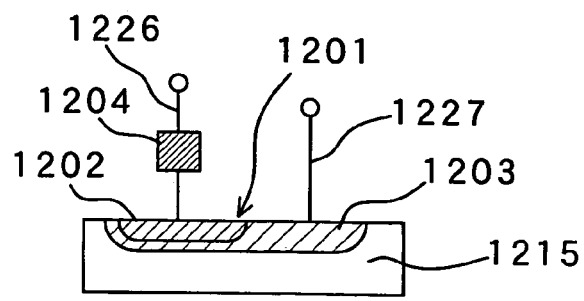
FIGS. 12B through 12E are views showing its concrete constructions.

FIG. 12B schematically shows a mode in which the rectifying function body 1201 in FIG. 12A is formed on a semiconductor substrate (e.g., silicon substrate) 1215. In this example, the p-type semiconductor region 1203 and the n-type semiconductor region 1202 of the rectifying function body 1201 are respectively formed through implantation, diffusion and so on of impurities into the surface of the semiconductor substrate 1215 by a well-known method.

Figure 12C:
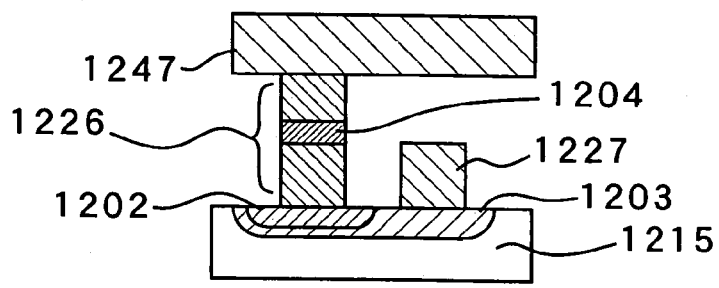
Figure 12D:
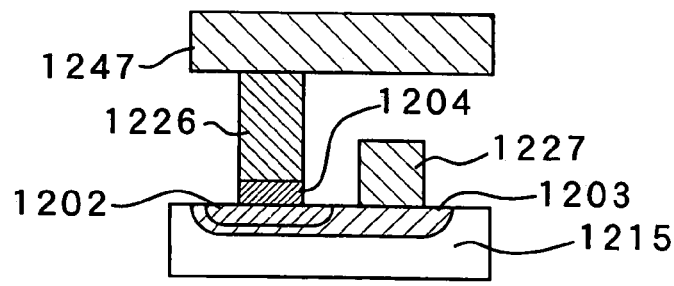
Figure 12E:
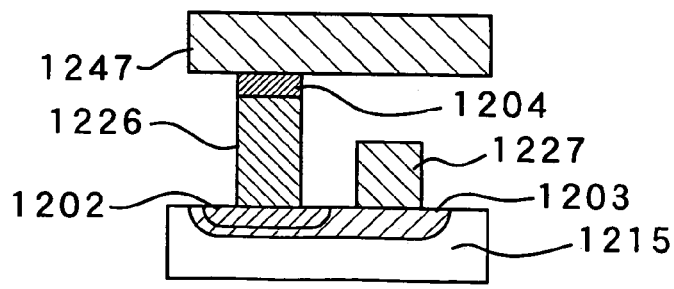

FIGS. 12C through 12E concretely show the arrangements of the memory function body 1204 in FIG. 12B. FIG. 12C is an example in which the memory function body 1204 is provided partway in a contact 1226. FIG. 12D is an example in which the memory function body 1204 is provided in contact with the n-type semiconductor region 1202. Moreover, FIG. 12E is an example in which the memory function body 1204 is provided in contact with a bit line 1247. The memory function body 1204 is formed by the aforementioned method, and the contacts 1226 and 1227 are formed by a well-known method.

FIGS. 13A through 13D show various structures in the case where a memory element and a rectifying function body constructed of a pn junction are included in each memory cell and the constituent elements are shared by mutually adjacent two memory cells. It is to be noted that contacts, which are expressed in a simplified style in FIGS. 13A through 13D, are formed by a well-known method.

Figure 13A:
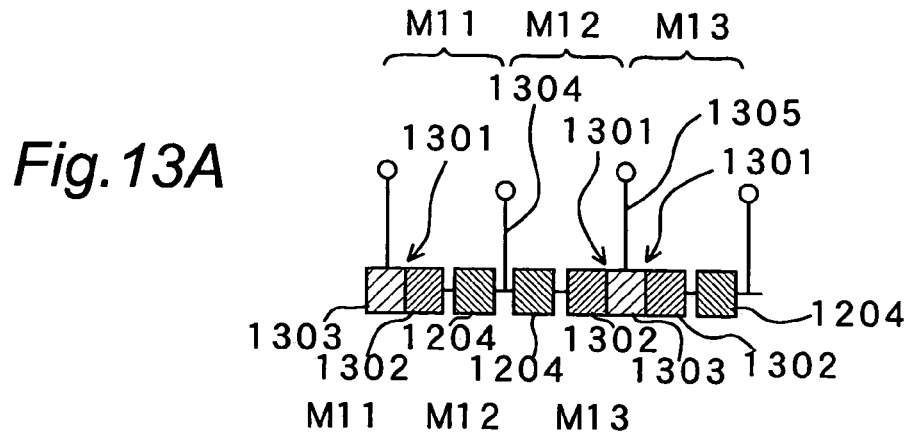
FIG. 13A is a view schematically showing a structure whose constituent elements are shared by mutually adjacent two memory cells that includes a memory element and a rectifying function body constructed of a pn junction in each of the memory cells.

FIG. 13A schematically shows a mode in which memory cells M11, M12, M13, . . . including the memory function bodies 1204 of the memory elements and the rectifying function bodies 1301 are electrically connected in series. Mutually adjacent memory cells are symmetrically constructed. Each of the rectifying function bodies 1301 includes a pn junction constructed of an n-type semiconductor region 1302 and a p-type semiconductor region 1303. A word contact 1305 and a bit contact 1304 are electrically connected to the p-type semiconductor region 1303 and the memory function body 1204, respectively.

Figure 13B:
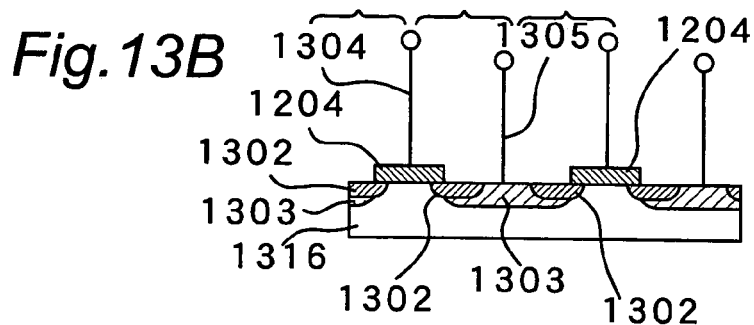
FIGS. 13B through 13D are views showing its concrete constructions.

FIG. 13B shows the cross-sectional structure of a memory device in which the aforementioned plurality of memory cells M11, M12, M13, . . . are integrated on a silicon substrate 1316. The n-type semiconductor regions 1302 and 1302 are formed mutually apart in a direction (transverse direction in FIG. 13) parallel to the substrate 1316 in the memory cells M11 and M12, and one memory function body 1204 and one bit contact 1304 between mutually adjacent memory cells M11 and M12 are formed over those n-type semiconductor regions 1302 and 1302. That is, the memory function body 1204 is formed integrally continuously in the transverse direction so as to be in contact with the two n-type semiconductor regions 1302 and 1302. The p-type semiconductor region 1303 is integrally continuously formed between mutually adjacent memory cells M12 and M13, and one word contact 1305 is formed on the p-type semiconductor region 1303. If this arrangement is adopted, the occupation area per cell is reduced, and the integration degree is increased.

In order to fabricate this memory device, an oxide film (not shown) is first formed on the surface of the silicon substrate 1316, and the memory function body 1204 is formed by the aforementioned method. Next, the p-type semiconductor region 1303 and the n-type semiconductor region 1302 are formed through implantation, diffusion and so on of impurities into the surface parts of the silicon substrate 1316. At this time, no impurity is implanted into the region covered with the memory function body 1204. Subsequently, contacts 1304 and 1305 are formed by a well-known method.

Figure 13C:
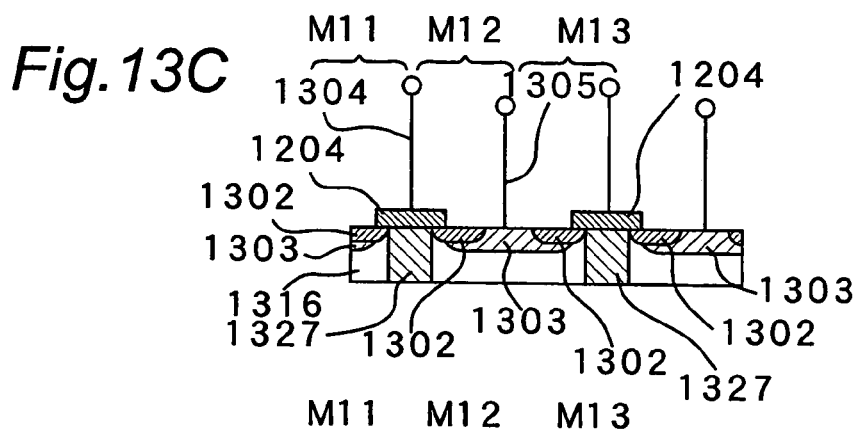

FIG. 13C shows a modification example of the memory device shown in FIG. 13B. In this modification example, an element isolation region 1327 is provided between the n-type semiconductor regions 1302 and 1302 of the mutually adjacent memory cells M11 and M12 by a well-known method. If this arrangement is adopted, the mutually adjacent memory cells M11 and M12 can reliably be electrically isolated from each other.

Figure 13D:
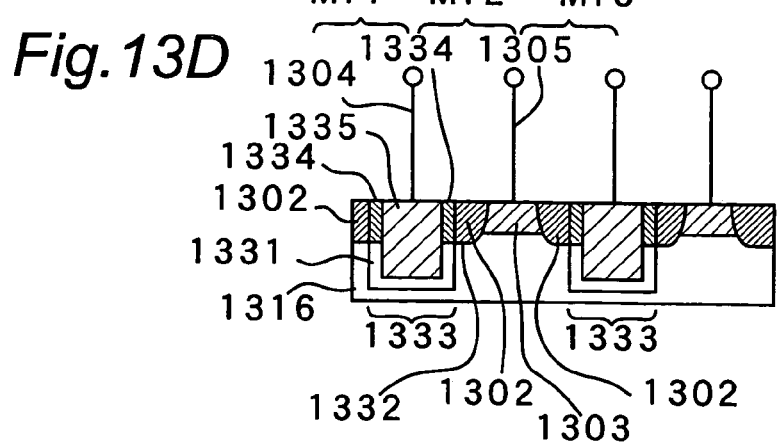

FIG. 13D shows a further modification example. In this modification example, a trench (groove) 1333 of a sectionally rectangular shape is provided between the n-type semiconductor regions 1302 and 1302 of the mutually adjacent memory cells M11 and M12 on the substrate 1316 by a well-known method. An insulation film 1331 is formed in a sectionally bracket-like shape along the substrate wall surfaces (inner walls of the trench) that define the trench 1333, and the inside of the insulation film 1331 is stuffed with a conductive substance (trench electrode) 1335 of, for example, polysilicon or metal. The trench electrode 1335 is electrically connected to the bit contact 1304. Then, conductive particles are contained only in the region near the substrate top surface of the insulation film 1331, constituting a memory function body 1334. In this example, the memory function body 1334 reaches a depth approximately equal to the depth of the n-type semiconductor region 1302 from the substrate top surface. If this arrangement is adopted, the mutually adjacent two memory cells M11 and M12 can reliably be electrically isolated from each other.

Figure 14:
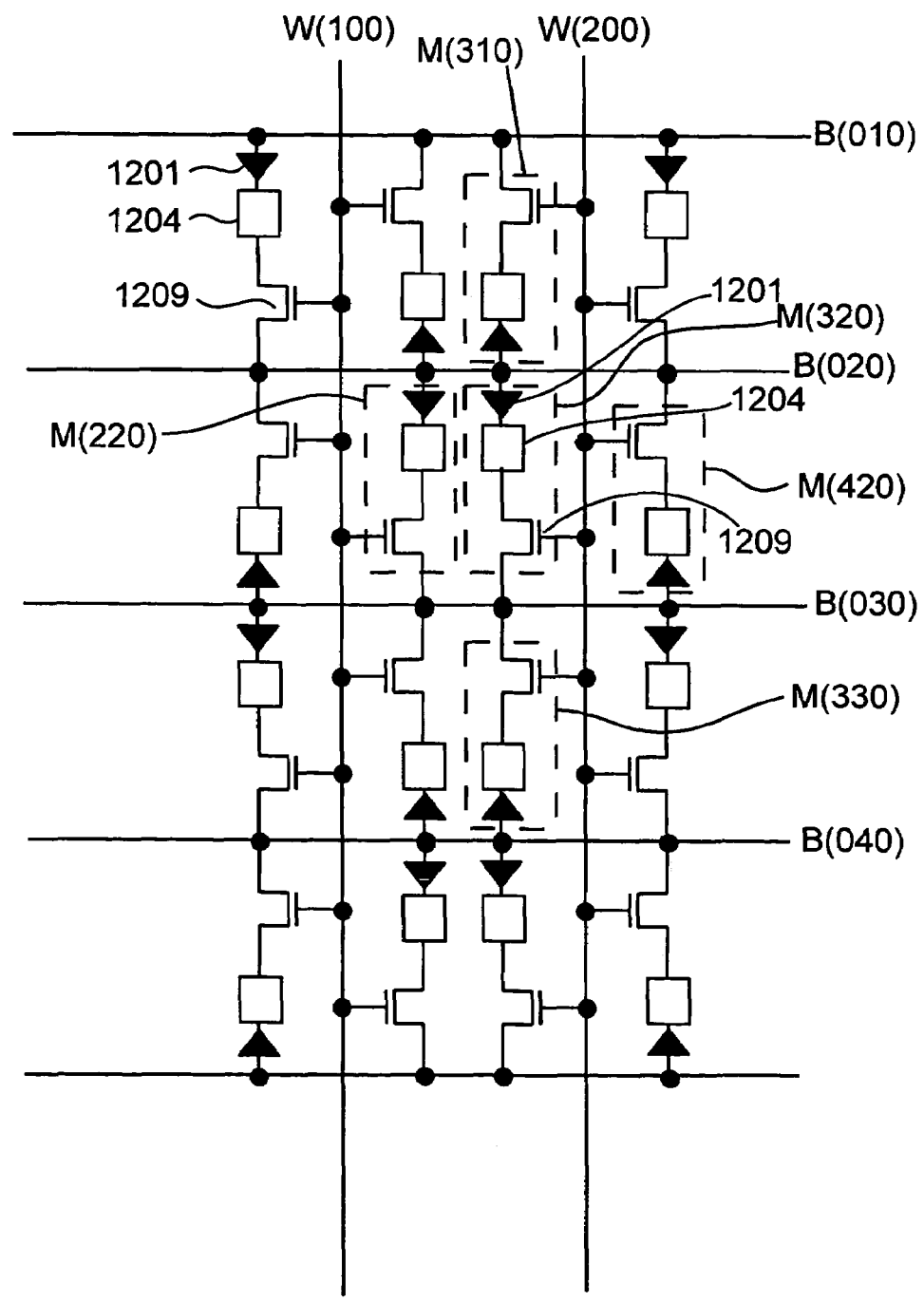
FIG. 14 is a diagram illustrating a memory device provided with memory cells that include the aforementioned memory element, the rectifying function body and a select transistor, which are arranged in a matrix form.

FIG. 14 shows a memory device provided with memory cells M each of which includes the memory element including the aforementioned function body, a rectifying function body and a select transistor, the memory cells being arranged in a matrix form. Word lines W and bit lines B are extended in the direction of row and in the direction of column, respectively. In this example, the arrangement of the memory function body 1204, the rectifying function body 1201 and the select transistor 1209 (which has the same structure as that of the aforementioned select transistor 601) is symmetrical between the memory cells M that are mutually adjacent in the direction of row. Moreover, the arrangement of the memory function body 1204, the rectifying function body 1201 and the select transistor 1209 is symmetrical between the memory cells M that are mutually adjacent via a word line W in the direction of column. The memory function body 1204, the rectifying function body 1201 and the select transistor 1209 of each memory cell M are connected in series between the corresponding bit line B and bit line B. It is to be noted that each bit line B is switched over to operate also as a source line.

The memory cell M(320) is assumed as a first cell. With regard to it, memory cells M(310) and M(330), which are mutually adjacent in the direction of row, are assumed as a second cell and a fourth cell, respectively, and the memory cells M(220) and M(420), which are mutually adjacent in the direction of column, are assumed as a third cell and a fifth cell. The first cell M(320) and the second cell M(310) have the bit line B(020) shared, the word line W(200) shared and the source lines B(010) and B(030) unshared. The first cell M(320) and the third cell M(220) have the bit line B(020) shared, the source line B(030) shared and the word lines W(200) and W(100) unshared. The first cell M(320) and the fourth cell M(330) have the source line B(030) shared, the word line W(200) shared and the bit lines B(020) and B(040) unshared. The first cell M(320) and the fifth cell M(420) have the word line W(200) shared. The source line B(030) of the first cell M(320) and the bit line B(030) of the fifth cell M(420) are shared, and the bit line B(020) of the first cell M(320) and the source line B(020) of the fifth cell M(420) are shared.

For example, in selecting the first cell M(320), a voltage Vo that turns on the select transistor 1209 is applied to the word line W(200), and a voltage Vu that turns off the select transistor 1209 is applied to the other word line W(100). In addition, a high voltage VH is applied to the bit lines B(010) and B(020), and a low voltage VL is applied to the other bit lines B(030) and B(040). It is to be noted that a potential difference (VH−VL) is assumed to be a potential difference with which a forward current sufficient for the memory operation of the memory cell M flows.

With the above arrangement, the potential difference and the forward current necessary for the memory operation occur are provided in the first cell M(320).

The cells, which are mutually adjacent in the direction of row with respect to the first cell M(320) and sharing the bit lines B(020) and B(030) with the first cell M(320), i.e., the second cell M(310) and the fourth cell M(330) have no potential difference (no voltage is applied) regardless of whether the select transistor 1209 is turned on or off and no current flows, consequently performing no memory operation.

The cell, which is adjacent to the first cell M(320) in the direction of column and not sharing the word line W(200) but sharing both the bit lines B(020) and B(030) with the first cell M(320), i.e., the third cell M(220) has no current flow necessary for the memory operation since the select transistor 1209 is off, consequently performing no memory operation.

The cell, which is adjacent to the first cell M(320) in the direction of column and sharing all of the bit lines B(020) and B(030) and the word line W(200) with the first cell M(320), i.e., the fifth cell M(420) has no current flow necessary for the memory operation but only a reverse current flows due to the rectifying function body 1201, consequently performing no memory operation.

In this memory device, memory cells are able to share the bit lines and the word lines and therefore makes it possible to reduce the number of interconnections and largely restrain an increase in the occupation area attributed to the interconnections.

FIGS. 15A through 15E show various possible structures of the memory cell that includes the memory element including the aforementioned memory function body and the rectifying function body constructed of a Schottky junction.

Figure 15A:
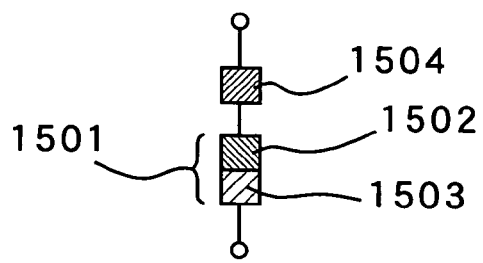
FIG. 15A is a view schematically showing a memory cell that includes the aforementioned memory element and a rectifying function body constructed of a Schottky junction.

FIG. 15A schematically shows a mode in which a memory function body 1504 (which has the same structure as that of the aforementioned memory function body 113) and a rectifying function body 1501 are electrically connected in series. The rectifying function body 1501 includes a Schottky junction constructed of a metal 1502 and an n-type semiconductor 1503.

Figure 15B:
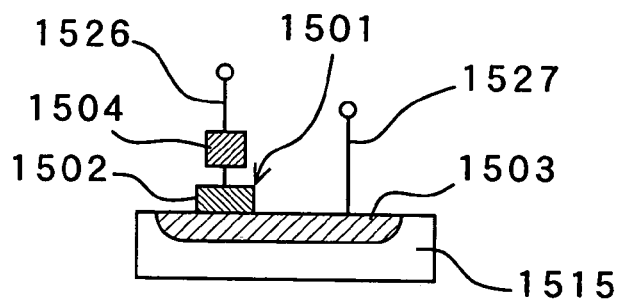
FIGS. 15B through 15E are views showing its concrete constructions.

FIG. 15B schematically shows a mode in which the rectifying function body 1501 in FIG. 15A is formed on a semiconductor substrate (e.g., silicon substrate) 1515. In this example, the n-type semiconductor region 1503 of the rectifying function body 1501 is formed by the implantation, diffusion and so on of impurities into the surface part of the semiconductor substrate 1515 by a well-known method. A metal 1502 is formed on the region, forming a Schottky junction between the metal 1502 and the n-type semiconductor 1503. A memory function body 1504 is provided on the metal 1502 via a contact 1526. The metal 1502 and the contact 1526 may be formed of the same material, and the number of processes can be reduced because of the needlessness of different processes, achieving excellent productivity.

Figure 15C:
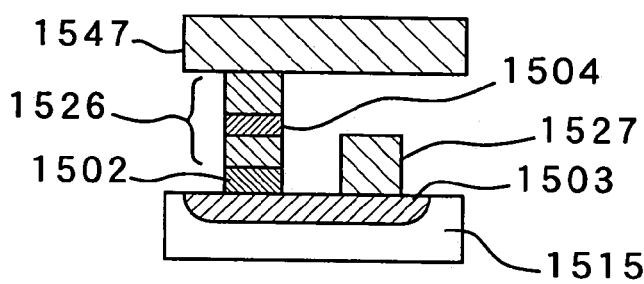
Figure 15D:
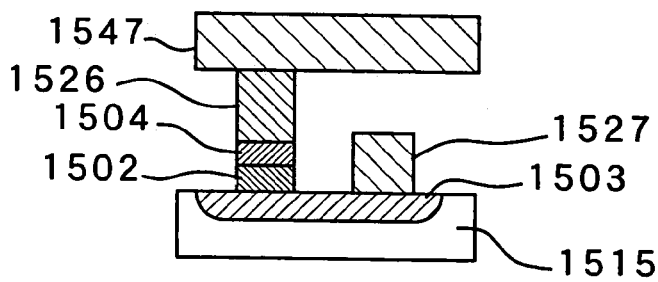

FIGS. 15C and 15D concretely show the arrangement of the memory function body 1504 in FIG. 15B. FIG. 15C shows an example in which the memory function body 1504 is provided partway in the contact 1526. FIG. 15D shows an example in which the memory function body 1504 is provided in contact with the metal 1502.

In this case, in order to form the Schottky junction between the metal and the semiconductor, the impurity concentration of the semiconductor (regardless of whether n-type or p-type) should preferably have a low concentration of, for example, less than $10^{18}/cm^3$. The above is because an ohmic junction is disadvantageously formed when the impurity concentration of the semiconductor is extremely high. Whether the semiconductor is made to have an n-type or p-type doping depends on which way the rectification direction is directed. For example, if the semiconductor is made to have an n-type doping, then the forward direction of the metal-to-n-type semiconductor Schottky junction is the direction directed from the metal to the n-type semiconductor. That is, electrons move from the n-type semiconductor toward the metal.

Figure 15E:
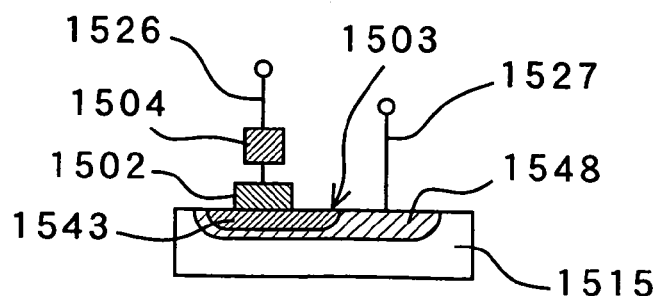

FIG. 15E shows a mode in which the aforementioned n-type semiconductor region 1503 is constructed of a lowly doped n-type semiconductor layer 1543 put in contact with the metal 1502 and a highly doped n-type semiconductor layer 1548 that surrounds the lowly doped n-type semiconductor layer 1543 and is in contact with a contact 1527. For example, the impurity concentration of the highly doped n-type semiconductor layer 1548 is assumed to exceed about $10^{20}/cm^3$. This is an example provided with a resistive semiconductor layer 1548. With this arrangement, a Schottky junction can be formed between the layer 1543 and the metal 1502, and an ohmic junction can be formed between the layer 1548 and the contact 1527. Moreover, the resistance of the n-type semiconductor region 1503 (highly doped n-type semiconductor layer 1548) can be reduced, making it possible to improve the operation speed and reduce power consumption.

In order to make an ohmic junction at the junction between the contact and the semiconductor layer, it is possible to use a method for increasing the impurity concentration of the semiconductor layer, a method for forming metallic silicide at the junction portion or the like.

FIGS. 16A through 16D show various structures in the case where a memory element including a memory function body and a rectifying function body constructed of a Schottky junction are included in each memory cell and the constituent elements are shared by two mutually adjacent memory cells. It is to be noted that contacts, which are expressed in a simplified style in FIGS. 16A through 16D, are formed by a well-known method.

Figure 16A:
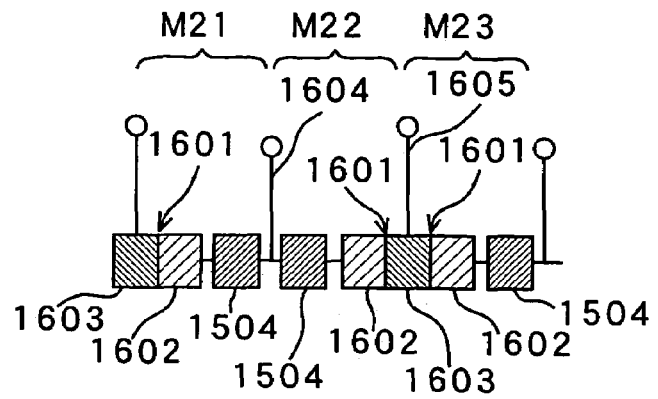
FIG. 16A is a view schematically showing the structure whose constituent elements are shared by mutually adjacent two memory cells that include a memory element and a rectifying function body constructed of a Schottky junction in each memory cell.

FIG. 16A schematically shows a mode in which memory cells M21, M22, M23, . . . including memory function bodies 1504 and rectifying function bodies 1601 are electrically connected in series. Mutually adjacent memory cells are symmetrically constructed. Each of the rectifying function bodies 1601 includes a Schottky junction constructed of an n-type semiconductor region 1602 and a metal layer 1603. A bit contact 1605 and a word contact 1604 are electrically connected to the metal layer 1603 and the memory function body 1504, respectively.

Figure 16B:
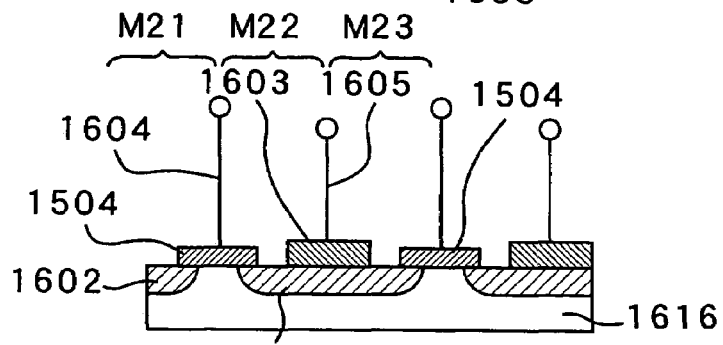
FIGS. 16B through 16D are views showing its concrete constructions.

FIG. 16B shows the cross-sectional structure of a memory device in which the aforementioned plurality of memory cells M21, M22, M23, . . . are integrated on a silicon substrate 1616. The n-type semiconductor regions 1602 and 1602 are formed mutually apart in a direction (transverse direction in FIG. 16) parallel to the substrate 1616 between mutually adjacent memory cells M21 and M22, and one memory function body 1504 and one word contact 1604 are formed over those n-type semiconductor regions 1602 and 1602. That is, the memory function body 1504 is formed integrally continuously in the transverse direction so as to be in contact with the two n-type semiconductor regions 1602 and 1602. The metal layer 1603 is integrally continuously formed between mutually adjacent memory cells M22 and M23, and one bit contact 1605 is formed on the layer 1603. If this arrangement is adopted, the occupation area per cell is reduced, and the degree of integration is increased.

In order to fabricate this memory device, an oxide film (not shown) is first formed on the surface of the silicon substrate 1616, and the memory function body 1504 is formed by the aforementioned method. Next, an n-type semiconductor region 1602 is formed by the implantation, diffusion and so on of impurities into the surface part of the silicon substrate 1616. At this time, no impurity is implanted into the region covered with the memory function body 1504. Next, a metal layer 1603 is formed so as to form a Schottky junction with the n-type semiconductor region 1602. Subsequently, contacts 1604 and 1605 are formed by a well-known method.

Figure 16C:
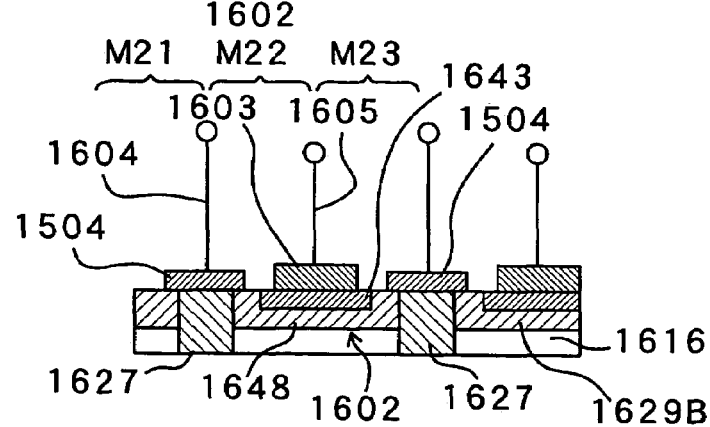

FIG. 16C shows a modification example of the memory device shown in FIG. 16B. In this modification example, an element isolation region 1627 is provided between the n-type semiconductor regions 1602 and 1602 of the mutually adjacent memory cells M21 and M22 by a well-known method. If this arrangement is adopted, the mutually adjacent memory cells M21 and M22 can reliably be electrically isolated from each other. Moreover, the n-type semiconductor region 1602 is constructed of a lowly doped n-type semiconductor layer 1643 put in contact with the metal layer 1603 and a highly doped n-type semiconductor layer 1648 that surrounds the lowly doped n-type semiconductor layer 1643 and is put in contact with the memory function body 1504. With this arrangement, the resistance of the n-type semiconductor region 1602 (highly doped n-type semiconductor layer 1648) can be reduced, making it possible to improve the operation speed and reduce power consumption.

Figure 16D:
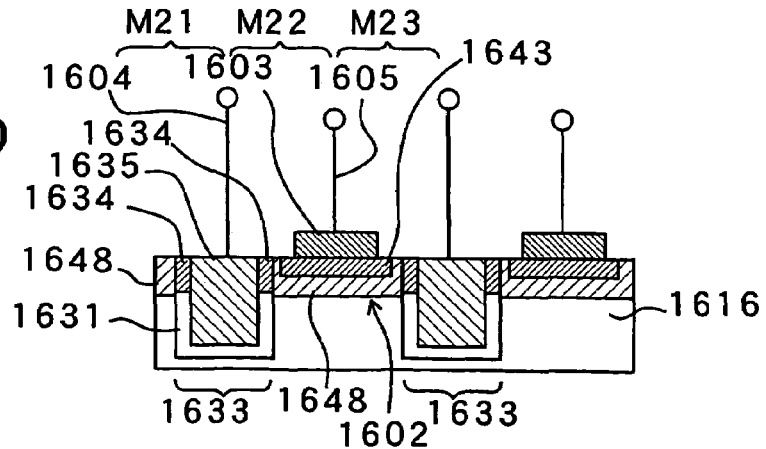

FIG. 16D shows a further modification example. In this modification example, a trench (groove) 1633 of a sectionally rectangular shape is provided between the n-type semiconductor regions 1602 and 1602 of the mutually adjacent memory cells M21 and M22 on the substrate 1616 by a well-known method. An insulation film 1631 is formed into a sectionally bracket-like shape along the substrate wall surfaces (inner walls of the trench) that define the trench 1633, and the inside of the insulation film 1631 is stuffed with a conductive substance (trench electrode) 1635 of, for example, polysilicon or metal. The trench electrode 1635 is electrically connected to the word contact 1604. Then, conductive particles are contained only in the region near the substrate top surface of the insulation film 1631, constituting a memory function body 1634. In this example, the memory function body 1634 reaches a depth approximately equal to the depth of the n-type semiconductor region 1602 from the substrate top surface. If this arrangement is adopted, the mutually adjacent two memory cells M21 and M22 can reliably be electrically isolated from each other. Moreover, similarly to FIG. 16C, the n-type semiconductor region 1602 is constructed of a lowly doped n-type semiconductor layer 1643 put in contact with the metal layer 1603 and the highly doped n-type semiconductor layer 1648 that surrounds the lowly doped n-type semiconductor layer 1643 and is put in contact with the memory function body 1634. With this arrangement, the resistance of the n-type semiconductor region 1602 (highly doped n-type semiconductor layer 1648) can be reduced, making it possible to improve the operation speed and reduce power consumption.

Figure 17A:
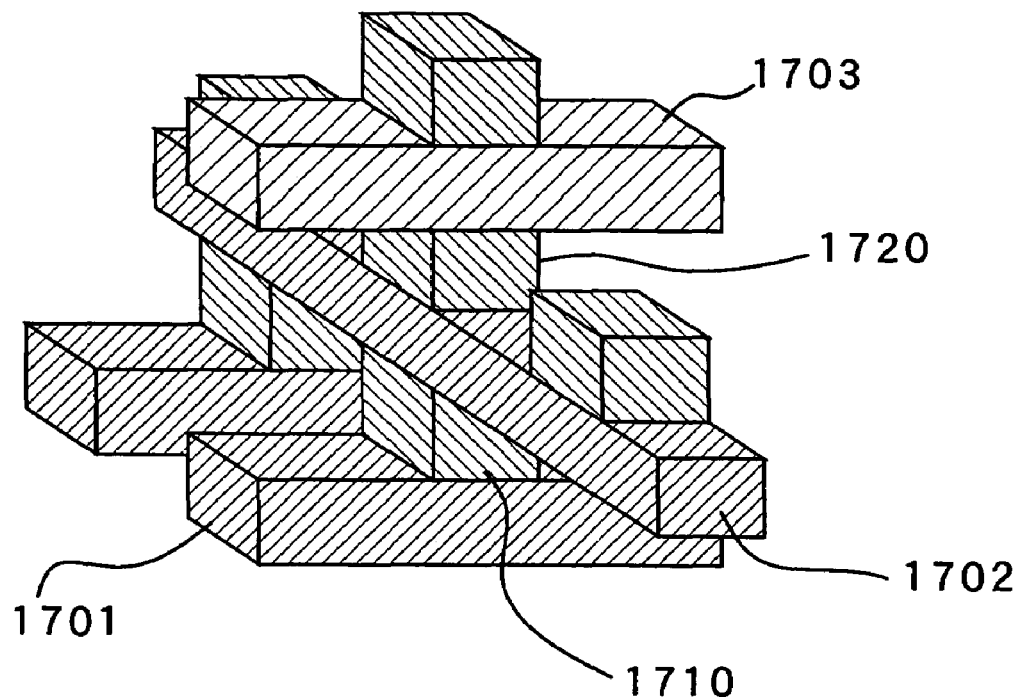
FIG. 17A is a view showing the three-dimensional spatial structure of a memory device in which a plurality of aforementioned memory elements are arranged in a direction perpendicular to a substrate.
Figure 17B:
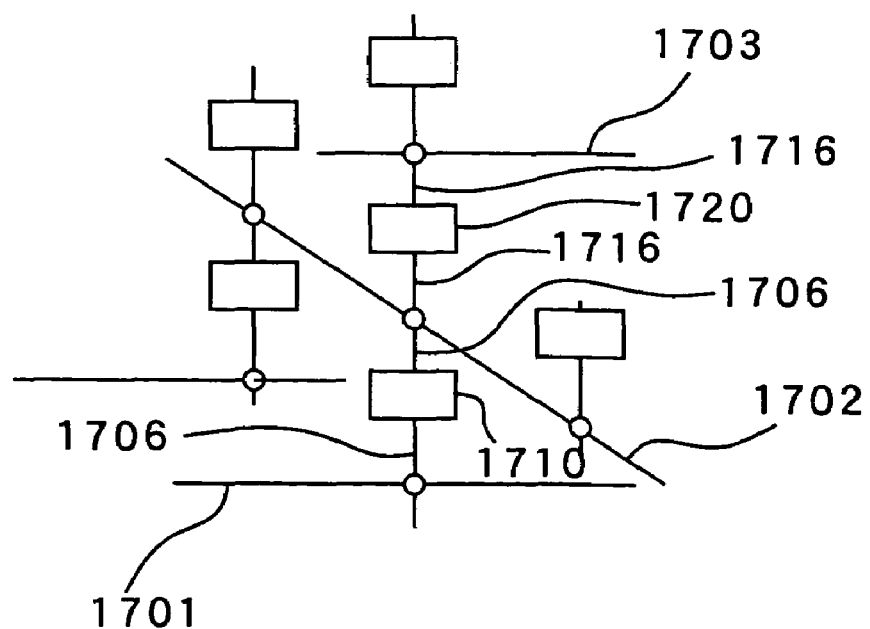
FIG. 17B is a view showing electrical connection of the constituent elements in FIG. 17A.

FIG. 17A is a view showing the three-dimensional spatial structure of a memory device in which a plurality of aforementioned memory function bodies 1710 and 1720 are arranged in a direction perpendicular to a substrate; FIG. 17B is a view showing electrical connection of the constituent elements in FIG. 17A. Interlayer insulation film is not depicted in FIG. 17A.

This memory device is provided with a plurality of interconnections 1701, 1702, 1703, . . . extended parallel to the substrate (not shown) at mutually different heights. A lower layer interconnection 1701 and an upper layer interconnection 1703 are parallel to each other, while an intermediate layer interconnection 1702 intersect these interconnections. A memory function body 1710 (which has the same structure as that of the aforementioned memory function body 113) is provided so as to be interposed between those interconnections 1701 and 1702 via a contact 1706 in a portion in which the interconnection 1701 and the interconnection 1702 intersect each other. With this arrangement, a memory cell is constructed in the portion in which the metal interconnection 1701 and the metal interconnection 1702 intersect each other. Likewise, a memory function body 1720 (which has the same structure as that of the aforementioned memory function body 113) is provided so as to be interposed between those interconnections 1702 and 1703 via a contact 1716 in a portion in which the interconnection 1702 and the interconnection 1703 intersect each other, constituting a memory cell. In other words, the memory function bodies 1710 and 1720 are provided so as to interpose or substitute the contacts 1706 and 1716.

In this structure of FIG. 17A, the memory function bodies 1710 and 1720 are three-dimensionally integrated, and therefore, it is possible to largely reduce the effective occupation area and increase the memory capacity.

Figure 18A:
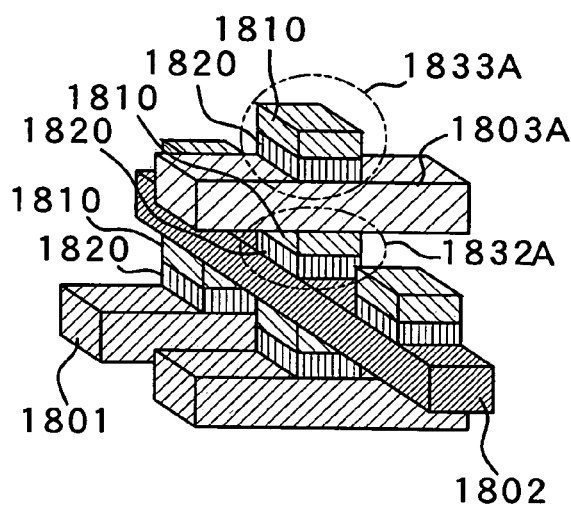
FIG. 18A is a view showing the three-dimensional spatial structure of a memory device in which a plurality of aforementioned memory elements and rectification function bodies are arranged in a direction perpendicular to the substrate.
Figure 18C:
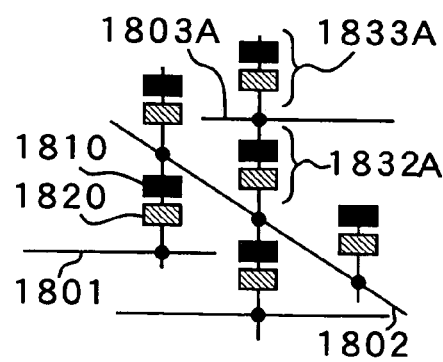
FIG. 18C is a view showing the electrical connection of the constituent elements in FIG. 18A.

FIG. 18A shows a memory device, which has a three-dimensional spatial structure of the aforementioned type and in which each memory cell includes a memory element including a memory function body and a rectifying function body. FIG. 18C shows the electrical connection of the constituent elements in FIG. 18A.

This memory device is provided with a plurality of metal interconnections 1801, 1802, 1803A, . . . extended at different heights from a top surface of a substrate (not shown). The lower layer metal interconnection 1801 and the upper layer metal interconnection 1803A are parallel to each other, and an intermediate layer metal interconnection 1802 intersects these interconnections 1801 and 1803A. A semiconductor 1820 is provided in a portion in which the metal interconnection 1801 and the metal interconnection 1802 intersect each other so as to form a Schottky junction in contact with the metal interconnection 1801. The metal interconnection 1801 and the semiconductor 1820 constitute a rectifying function body. A memory function body 1810 (which has the same structure as that of the aforementioned memory function body 113) is provided so as to be interposed between the semiconductor 1820 and the metal interconnection 1802 that constitute the rectifying function body (the semiconductor 1820 and the metal interconnection 1802 are electrically isolated from each other by the memory function body 1810). With this arrangement, a memory cell is constructed in a portion in which the metal interconnection 1801 and the metal interconnection 1802 intersect each other. Likewise, the semiconductor 1820 and the memory function body 1810 are provided in quite the same style in a portion in which the metal interconnection 1802 and the metal interconnection 1803A intersect each other, constituting a memory cell 1832A. Further, the semiconductor 1820 and the memory function body 1810 are provided in quite the same style in a portion in which the metal interconnection 1803A and a metal interconnection of its upper layer (not shown) intersect each other, constituting a memory cell 1833A.

Figure 18B:
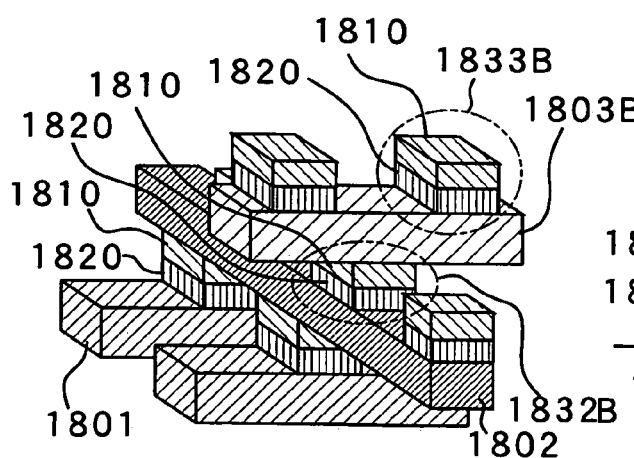
FIG. 18B is a view showing a modification example of the structure of FIG. 18A.
Figure 18D:
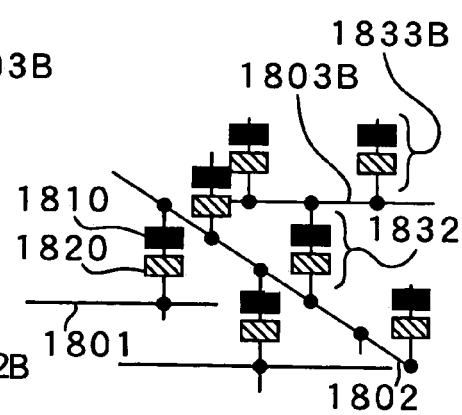
FIG. 18D is a view showing the electrical connection of the constituent elements in FIG. 18C.

FIG. 18B show a modification example of the memory device shown in FIG. 18A. In the structure of FIG. 18A, for example, the memory cells 1833A and 1832A arranged above and below the metal interconnection 1803A are arranged in a line in the vertical direction. In contrast to this, in the structure of this FIG. 18B, an upper layer metal interconnection 1803B is arranged displaced in the transverse direction (direction perpendicular to the lengthwise direction of this interconnection 1803B) with respect to the lower layer metal interconnection 1801. In addition, for example, a memory cell 1833B arranged upward with respect to the memory cell 1832B arranged below the metal interconnection 1803B, is arranged displaced in the lengthwise direction of this interconnection 1803B. As a result, in this structure of FIG. 18B, a spatial average distance between memory cells is greater than that of the structure of FIG. 18A. Therefore, mutual influence on the memory cells becomes less exerted, and the reliability of the memory is improved.

Next, a method for fabricating a memory device that has a three-dimensional spatial structure of the type shown in FIG. 18A will be described with reference to FIGS. 19A through 19J. FIGS. 19A, 19B, 19C, 19D and 19E show the states of an object in fabrication stages viewed from the same direction. FIGS. 19F, 19G, 19H, 19I and 19J show the states of the object of FIGS. 19A, 19B, 19C, 19D and 19E viewed from the right-hand side, respectively.

Figure 19A:
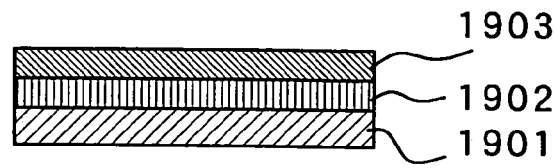
FIGS. 19A through 19J are views for explaining the fabrication method of the memory device that has the three-dimensional spatial structure of the type shown in FIG. 18A.
Figure 19B:
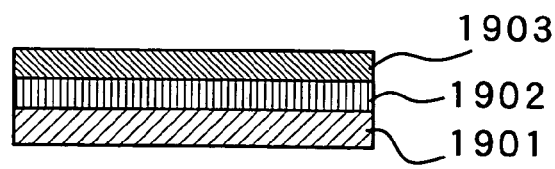
Figure 19C:
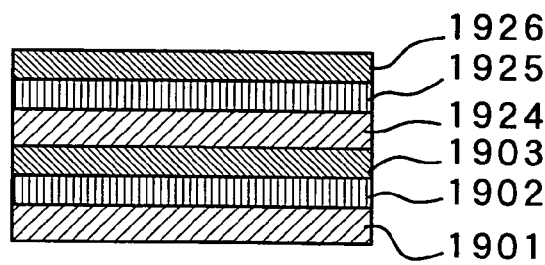
Figure 19D:
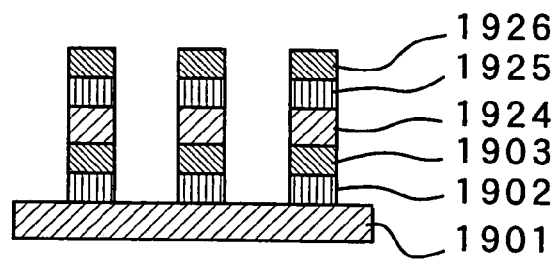
Figure 19E:
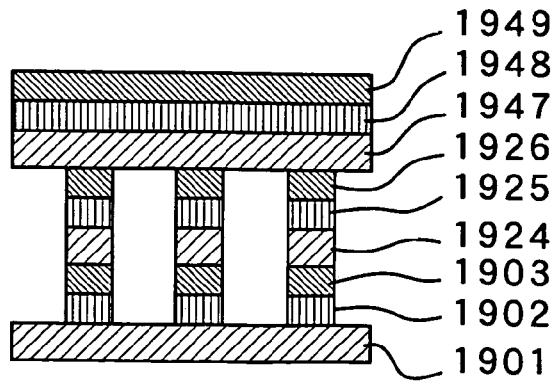
Figure 19F:
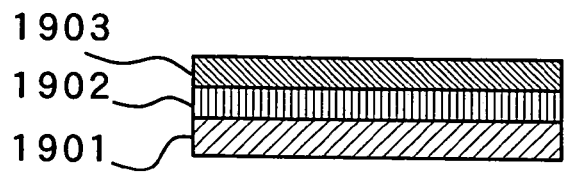

First of all, as shown in FIGS. 19A and 19F, a metal interconnection layer 1901, a semiconductor layer (e.g., polysilicon layer) 1902 for forming a Schottky junction with this metal interconnection layer and a memory function body layer 1903 are successively laminated in the whole area on a substrate (not shown). The memory function body layer 1903 is formed by forming, for example, a silicon oxide film and thereafter implanting ions of conductive particles in the silicon oxide film so as to provide the same structure as that of the aforementioned memory function body 113.

Figure 19G:
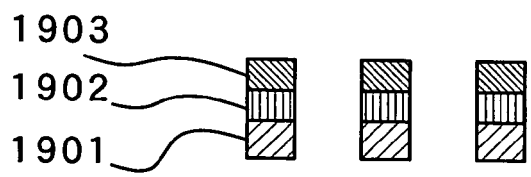

Next, as shown in FIGS. 19B and 19G, the layers 1903, 1902 and 1901 are collectively etched and processed into a linear pattern extended in one direction. If the etching is collectively effected as described above, then the process can be simplified than when the etching is repeated for each of the layers 1903, 1902 and 1901. It is to be noted that an interlayer insulation film (not shown) of, for example, silicon oxide is deposited in the whole area after this etching, and the surface is flattened by a CMP (Chemical-Mechanical Polishing) method.

Figure 19H:
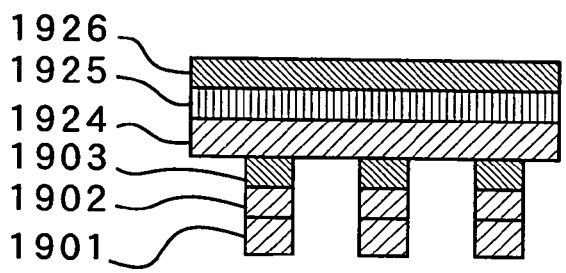

Next, as shown in FIGS. 19C and 19H, a metal interconnection layer 1924, a semiconductor layer 1925 for forming a Schottky junction with this metal interconnection layer and a memory function body layer 1926 are successively repetitively laminated in the whole area on this film.

Figure 19I:
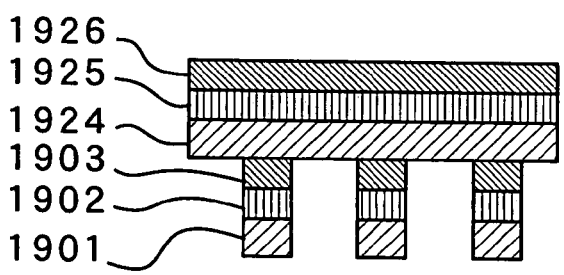

Next, as shown in FIGS. 19D and 19I, the layers 1924, 1925 and 1926 are collectively etched to carry out pattern processing in a linear form extended crosswise roughly perpendicularly to the direction in which the layers 1903, 1902 and 1901 are extended. If the etching is collectively effected as described above, then the process can be simplified than when the etching is repeated for each of the layers 1924, 1925 and 1926. In this stage, a first layer memory cell, which includes the semiconductor layer 1902 and the memory function body 1903 that have undergone the pattern processing, is formed in a portion in which the lower layer metal interconnection 1901 and the metal interconnection 1924 on it intersect each other. After this etching, an interlayer insulation film (not shown) of, for example, silicon oxide is deposited again in the whole area, and the surface is flattened by the CMP method.

Figure 19J:
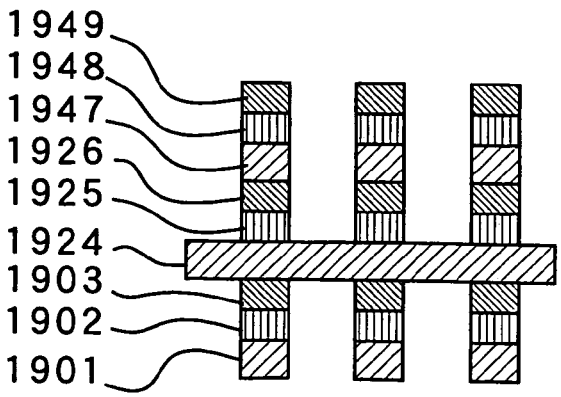

Subsequently, as shown in FIGS. 19E and 19J, the deposition and collective etching of a metal layer 1947 to be a metal interconnection, a semiconductor layer 1948 and a memory function body layer 1949 are repeated in a similar manner. In this stage, a second layer memory cell, which includes the semiconductor layer 1925 and the memory function body 1926 that have undergone the pattern processing, is formed in a portion in which the metal interconnection 1924 and the metal interconnection 1947 on it intersect each other.

By thus repeating the deposition and collective etching of the metal layer, the semiconductor layer and the memory function body layer, a memory device that has a three-dimensional spatial structure can be fabricated.

It is to be noted that a third layer memory cell, which includes the semiconductor layer 1948 and the memory function body layer 1949 that have undergone the pattern processing, is formed by the next collective etching.

As already described hereinabove, the memory function body is basically an insulator although it contains conductive particles. Therefore, the remaining portion to which no effective voltage is applied in the memory function body performs no memory operation.

Figure 20A:
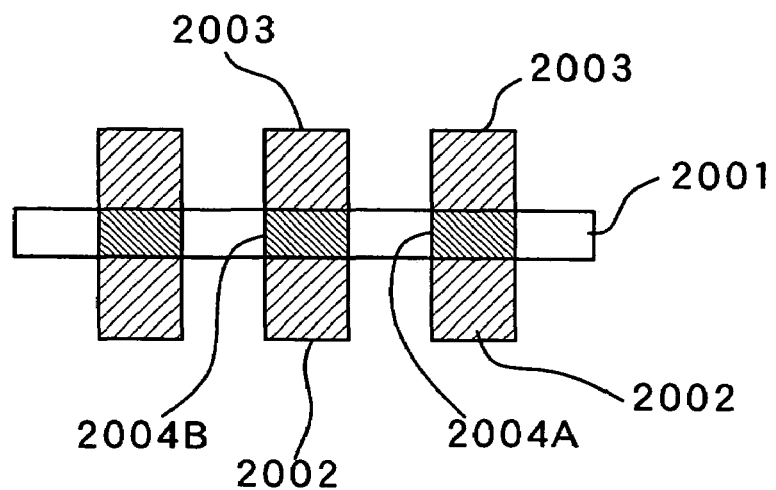
FIGS. 20A and 20B are views for explaining the regions that perform memory operation in a memory function body layer.

For example, as shown in FIG. 20A, it is assumed that a pair of upper and lower electrodes 2003, 2002; 2003, 2002; . . . arranged with interposition of a memory function body layer 2001 are arranged mutually apart in the layer direction (transverse direction in FIG. 20A). In this case, if a voltage is applied to, for example, the pair of electrode 2003 and 2002 located at the right-hand end, the region that performs the memory operation in the memory function body layer 2001 is limited to the neighborhood of a region 2004A between the pair of electrodes 2003 and 2002 located at the right-hand end. Therefore, a region 2004B between the pair of the central electrodes 2003 and 2002 to which no voltage is applied causes no malfunction.

Figure 20B:
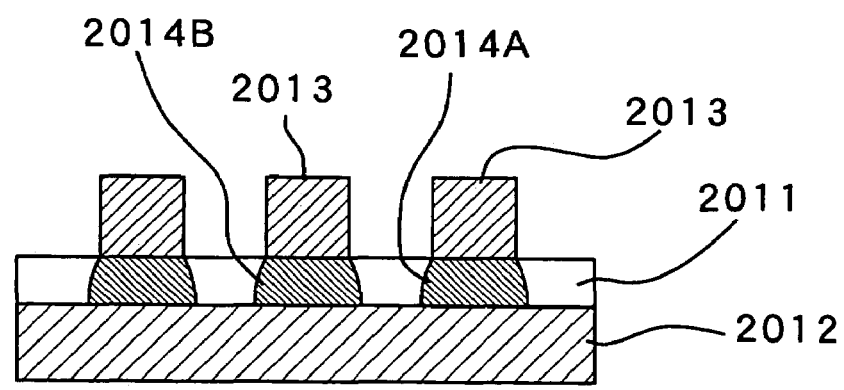

Moreover, as shown in FIG. 20B, it is assumed that an interconnection layer 2012 is formed extended in the transverse direction under a memory function body layer 2011, and interconnection layers 2013, 2013, . . . extended in the depthwise direction (direction perpendicular to the sheet plane of FIG. 20) are arranged mutually apart on the memory function body layer 2011. Also, in this case, when a voltage is applied across, for example, the interconnection layer 2012 and the interconnection layer 2013 located at the right-hand end, the region that performs the memory operation in the memory function body layer 2011 is limited to the neighborhood of a region 2014A in which those interconnection layers 2012 and 2013 intersect each other. Therefore, a region 2014B interposed between the interconnection layer 2012 and the central interconnection layer 2013 causes no malfunction.

As described above, the remaining portion to which no effective voltage is applied in the memory function body layer performs no memory operation. Therefore, it is possible to put the memory function body layer into an integrated continuous state without being divided into memory cells. If the above arrangement is adopted, it is possible to prevent damage due to etching from being given to the region that performs the memory operation and improve the reliability of the memory.

A method for fabricating the memory function body layer integrally continuously in the layer direction in fabricating a memory that has a three-dimensional spatial structure will be described next. FIGS. 21A, 21B, 21C, 21D and 21E show the states of an object in fabrication stages viewed from the same direction. FIGS. 21F, 21G, 21H, 21I and 21J show the states of the object of FIGS. 21A, 21B, 21C, 21D and 21E viewed from the right-hand side, respectively.

Figure 21A:
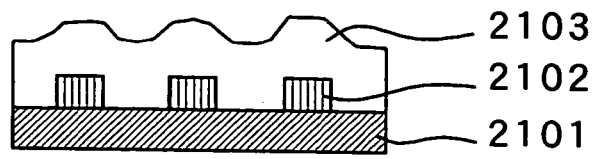
FIGS. 21A through 21J are views for explaining a fabrication method for forming a memory device that has a three-dimensional spatial structure into a state in which they are integrally continuous in the layer laminating direction.
Figure 21B:
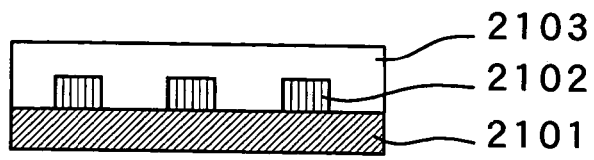
Figure 21C:
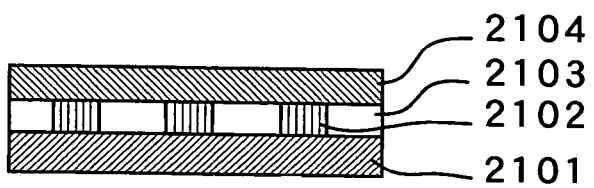
Figure 21D:
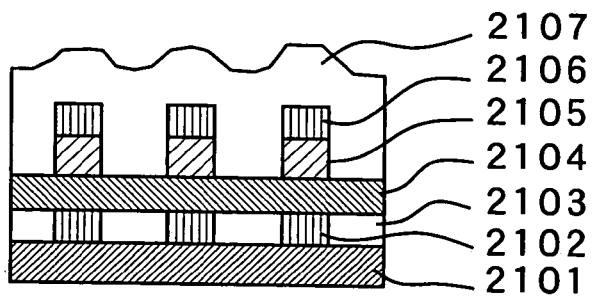
Figure 21E:
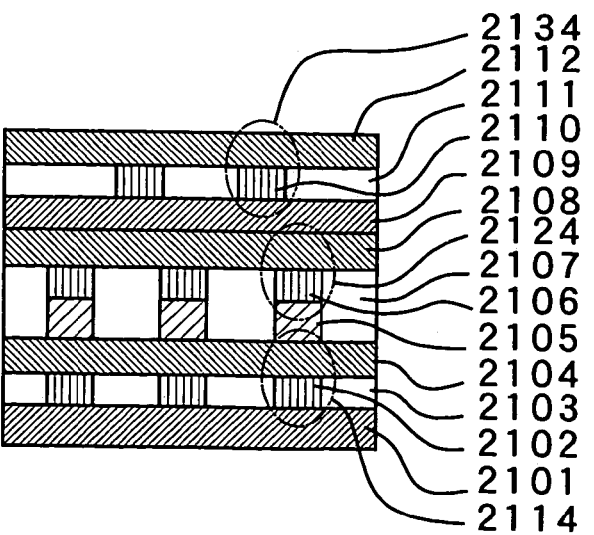
Figure 21F:
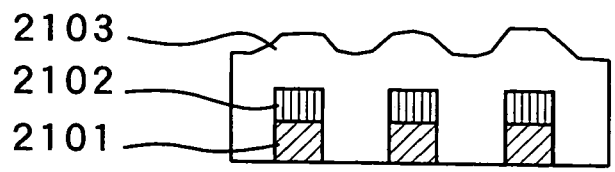
Figure 21G:
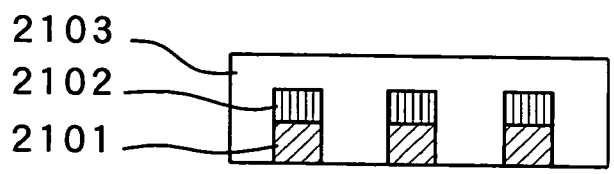

First of all, as shown in FIGS. 21A and 21F, a metal interconnection layer 2101 and a semiconductor layer (e.g., polysilicon layer) 2102 for forming a Schottky junction with the metal interconnection layer 2101 are successively laminated in the whole area on a substrate (not shown). These layers 2102 and 2101 are collectively etched and patterned into a linear form extended in one direction. Further, the semiconductor layer 2102 is etched and separated every memory cell. After this etching, an insulator layer 2103, which should become an interlayer insulation film of, for example, silicon oxide, is deposited to a sufficient thickness in the whole area, and the surface is flattened by the CMP method as shown in FIGS. 21B and 21G. This flattening is effected not until the upper surface of the semiconductor layer 2102 is exposed but until the thickness of the insulator layer 2103 on the semiconductor layer 2102 becomes equivalent to the thickness of the memory function body layer to be formed in the next process.

Figure 21H:
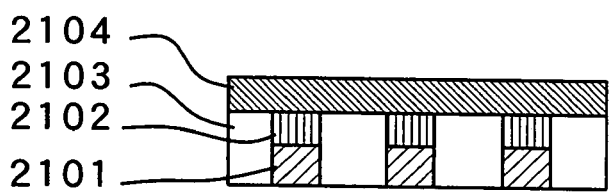

Next, as shown in FIGS. 21C and 21H, ions of conductive particles are implanted in the region above the upper surface of the semiconductor layer 2102 in the insulator layer 2103, forming a memory function body layer 2104. The memory function body layer 2104 has the same structure as that of the aforementioned memory function body 113 and is formed into a state in which it is put in contact with the semiconductor layer 2102 and extended integrally continuously in the layer direction in the whole area on the substrate.

Figure 21I:
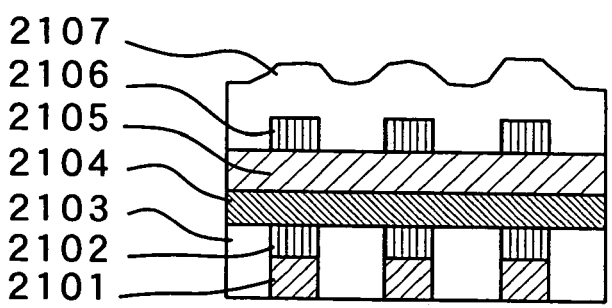
Figure 21J:
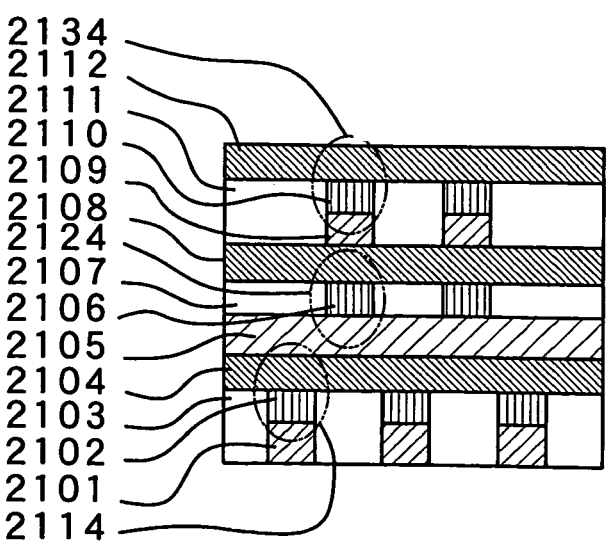

Next, as shown in FIGS. 21D and 21I, a metal interconnection layer 2105 and a semiconductor layer 2106 for forming a Schottky junction with this metal interconnection layer are successively laminated again in the whole area. These layers 2106 and 2105 are collectively etched and patterned into a liner form extended crosswise roughly perpendicularly to the direction in which the metal layer 2101 is extended. Further, the semiconductor layer 2106 is etched and separated every memory cell. After this etching, an insulator layer 2107, which should become an interlayer insulation film of, for example, silicon oxide, is deposited to a sufficient thickness in the whole area, and the surface is flattened by the CMP method as shown in FIGS. 21E and 21J. This flattening is effected not until the upper surface of the semiconductor layer 2106 is exposed but until the thickness of the insulator layer 2107 on the semiconductor layer 2106 becomes equivalent to the thickness of the memory function body layer to be formed in the next process.

Subsequently, by repeating similar processes, a three-dimension spatial structure as shown in FIGS. 21E and 21J is obtained. FIGS. 21E and 21J show a state in which the three sets of the metal interconnection layer, the semiconductor layer and the memory function body layer are laminated. In the figures, there are shown a memory function body layer 2108, a metal interconnection layer 2109, a semiconductor layer 2110, an interlayer insulation film (insulator layer) 2111 and a memory function body layer 2112.

In this structure, as is apparent from FIG. 21E, the memory cell 2134, which is arranged on the metal interconnection 2109, is displaced in the lengthwise direction of the interconnection 2109 with respect to, for example, the memory cell 2124 arranged below the metal interconnection 2109. Moreover, as is apparent from FIG. 21J, the memory cell 2124, which is arranged on the metal interconnection 2105, is displaced in the lengthwise direction of the interconnection 2105 with respect to, for example, the memory cell 2114 arranged below the metal interconnection 2105. As a result, in this structure, a spatial average distance between the memory cells is made greater than in the case where the memory cells are arranged in a line in the vertical direction. Therefore, mutual influence on the memory cells becomes less exerted, and the reliability of the memory device is improved.

Figure 22B:
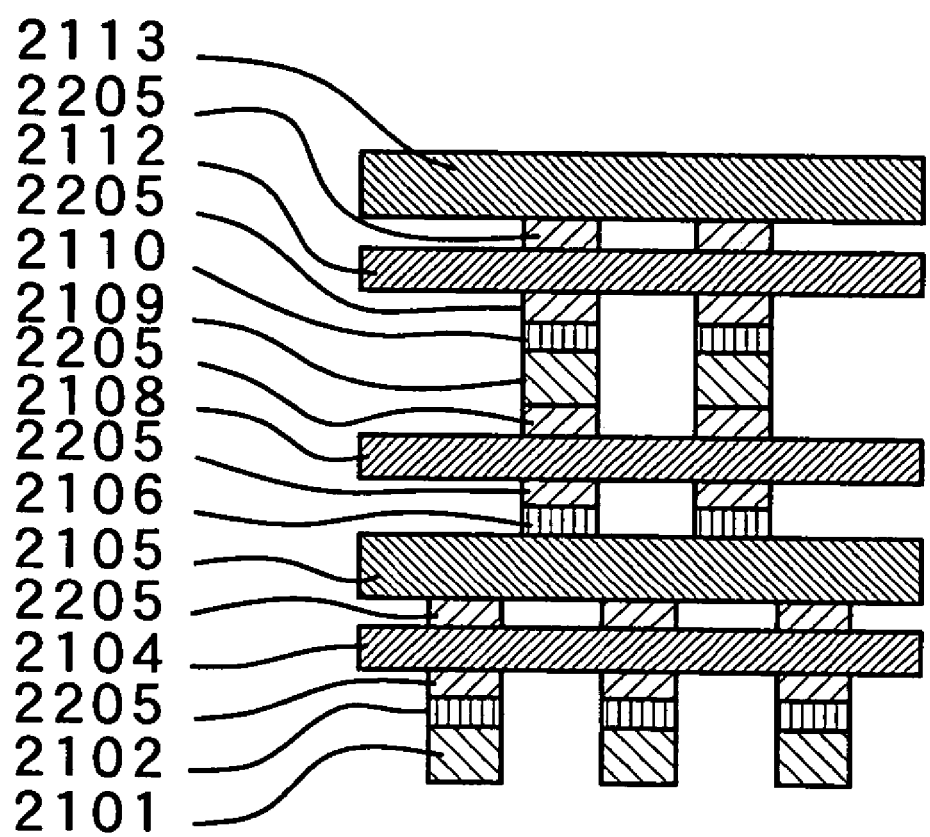

FIGS. 22A and 22B show a modification example of the structure shown in FIGS. 21E and 21J. FIG. 22B shows a state in which the object of FIG. 22A is viewed from the right-hand side.

In this modification example, contact 2205 is provided between the memory function body layer 2104 and both the metal interconnection layer 2105 and the semiconductor layer 2102, that is, the contact 2205 is located above and below the memory function body layer 2104. In the same way, contact 2205 is provided between the memory function body layer 2108 and both the metal interconnection layer 2109 and the semiconductor layer 2106. In the same way, contact 2205 is provided between the memory function body layer 2112 and both the metal interconnection layer 2113 and the semiconductor layer 2110.

It is a matter of course that a structure in which the memory function body layer is separated into memory cells can be employed in FIGS. 21E, 21J, 22A and 22B.

Figure 23A:
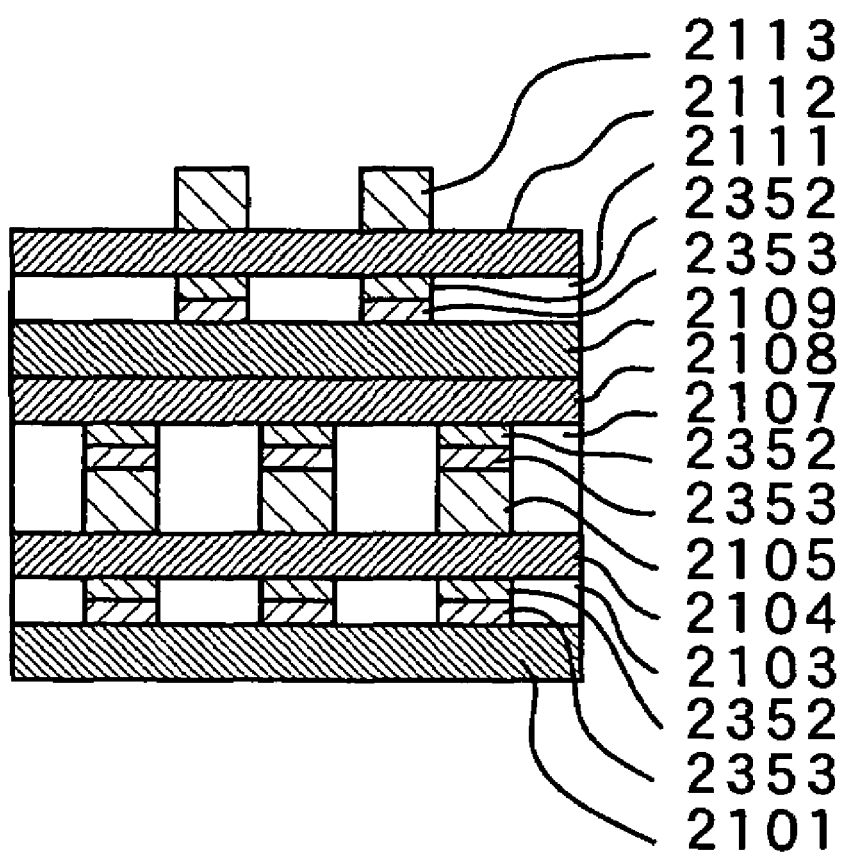
FIGS. 23A and 23B are views showing modification examples of the structure shown in FIGS. 22A and 22B.
Figure 23B:
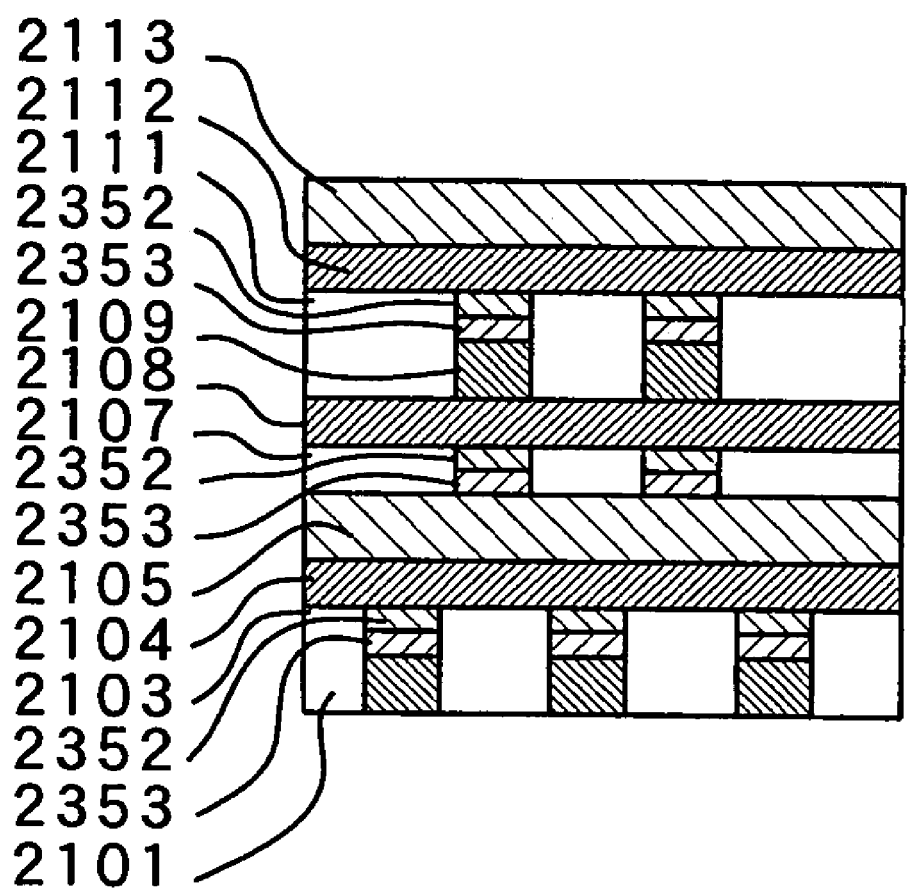

FIGS. 23A and 23B show another modification example of the structure shown in FIGS. 21E and 21J. FIG. 23B shows a state in which the object of FIG. 23A is viewed from the right-hand side.

In this modification example, a rectifying function body constructed of a pn junction is provided in place of the rectifying function body constructed of the Schottky junction. That is, a pair of p-type semiconductor layer 2353 and an n-type semiconductor layer 2352, which constitute a pn junction, is provided between the metal interconnection layer 2101 and the memory function body layer 2104. In the same way, a pair of p-type semiconductor layer 2353 and an n-type semiconductor layer 2352 is provided between the metal interconnection layer 2105 and the memory function body layer 2108. In the same way, a pair of p-type semiconductor layer 2353 and an n-type semiconductor layer 2352 is provided between the metal interconnection layer 2109 and the memory function body layer 2112.

It is acceptable to interchange the positions of the p-type semiconductor layer and the n-type semiconductor layer. By interchanging the positions of the p-type with the n-type, the direction of rectification can be reversed.

The structure of FIGS. 23A and 23B can be fabricated through processes similar to those of the example of FIGS. 22A and 22B except for the process for constructing two layers of the p-type semiconductor layer and the n-type semiconductor layer.

In general, the barrier height of the pn junction diode can be adjusted by changing impurity concentration more easily than that of the Schottky junction diode. Therefore, when the rectifying function body constructed of the pn junction is employed in place of the rectifying function body constructed of the Schottky junction, the characteristics of the rectifying function body can easily be adjusted and excellent in generality. For example, if the barrier height is adjusted, then the amount of current that flows at a constant voltage or the capacitance can be changed, and the memory operation voltage can easily be adjusted.

Figure 24A:
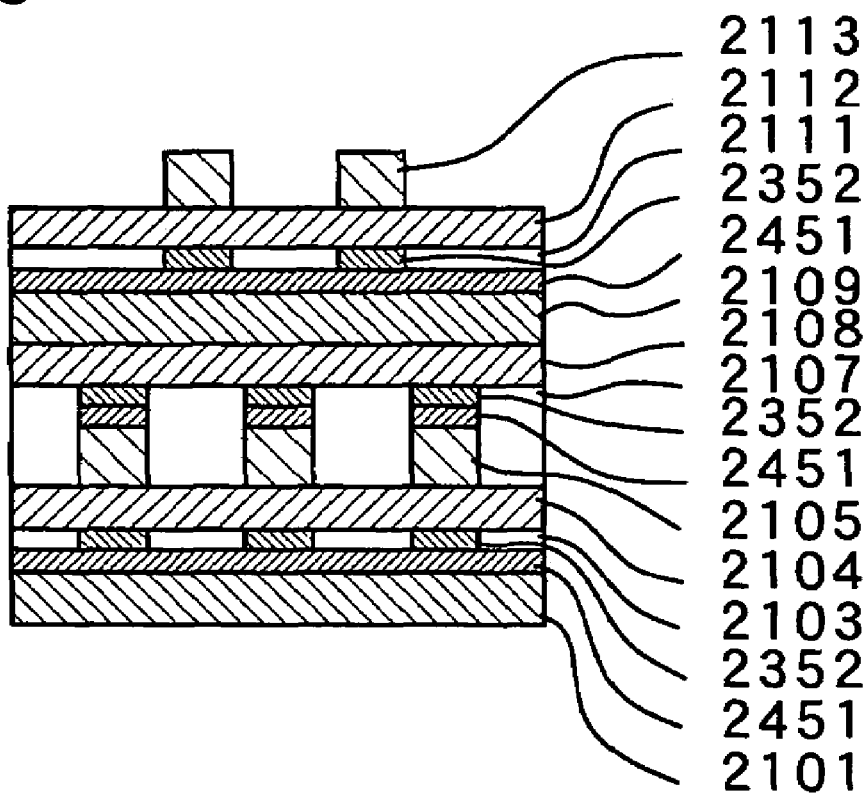
FIGS. 24A and 24B are views showing modification examples of the structure shown in FIGS. 23A and 23B.
Figure 24B:
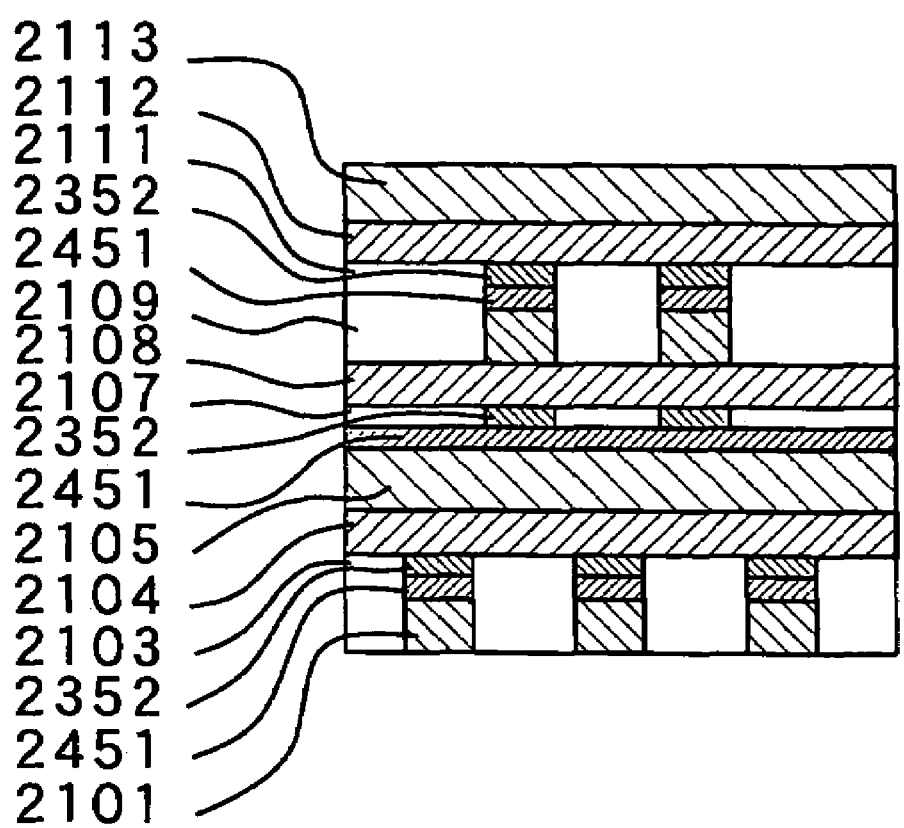

FIGS. 24A and 24B show a modification example of the structure shown in FIGS. 23A and 23B. FIG. 24B shows a state in which the object of FIG. 24A is viewed from the right-hand side.

In this modification example, a semiconductor layer 2451, which is put in contact with a metal interconnection layer out of the two semiconductor layers that constitute a pn junction as a rectifying function body, is extended in a linear form along the metal interconnection layer. That is, the semiconductor layers 2451, 2451 and 2451, which are put in contact with the metal interconnection layers 2101, 2105 and 2109, respectively, are not separated every memory cell but processed into the same patterns as those of the metal interconnection layers 2101, 2105 and 2109, respectively.

Since the semiconductor layer has a resistance higher than that of metal, it is more preferable that the semiconductor layer is extended in a linear form along, for example, the metal interconnection layer that constitutes the bit line like the structure of FIGS. 24A and 24B than when separated every memory cell. With this arrangement, it is possible to effectively reduce the resistance by making the semiconductor layer 2451 shared by at least two memory cells.

Figure 25A:
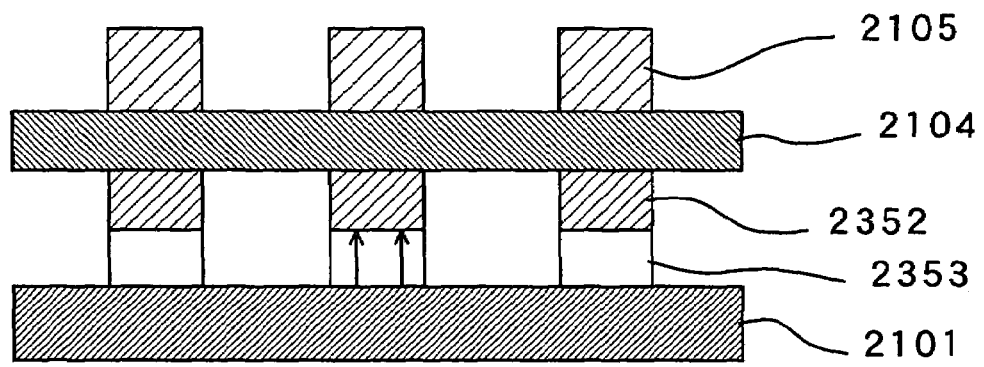
FIG. 25A is a view showing the current path of the structure shown in FIGS. 23A and 23B.
Figure 25B:
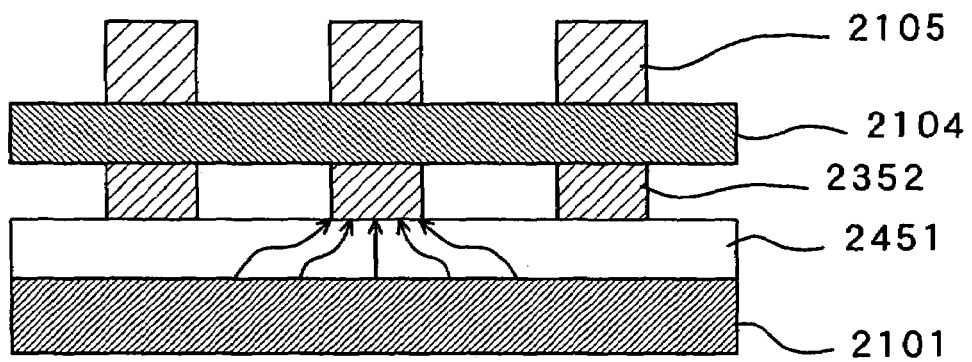
FIG. 25B is a view showing the current path of the structure shown in FIGS. 24A and 24B.

In detail, the semiconductor layer 2353 is separated every memory cell in the structure shown in FIGS. 23A and 23B. Therefore, the position of the path of the current flowing from the metal interconnection 2101 to the memory function body 2104 is limited to the inside of the pattern of each individual semiconductor layer 2353 as indicated by arrow in FIG. 25A. In contrast to this, in the structure shown in FIGS. 24A and 24B, the position of the path of the current flowing from the metal interconnection 2101 to the memory function body 2104 expands in a direction along the metal interconnection 2101 as indicated by arrow in FIG. 25B. Therefore, the effective cross-section area of the interconnection increases to reduce the resistance. This consequently enables the high-speed operation of the memory.

It is a matter of course that the effect of the semiconductor layer 2451 extended in a linear form along the metal interconnection layer is taken not only in the case where the memory function body 2504 is extended integrally continuously in the layer direction but also in the case where the memory function body 2504 is separated every memory cell.

Figure 26A:
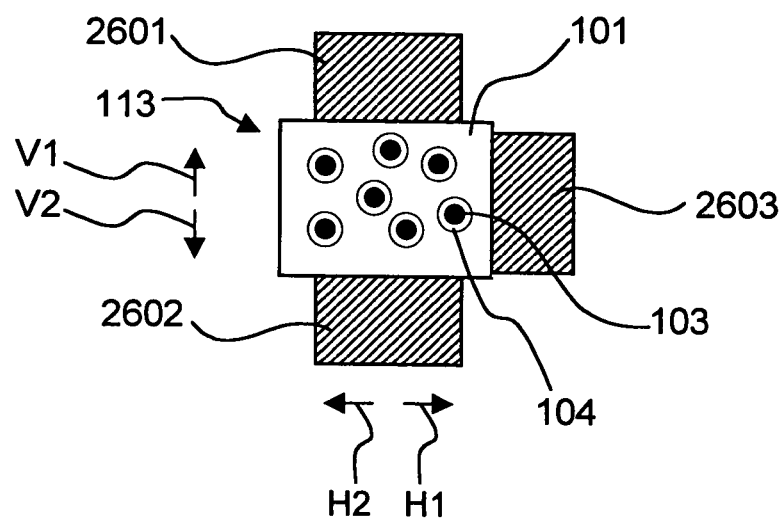
FIG. 26A is a view showing the schematic cross section of a memory element of one embodiment of the present invention.
Figure 26B:
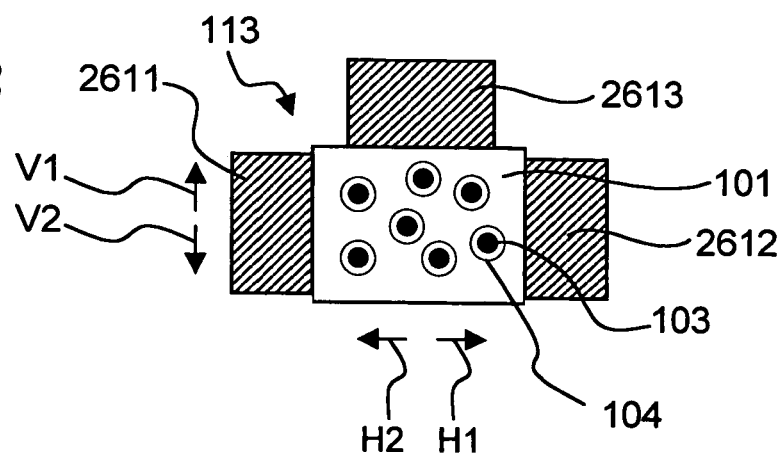
FIG. 26B is a view showing an example whose electrode arrangement is different from that of FIG. 26A.

FIGS. 26A and 26B show examples of the memory elements in which a third electrode 2603 is adjacent to the memory function body 113 provided between the first electrode 2601 and the second electrode 2602 from a direction H1 (this is called the "layer direction") perpendicular to directions V1 and V2 in which the first electrode 2601 and the second electrode 2602 are opposed to each other. That is, the third electrode 2603 can apply a voltage to the memory function body 113 in a position between the first electrode 2601 and the second electrode 2602 in the direction in which the first electrode 2601 and the second electrode 2602 are opposed to each other. The memory function body 113 (silicon oxide film 101) is interposed between the first electrode 2601 and the second electrode 2602 in the thickness directions V1 and V2. In contrast to this, in the example of FIG. 26B, the electrode arrangement with respect to the memory function body 113 is different, so that the memory function body 113 is interposed between a first electrode 2611 and a second electrode 2612 in the layer directions H1 and H2, and a third electrode 2613 is adjacent to the memory function body 113 in the thickness direction V1.

In the memory element of FIG. 26A, by grounding the second electrode 2602 and applying a voltage to the first electrode 2601, there was observed a current that flowed between those electrodes 2601 and 2602. Moreover, in the memory element of FIG. 26B, by grounding the second electrode 2612 and applying a voltage to the first electrode 2611, there was observed a current that flowed between those electrodes 2611 and 2612. In either of the above cases, the observation was carried out when the third electrode 2603 was grounded and when a voltage was applied to the third electrode 2603 and 2613.

Under the condition that the third electrodes 2603 and 2613 were grounded, there was observed a difference in the current-to-voltage (I–V) characteristic between the memory element of FIG. 26A and the memory element of FIG. 26B, whereas a hysteresis characteristic appeared in either of the above cases. Under the condition that the voltage was applied to the third electrodes 2603 and 2613, it was discovered that the width of the memory window (hysteresis) increased in either of the above cases in comparison with the case where the third electrodes 2603 and 2613 were grounded. This means that the memory function is improved when the voltage is applied to the third electrodes 2603 and 2613. With this arrangement, read errors in reading the storage state are reduced, and the reliability of the memory element is improved.

FIGS. 27A through 27E show a method for fabricating a memory element that has an electrode arrangement of the type shown in FIG. 26B on the surface of a semiconductor substrate.

Figure 27A:
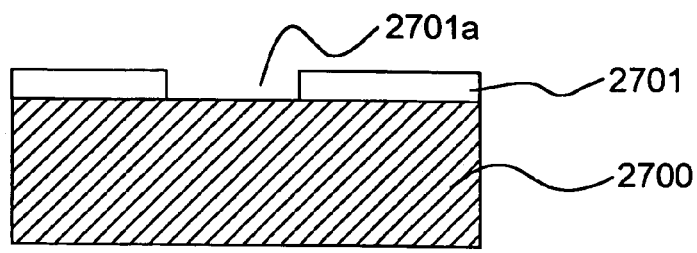
FIGS. 27A through 27E are views for explaining the fabrication method of a memory element that has the electrode arrangement of the type of FIG. 26B.
Figure 27B:
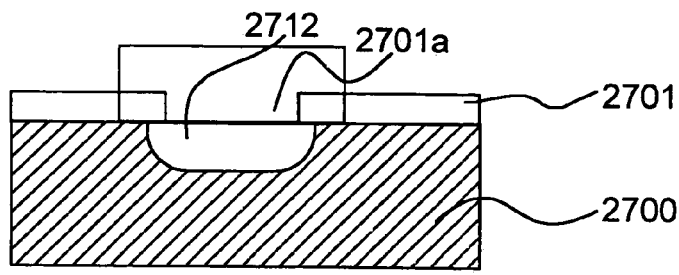

First of all, as shown in FIG. 27A, a silicon nitride film 2701 is deposited as a mask for oxidation on a semiconductor substrate of, for example, a silicon substrate 2700, and an opening 2701a is formed in a prescribed region of this silicon nitride film. Then, as shown in FIG. 27B, a silicon oxide film 2712 as an insulator is formed in a superficial region (region in which the memory function body should be formed) of the silicon substrate 2700 by oxidizing the silicon substrate 2700 from its surface through the opening 2701a similarly to the ordinary element isolation process.

Figure 27C:
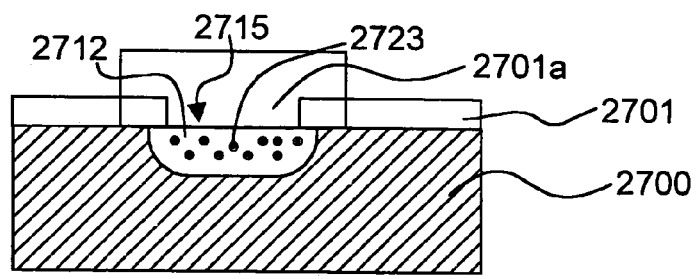

Next, as shown in FIG. 27C, ion implantation of a semiconductor or a metal is effected in the silicon oxide film 2712, forming conductive particles 2723 in the silicon oxide film 2712. In this example, silver was introduced into the silicon oxide film 2712 by the negative ion implantation method similarly to the aforementioned method. In this example, heat treatment was further carried out. This heat treatment, which can also be eliminated, should preferably be carried out. This is because the particle diameter and the distribution of the conductive particles 2723 can be adjusted, and the recovery of implantation defects and so on can be achieved if heat treatment is carried out. As described above, a memory function body 2715, which has the same structure as that of the aforementioned memory function body 113, is formed.

Figure 27D:
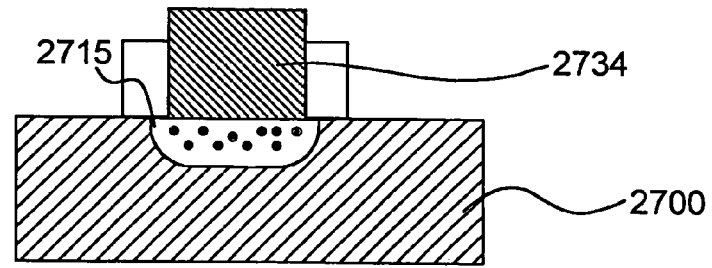

Next, as shown in FIG. 27D, a gate electrode 2734 is formed as a third electrode on the memory function body 2715 by a method similar to that of the formation of the gate electrode of the well-known MOS transistor. In this case, it is preferable to form the gate electrode 2734 with the silicon nitride film 2701 left. This is because the manufacturing variation is consequently reduced since the positional relation between the gate electrode 2734 and the memory function body 2715 is determined in a self-aligning manner.

Figure 27E:
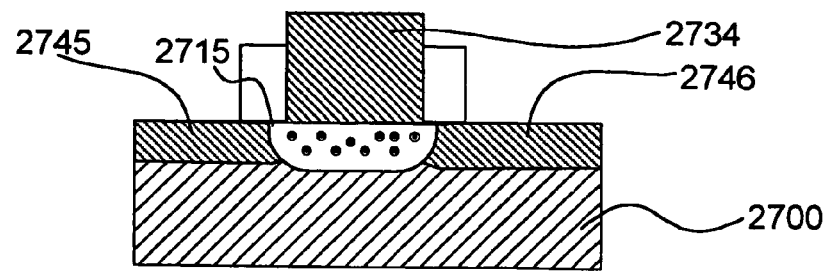

After removing the silicon nitride film 2701, a source region 2745 and a drain region 2746 as first and second electrodes are formed so as to place the memory function body 2715 therebetween from both sides in the layer direction (transverse direction in FIG. 27E) by implanting impurity ions into the surface of the semiconductor substrate 2700 with the gate electrode 2734 served as a mask as shown in FIG. 27E.

The memory element, which has the electrode arrangement of the type shown in FIG. 26B, can be thus fabricated on the surface of the semiconductor substrate 2700. In the fabricated memory element, the magnitude of the current that flows through the memory function body 2715 is changed before and after a prescribed voltage is applied across the source region 2745 and the drain region 2746, and the storage state (written state or erased state) is discriminated according to the magnitude of the current.

Figure 28A:
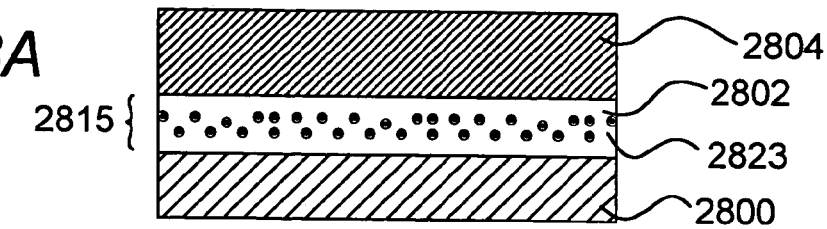
FIGS. 28A through 28E are views for explaining another fabrication method of a memory element that has the electrode arrangement of the type of FIG. 26B.

FIGS. 28A through 15E show another method for fabricating a memory element that has the electrode arrangement of the type shown in FIG. 26B on the surface of a semiconductor substrate.

First of all, as shown in FIG. 28A, a silicon oxide film 2802 is formed on a silicon substrate 2800 by thermal oxidation. Subsequently, similarly to the aforementioned method, silver ions are introduced into the silicon oxide film 2802 by the negative ion implantation method, forming a memory function body 2815 in a layer form including conductive particles 2823 in the silicon oxide film 2802. Subsequently, a substance for forming a third electrode of, for example, polysilicon 2804 is deposited in the whole area on the memory function body 2815.

Figure 28B:
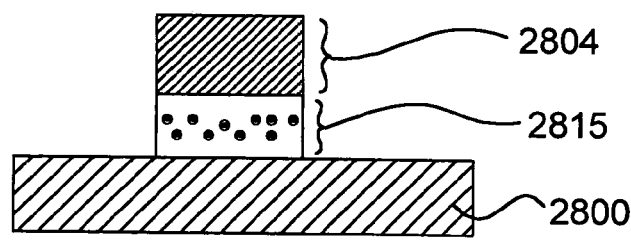

Next, as shown in FIG. 28B, a gate electrode 2804 (denoted by the same reference numerals as those of the aforementioned polysilicon for the sake of easy understanding) as a third electrode is formed on the memory function body 2815 by a method similar to that of the pattern formation of the gate electrode of the well-known MOS transistor.

Figure 28C:
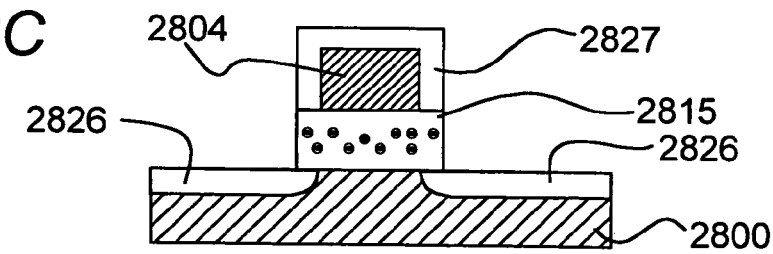

Next, as shown in FIG. 28C, oxidation is carried out to form a silicon oxide film 2826 on the surface of the silicon substrate 2800, and a silicon oxide film 2827 is formed on the surface of the gate electrode 2804.

Figure 28D:
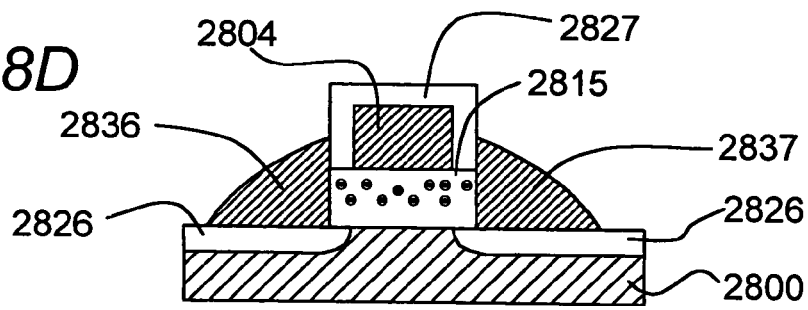

Next, as shown in FIG. 28D, polysilicon sidewalls 2836 and 2837 as the first and second electrodes are formed so as to place the memory function body 2815 therebetween from both sides in the layer direction (transverse direction in FIG. 28E) by using a well-known method. The polysilicon sidewalls 2836 and 2837 are electrically insulated with respect to the silicon substrate 2800 and the gate electrode 2804 by the silicon oxide films 2826 and 2827.

Figure 28E:
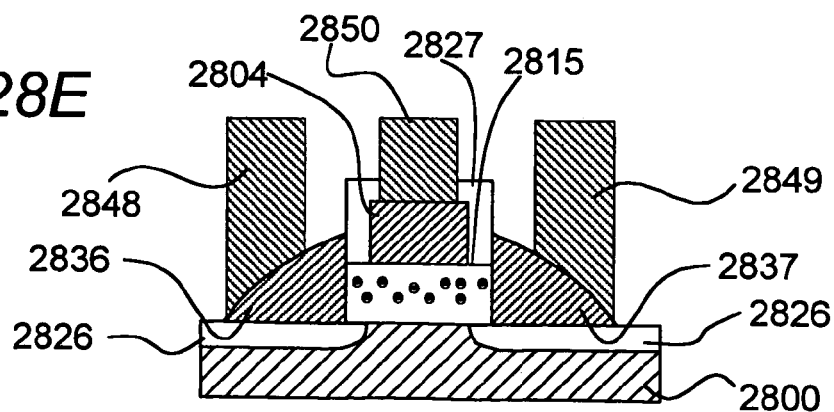

Next, after an interlayer insulation film (not shown) is formed on this, the well-known contact process is carried out as shown in FIG. 28E, forming contact interconnections 2848, 2849 and 2850 on the polysilicon sidewalls 2836 and 2837 and the gate electrode 2804, respectively.

It is desirable to distribute the conductive particles 2823 on the side near the silicon substrate 2800 with regard to the thickness direction of the silicon oxide film 2802 inside the memory function body 2815 (see FIG. 28A). The reason for the above is to form the conductive particles 2823 so that the particles are apart from the third electrode (gate electrode) 2804, thereby preventing useless memory operation from being performed between the first and second electrodes (polysilicon sidewalls) 2836 and 2837 and the third electrode (gate electrode) 2804. In concrete, there can be used a method for carrying out ion implantation for forming the conductive particles so that the implantation depth becomes sufficiently deeper than the top surface of the silicon oxide film, a method for forming an insulator film between the memory function body 2815 and the gate electrode 2804 and so on.

Figure 29A:
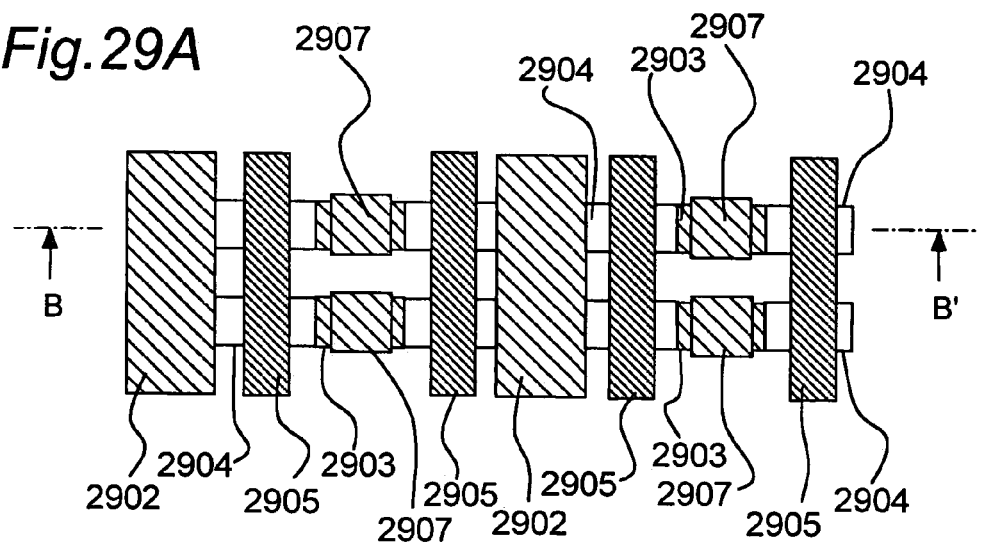
FIG. 29A is a view showing a plan layout of a memory device integrated three-dimensionally.
Figure 29B:
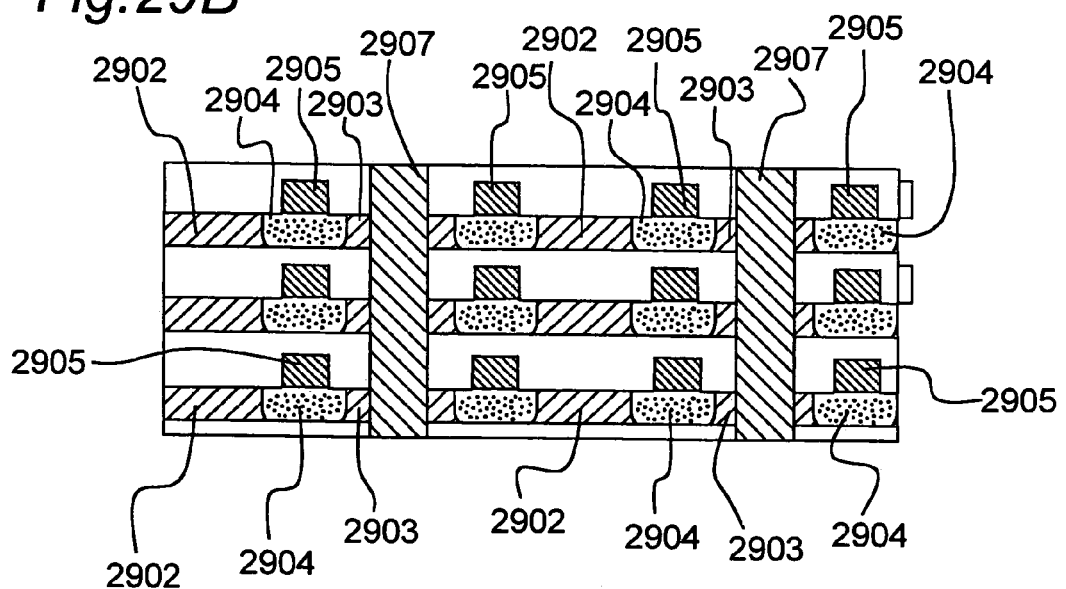
FIG. 29B is a view taken along the line and shown by arrows B—B' in FIG. 29A.

FIGS. 29A and 29B show the structure of a memory device in which a plurality of the aforementioned memory elements are arranged in the direction perpendicular to the substrate and three-dimensionally integrated. FIG. 29A shows a plan layout when the memory device is viewed from the upper side with the interlayer insulation film removed, while FIG. 29B shows a cross section taken along the line and shown by arrows B–B' in FIG. 29A. In the figures, there are shown a memory function body 2904, a first electrode 2902, a second electrode 2903 and a third electrode 2905. The contact interconnection 2907 electrically connects a plurality of second electrodes 2903, 2903, . . . arranged in the direction perpendicular to the substrate.

Since this memory device is three-dimensionally integrated, it is possible to largely reduce the effective occupation area and increase the memory capacity.

Although not shown in figures, the substrate can be provided by, for example, a glass substrate, a silicon substrate whose upper layer is oxidized or the like. The conventional floating gate type memory, based on the normal MOS transistor, is therefore generally fabricated on a silicon substrate. However, the memory device of the present invention is not necessarily be fabricated on a silicon substrate.

A method for fabricating a memory device that has a three-dimensional spatial structure of the type shown in FIGS. 29A and 29B will be described next by using FIGS. 30 and 31.

FIGS. 30A through 30E show the sectional views of the memory device in the processing stages.

First of all, as shown in FIG. 30A, an insulator film 3001 of a silicon oxide film or the like and a silicon film 3002 are successively laminated on a groundwork or a substrate 3000. Subsequently, a silicon nitride film 3003 is deposited as a mask for oxidation on the silicon film 3002, and openings 3003a are formed in prescribed regions of this silicon nitride film. Then, as shown in FIG. 30B, the silicon film 3002 is oxidized from its surface through the openings 3003a, forming a silicon oxide film 3018 as an insulator in the prescribed regions (regions in which memory function bodies should be formed) of the silicon film 3002.

Subsequently, silver is introduced into the silicon oxide film 3018 by the negative ion implantation method by using a mask (not shown) similarly to the aforementioned method, and heat treatment is further carried out, forming a memory function body 2904. It is to be noted that the region left unoxidized in the silicon film 3002 is used as a first electrode 2902 and a second electrode 2903.

Next, as shown in FIG. 30C, a material for forming a third electrode of, for example, polysilicon is deposited in the whole area on this, forming a gate electrode 2905 as the third electrode on the memory function body 2904 by a method similar to that of the pattern formation of the gate electrode of the well-known MOS transistor. Subsequently, an interlayer insulation film 3026 is formed in the whole area on this. Then, the surface of this interlayer insulation film 3026 is flattened by the CMP (Chemical-Mechanical Polishing) method or the like.

Subsequently, a silicon film 3032 is laminated again in the whole area on the interlayer insulation film 3026. Then, by repeating the processes similar to the aforementioned processes, a second layer memory function body 2904, a first electrode 2902, a second electrode 2903 and a third electrode 2905 are formed as shown in FIG. 30D. Subsequently, an interlayer insulation film 3056 is formed in the whole area on this. Then, the surface of this interlayer insulation film 3056 is flattened by CMP or the like.

The layers are thus increased to the desired number of layers, and thereafter, a contact interconnection 2907 is formed so as to connect the second electrodes 2903, 2903, . . . in the direction perpendicular to the substrate 3000.

FIGS. 31A through 31F show plan layouts when the memory device in the fabrication processes is viewed from the upper side.

Figure 31A:
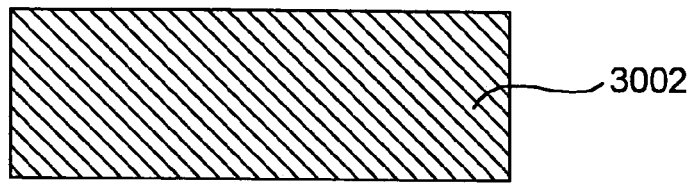
FIGS. 31A through 31F are views showing a plan layout in the fabrication processes of the memory device of FIG. 29.

As shown in FIG. 31A, the silicon film 3002 is formed in the whole area on the substrate.

Figure 31B:
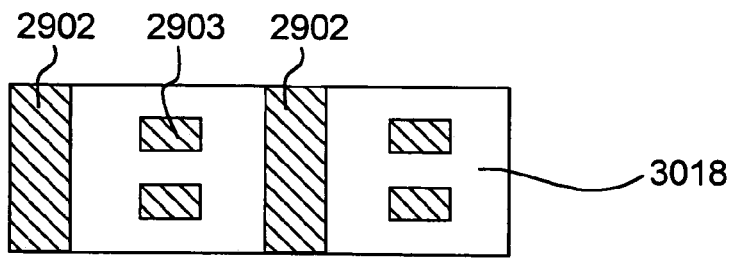

Next, as shown in FIG. 31B, the silicon film 3002 is partially oxidized leaving the portions that become the first electrodes 2902 and the second electrodes 2903, forming a silicon oxide film 3018. The first electrodes 2902 are each extended in a linear form in the vertical direction in FIG. 31B. On the other hand, the second electrodes 2903 have a rectangular pattern and are individually isolated in the silicon oxide film 3018. The silicon oxide film 3018 also plays the role of element isolation. A plurality of second electrodes 2903 are arranged along the vertical direction at the center of the distance between mutually adjacent first electrodes 2902 and 2902.

Figure 31C:
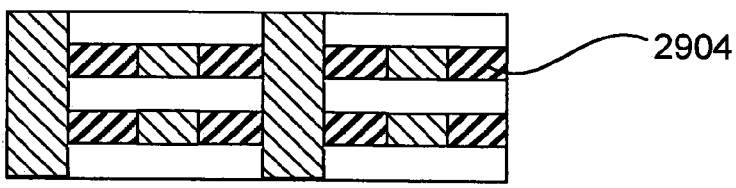

Next, as shown in FIG. 31C, a memory function body 2904 is formed in each rectangular region interposed between the first electrode 2902 and the second electrode 2903 inside the silicon oxide film 3018. A sectional view at this time corresponds to FIG. 30B.

Figure 31D:
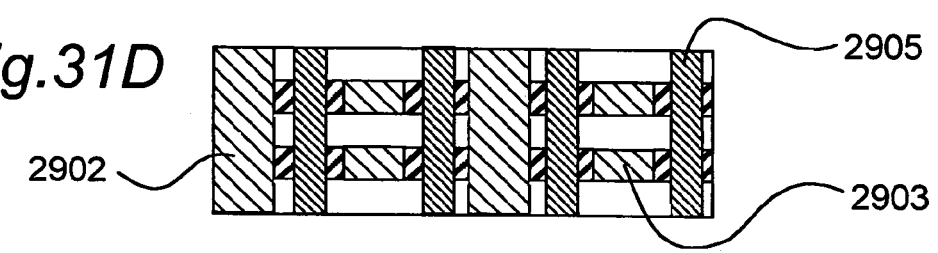

Next, as shown in FIG. 31D, a gate electrode 2905 as the third electrode is formed in a linear form extended in the vertical direction so as to extend over a plurality of memory function bodies 2904 arranged parallel in the vertical direction.

Figure 31E:
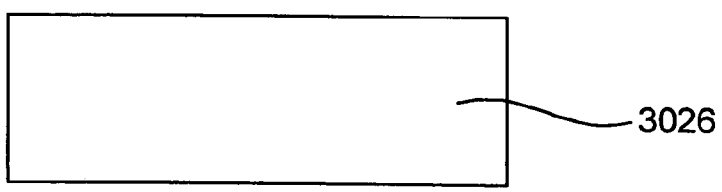

Next, as shown in FIG. 31E, an interlayer insulation film 3026 is formed in the whole area on this. A sectional view at this time corresponds to FIGS. 30C and 30D.

Figure 31F:
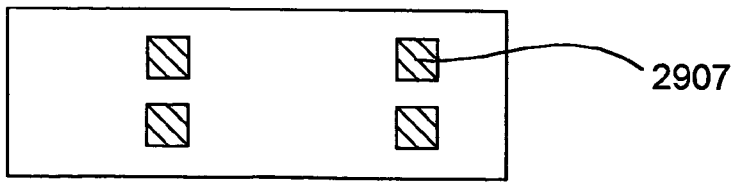

Subsequently, as shown in FIG. 31F, a contact interconnection 2907 is formed in a position in which the contact interconnection 2907 penetrates the second electrode 2903. A sectional view at this time corresponds to FIG. 30E.

Moreover, although the first electrode 2902 and the third electrode 2905 are extended as interconnections parallel in the vertical direction in this example, the present invention is not limited to this. If multi-layer interconnections are provided similarly to the fabrication of ordinary integrated circuits, then the interconnection for the first electrode 2902, the interconnection 2907 for the second electrode 2903 and the interconnection for the third electrode 2905 can be formed so as to intersect one another.

Figure 32A:
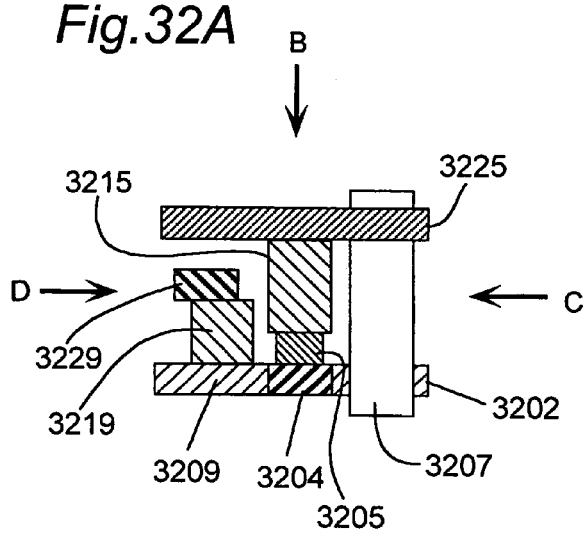
FIG. 32A is a view showing a memory device structure in which the interconnections connected to the first, second and third electrodes are substantially perpendicular to one another.
Figure 32C:
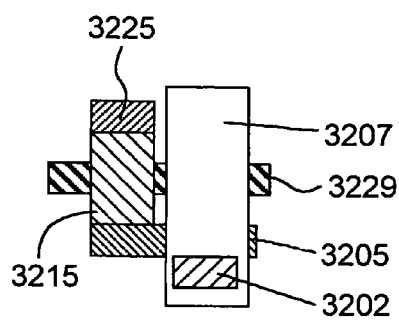
FIGS. 32B, 32C and 32D are views showing the memory of FIG. 32A viewed from the direction of B, the direction of C and the direction of D, respectively.
Figure 32B:
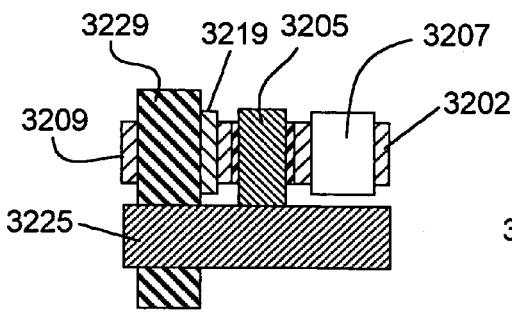
Figure 32D:
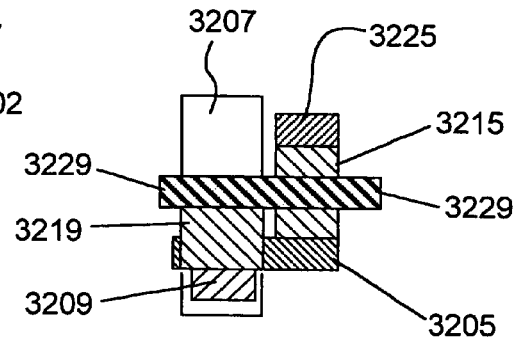

For example, FIG. 32A shows the structure of a memory device in which the interconnections connected to the first, second and third electrodes are substantially perpendicular to one another. FIGS. 32B, 32C and 32D show the memory device of FIG. 32A viewed from the direction B, the direction C and the direction D, respectively.

In this memory device, the first electrode 3209, the second electrode 3202 and the third electrode 3205 are put in contact with the memory function body 3204 from the left-hand side, from the right-hand side and from the upper side, respectively, in FIG. 32A. A first interconnection 3229 extended forwardly depthwise in FIG. 32A is electrically connected to the first electrode 3209 via a contact 3219. A second interconnection 3207 extended in the vertical direction in FIG. 32A is electrically connected to the second electrode 3202. A third interconnection 3225 extended in the transverse direction in FIG. 32A is electrically connected to the third electrode 3205 via a contact 3215.

As described above, if the interconnections connected to the first, second and third electrodes are arranged substantially perpendicularly to one another, it is possible to further largely reduce the occupation area of the memory device and increase the memory capacity.

Figure 33A:
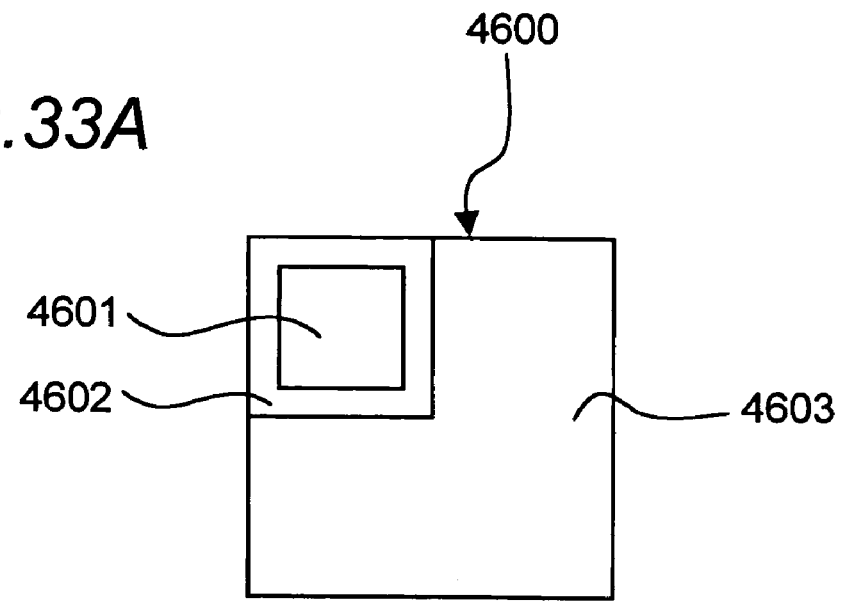
FIG. 33A is a view showing the plan layout of a semiconductor device of one embodiment of this invention.

FIG. 33A shows a schematic plan layout of a semiconductor device 4600 according to one embodiment.

This semiconductor device 4600 is provided with a memory circuit 4601 that has the aforementioned memory elements (memory cells), a peripheral circuit 4602 that has a logic circuit and a function circuit 4603 that has a function other than those of the memory circuit and the peripheral circuit in a state in which the components are integrated on an identical semiconductor substrate.

Figure 33B:
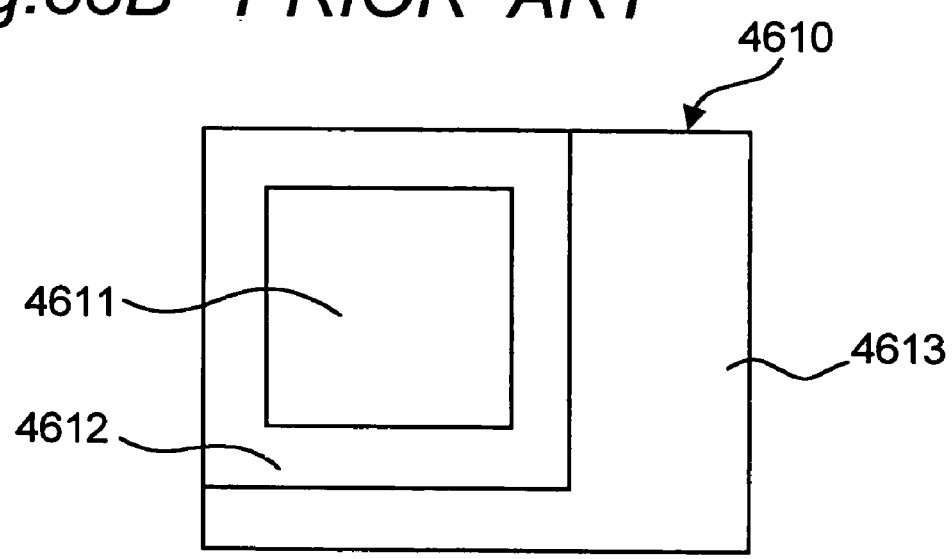
FIG. 33B is a view showing the plan layout of a conventional semiconductor device.

FIG. 33B shows a schematic plan layout of a conventional semiconductor device 4610 for the sake of comparison. The memory circuit 4611 is integrated with a flash memory that has a conventional floating gate. This conventional semiconductor device 4610 needs a booster circuit and a control circuit for the peripheral circuit 4612 since the driving voltage of the flash memory is higher than the driving voltage of the logic circuit. Moreover, it is required to increase the gate oxide film thickness of the transistor of the peripheral circuit to endure a high driving voltage of the memory circuit, and therefore, the occupation area of the peripheral circuit 4612 has conventionally been enlarged. Therefore, it has been difficult to miniaturize the semiconductor device. Moreover, since the occupation areas of the memory circuit 4611 and the peripheral circuit 4612 have been large, the occupation area ratio of the function circuit 4613 for another function has been limited to a small value.

In contrast to this, the memory circuit 4601 that has the memory element of the present invention can operate with a low voltage, and therefore, this semiconductor device 4600 can operate with the same power voltage as that of the peripheral circuit 4602. Therefore, it is possible to share the power source by the memory circuit 4601 and the peripheral circuit 4602 and remove the conventional booster circuit and the control circuit. As a result, the occupation area of the peripheral circuit 4602 can be reduced. Moreover, since the driving voltage of the memory circuit 4601 is low, the gate oxide film of the transistor included in the peripheral circuit 4602 can be reduced in thickness, and the occupation area of the peripheral circuit 4602 can be reduced. Furthermore, since the memory circuit 4601 can be highly integrated, the occupation area of the memory circuit 4601 can be reduced. With these factors, this semiconductor device 4601 can consequently be made smaller than the conventional semiconductor device 4610. Moreover, since the occupation area of the function circuit 4603 other than the memory circuit and the peripheral circuit can be expanded, a semiconductor device of a performance higher than that of the conventional one can be constructed.

Otherwise, if the same occupation area as that of the conventional semiconductor device 4610 is permitted for this semiconductor device 4600, it is possible to increase the storage capacity of the semiconductor device by integrating more memory elements than in the conventional case. With this arrangement, it becomes possible to temporarily read a large-scale program, retain the program even after the power is turned off and execute the program after the power is turned on again, and it also becomes possible to replace the program with another program.

Figure 34:
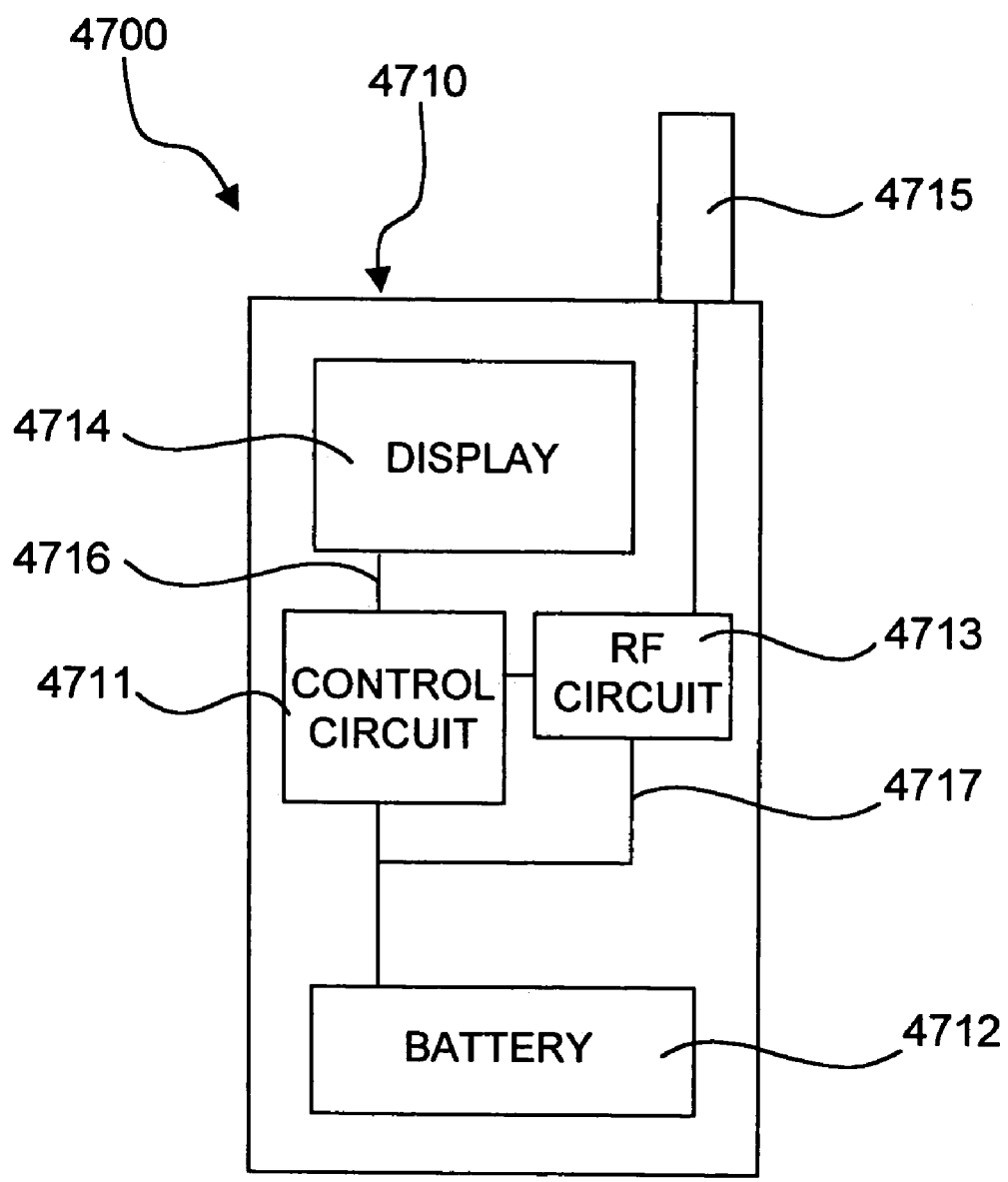
FIG. 34 is a view showing a portable telephone as one example of the electronic equipment of this invention.
Figure 35:
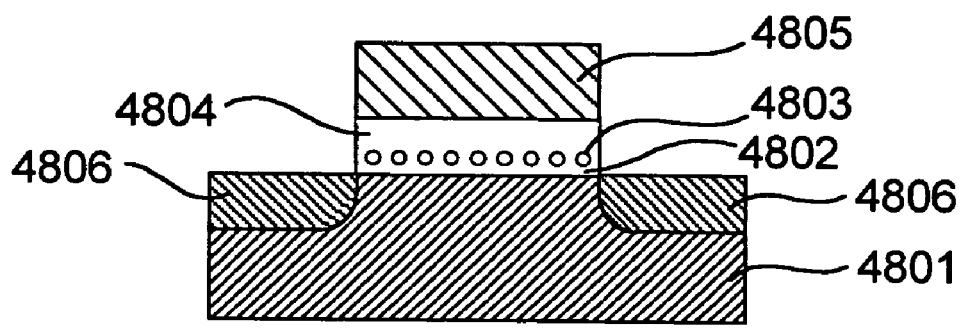
FIG. 35 is a view showing a conventional memory.

FIG. 34 schematically shows the construction of a portable telephone 4700 provided with the aforementioned semiconductor device as one example of the electronic equipment of the present invention.

In this portable telephone 4700, a main body 4710 is equipped with an antenna section 4715, an RF circuit section 4713, a display section 4714, a control circuit 4711 as a semiconductor device and a battery 4712 for supplying electric power to these constituent elements. The reference numerals 4716 and 4717 denote a signal line and a power line, respectively.

The control circuit 4711 is an LSI (Large Scale Integrated circuit) in which a memory circuit having the memory elements of the present invention and a logic circuit are consolidated and controls the RF circuit section 4713 and the display section 4714. The control circuit 4711 has the semiconductor device of the present invention built-in. Therefore, this portable telephone is able to have high functions and reduced power consumption, allowing the battery life to be remarkably protracted.

Although the portable telephone was constructed as one example of the electronic equipment in the present embodiment, similar effects can be taken even if another electronic equipment such as a portable information terminal or a game machine is constructed.

Although the silicon oxide was employed as the material of the insulator 101 that is the first insulator in the aforementioned embodiments, it is acceptable to employ silicon nitride, aluminum oxide, titanium oxide, zirconium oxide, hafnium oxide and so on. Furthermore, when the particle surface is covered with an insulator as in the one embodiment of the present invention, the insulator 101 is not required to be formed of an insulative substance.

Moreover, although silver was employed as the material that constitutes the conductive particles, it is also acceptable to employ another metal such as copper, aluminum, tin, nickel, zinc, hafnium, zirconium, manganese, tantalum, titanium, tungsten, indium or gallium as a material for constituting the particles 103. Moreover, it is also possible to employ a semiconductor or a compound semiconductor of silicon, germanium or the like or employ an alloy or another compound. Moreover, even a magnetic material can be employed. However, a single element is preferable since the implantation thereof is easy. Moreover, the insulator that covers the particle surface may be anything so long as the insulator has a good insulative property among the compounds of the oxides and nitrides of the substance that constitutes the particles.

Moreover, although the silicon substrate has been employed as the second electrode 112, it is acceptable to employ a substrate constructed of a semiconductor other than silicon or a metal material. Moreover, it is acceptable to form a conductive layer on a substrate constructed of an insulator material such as a glass substrate by the CVD (Chemical Vapor Deposition) method, the deposition, the MBE (Molecular Beam Epitaxy) method or the like and use the conductive layer as the second electrode.

The semiconductor layer, which constitutes the rectifying function body, can be formed through epitaxial growth and polysilicon deposition, and CGS (Continuous Grain Silicon) or the like can be employed. However, it is preferable to employ polysilicon or CGS, which can be formed at a comparatively low temperature. It is more preferable to employ CGS of good crystallinity in terms of improving the rectification capability and excellence in reliability. The CGS is a silicon that can be fabricated at a low temperature by the fabrication method described in Japanese Unexamined Patent Application No. H8-78329 and so on and has the advantages that it has better crystallinity than those of amorphous silicon, low-temperature polysilicon other than CGS and so on and is able to obtain higher mobility.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A resistance-changing function body comprising:
   a first electrode;
   a second electrode;
   a medium made of a first material interposed between the first electrode and the second electrode; and
   at least one conductive particle made of a third material, having a surface covered with a second material and included in the medium, wherein
   the second material has a barrier against passage of electric charges,
   the third material has a capability to retain electric charges, and
   an electrical resistance between the first electrode and the second electrode is changed depending on an amount of electric charges accumulated in the particle.

2. The resistance-changing function body as claimed in claim 1, wherein
   the first material and the second material are mutually different insulative substances,
   the third material is a conductive material, and
   the second material is an insulative substance formed by using the third material.

3. A memory element comprising:
   a first electrode;
   a second electrode; and
   a memory function body interposed between the first electrode and the second electrode, wherein
   the memory function body includes:
   a first insulator; and
   a conductive particle included in the first insulator and having a surface covered with a material having a barrier against passage of electric charges, and wherein
   a magnitude of a current through the memory function body changes by application of a prescribed voltage between the first electrode and the second electrode, and a storage state is discriminated according to the magnitude of the current.

4. A memory device comprising a memory cell including:
   the memory element as claimed in claim 3; and
   a rectifying function body having a rectification effect so as to determine a direction of the current through the memory function body of the memory element, wherein
   the memory element and the rectifying function body are electrically connected in series to each other.

5. A memory device comprising a memory cell including:
   the memory element as claimed in claim 3; and
   a select transistor for selecting the memory element, wherein
   the memory element and the select transistor are electrically connected in series to each other.

6. A memory device comprising at least two memory cells each including the memory element as claimed in claim 3, wherein
   the first insulators of the memory function bodies of the two memory cells are integrally continuously formed, and
   the first electrode of one memory cell of the two memory cells and the first electrode of the other memory cell are electrically connected to each other, and the second electrode of the one memory cell and the second electrode of the other memory cell are electrically isolated from each other.

7. A memory device comprising:
   at least five memory cells each including the memory element as claimed in claim 3;
   bit lines extended in a direction of column;
   source lines extended in a direction of column; and
   word lines extended in a direction of row, wherein
   each of the memory cells includes:
   a select transistor for selecting the memory element; and
   a rectifying function body for determining a direction of the current through the memory function body of the memory element, and wherein
   each of the memory cells is connected between the bit line and the source line, and the select transistor of each of the memory cells is controlled by the word line,
   with respect to a first memory cell of the five memory cells, a second and a fourth memory cells are arranged mutually adjacently in the direction of row, and a third and a fifth memory cells are arranged mutually adjacently in the direction of column,
   the first memory cell and the second memory cell have a shared bit line, a shared word line and an unshared source line,
   the first memory cell and the third memory cell have a shared bit line, a shared source line and an unshared word line,
   the first memory cell and the fourth memory cell have a shared source line, a shared word line and an unshared bit line,
   the first memory cell and the fifth memory cell have a shared word line,
   a source line of the first memory cell and a bit line of the fifth memory cell are shared, and
   a bit line of the first memory cell and a source line of the fifth memory cell are shared.

8. The memory device as claimed in claim 7, wherein
   at least two memory cells are arranged in a direction parallel to a substrate, and
   the first insulators of the memory function bodies of the memory cells mutually adjacent in the direction parallel to the substrate are integrally continuously formed.

9. The memory device as claimed in claim 7, wherein
   at least two memory cells are arranged in a direction parallel to a substrate, and
   the first insulators and/or the rectifying function bodies of the memory cells mutually adjacent in the direction parallel to the substrate are integrally continuously formed.

10. The memory element as claimed in claim 3, further comprising
    a third electrode adjacent to the memory function body, wherein the third electrode is able to apply a voltage to the memory function body in a position between the first electrode and the second electrode in a direction opposing the first electrode and the second electrode to each other.

11. The memory element as claimed in claim 10, wherein
the first electrode and the second electrode are each formed on a surface of a semiconductor substrate,
the memory function body is formed in a region located between the electrodes on the surface of the semiconductor substrate, and
the third electrode is provided on the memory function body.

12. The memory element as claimed in claim 10, wherein
the first electrode and the second electrode are each made of a conductor formed on a substrate,
the memory function body is formed in a region interposed between the conductors, and
the third electrode is provided on the memory function body.

13. A memory device comprising:
at least two memory cells each including the memory element as claimed in claim 3, wherein
the memory cells are formed on a substrate, and
the memory function bodies of the memory cells are laminated in a direction perpendicular to the substrate.

14. A method for manufacturing the memory element claimed in claim 3, comprising the step of:
implanting a substance for forming the conductive particle in the first insulator by a negative ion implantation method.

15. A semiconductor device comprising the memory element claimed in claim 3.

16. Electronic equipment comprising the semiconductor device claimed in claim 15.

* * * * *